(12) United States Patent
Huang et al.

(10) Patent No.: US 11,183,571 B2
(45) Date of Patent: Nov. 23, 2021

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventors: Yong-Sheng Huang, Taipei (TW); Ming-Chyi Liu, Hsinchu (TW); Chih-Ren Hsieh, Changhua County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 71 days.

(21) Appl. No.: 16/745,219

(22) Filed: Jan. 16, 2020

(65) Prior Publication Data

US 2021/0226027 A1    Jul. 22, 2021

(51) Int. Cl.
*H01L 29/423*    (2006.01)
*H01L 27/11524*    (2017.01)
*H01L 27/11519*    (2017.01)
*H01L 21/28*    (2006.01)

(52) U.S. Cl.
CPC .. *H01L 29/42328* (2013.01); *H01L 27/11519* (2013.01); *H01L 27/11524* (2013.01); *H01L 29/40114* (2019.08)

(58) Field of Classification Search
CPC ......... H01L 29/42328; H01L 29/40114; H01L 27/11524; H01L 27/11519
See application file for complete search history.

(56) References Cited

U.S. PATENT DOCUMENTS

| | | | |
|---|---|---|---|
| 2009/0166708 A1* | 7/2009 | Io | H01L 27/11524 257/319 |
| 2014/0264534 A1 | 9/2014 | Tsair et al. | |
| 2016/0013197 A1* | 1/2016 | Liu | H01L 29/42344 257/322 |
| 2017/0330949 A1 | 11/2017 | Wang | |
| 2018/0145085 A1* | 5/2018 | Liu | H01L 27/11534 |
| 2019/0148513 A1 | 5/2019 | Lin et al. | |
| 2019/0348427 A1* | 11/2019 | Kim | H01L 29/40114 |
| 2020/0135275 A1* | 4/2020 | Cai | H01L 27/11521 |
| 2020/0152649 A1* | 5/2020 | Chern | H01L 29/42344 |

FOREIGN PATENT DOCUMENTS

| | | |
|---|---|---|
| TW | 201436113 A | 9/2014 |
| TW | 201737469 A | 10/2017 |
| TW | 201937703 A | 9/2019 |

* cited by examiner

*Primary Examiner* — Sitaramarao S Yechuri
(74) *Attorney, Agent, or Firm* — Maschoff Brennan

(57) ABSTRACT

A semiconductor device includes an erase gate electrode, an erase gate dielectric, first and second floating gate electrodes, first and second control gate electrodes, a first select gate electrode, a second select gate electrode, a common source strap, and a silicide pad. The erase gate electrode is over a first portion of a substrate. The common source strap is over a second portion of the substrate, in which the common source strap and the erase gate electrode are arranged along a second direction perpendicular to the first direction. The silicide pad is under the common source strap and in the second portion of the substrate, wherein a top surface of the silicide pad is flatter than a bottom surface of the erase gate dielectric.

20 Claims, 80 Drawing Sheets

1000

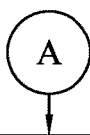

| S111 | forming a second patterned mask over the substrate, in which the second patterned mask covers the first portion of the substrate, and removing the erase gate dielectric layers exposed by the second patterned mask |

S112 — forming a first dielectric layer over the substrate

S113 — forming a gate layer over the substrate

S114 — etching back the gate layer to form erase gate electrodes

S115 — forming a hard mask layer over the substrate

S116 — forming a third patterned mask over the substrate, and etching the gate layer to form select gate electrodes S117 — removing the third patterned mask, and forming select gate spacers on sidewalls of the select gate electrodes S118 — forming a hard mask over the substrate and adjacent to the select gate spacers S119 — forming a fourth patterned mask over the substrate, in which the fourth patterned mask exposes the second portion of the substrate S120 — removing portions of the gate layer above the second portions of the substrate S121 — removing the fourth patterned mask and the hard mask

Fig. 34B

MEMORY DEVICE AND MANUFACTURING METHOD THEREOF

BACKGROUND

Flash memories have some particular advantages and benefits, as compared to other types of solid-state non-volatile memory structures. Many of these advantages and benefits are related, for example, to improved read, write, and/or erase speeds, power consumption, compactness, cost, etc. Flash memories are commonly used in high-density data storage devices configured for use with cameras, cell phones, audio recorders, portable USB data storage devices—often referred to as thumb drives or flash drives—etc. Typically, in such applications, a flash memory is manufactured on a dedicated microchip, which is then coupled with another chip or chips containing the appropriate processor circuits, either together in a single package, or in separate packages configured to be electrically coupled.

Processors with embedded flash memories are a more recent development. In such devices, a flash memory array is manufactured together with logic and control circuitry on a single chip. This arrangement is often used in microcontroller units (MCU), i.e., small computer devices integrated onto single chips, which are typically designed to repeatedly perform a limited number of specific tasks. MCUs are often used in smart cards, wireless communication devices, control units for automobiles, etc. Integration of memory with related processing circuitry can improve processing speed while reducing package size, power consumption, and cost.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 34A to 34C are a method for forming a semiconductor device in accordance with some embodiments of the present disclosure.

DETAILED DESCRIPTION

Figure 1A:
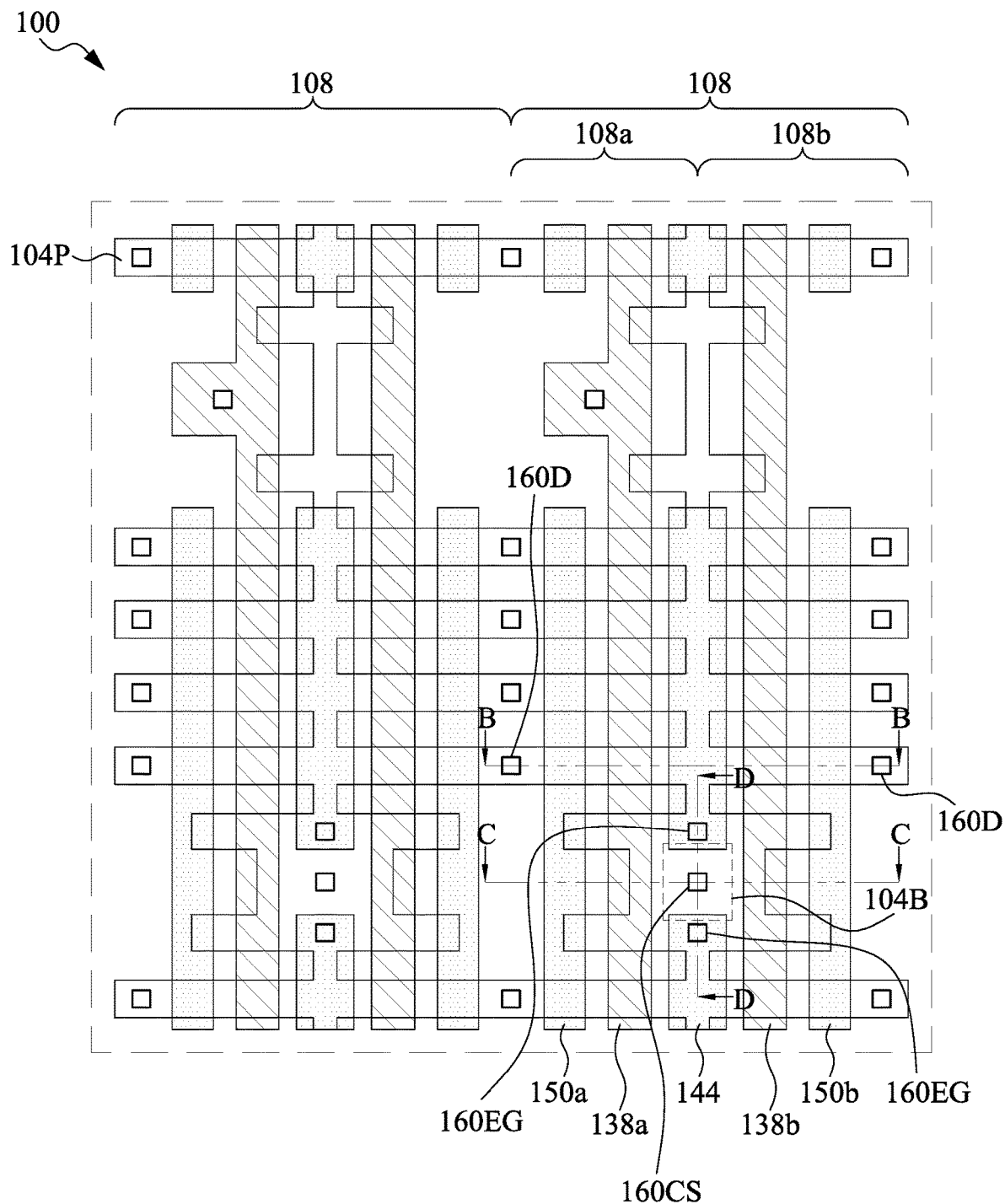
FIG. 1A is a top view of a memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Flash memory can be formed on a bulk silicon substrate and uses various bias conditions to read and write data values. For example, an ESF3 cell—or so-called "third generation SUPERFLASH" cell—includes a pair of symmetric split gate memory cells, each of which includes a pair of source/drain regions with a channel region arranged therebetween. In the ESF3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the ESF3 cell and a sidewall of the floating and/or control gate). At least one cell is configured to store a variable charge level on its floating gate, in which the level of this charge corresponds to a data state stored in the cell and is stored in a non-volatile manner so that the stored charge/data persists in the absence of power.

By changing the amount of charge stored on the floating gate, the threshold voltage $V_{th}$ of the memory cell device can be correspondingly changed. For example, to perform a program operation (e.g., write a logical "0", program is 0, Vt high) for a cell, the control gate is biased with a high (e.g., at least an order of magnitude higher) voltage relative a voltage applied across the channel region and/or relative to a voltage applied to the select gate. The high bias voltage promotes Fowler-Nordheim tunneling of carriers from the channel region towards the control gate. As the carriers tunnel towards the control gate, the carriers become trapped in the floating gate and alter the $V_{th}$ of the cell. Conversely, to perform an erase operation (e.g., write a logical "1", erase is 1, Vt low) for the cell, the erase gate is biased with a high (e.g., at least an order of magnitude higher) voltage relative a voltage applied across the channel region and/or relative to a voltage applied to the control gate. The high bias voltage promotes Fowler-Nordheim tunneling of carriers from the floating gate towards the erase gate, thereby removing carriers from the floating gate and again changing the $V_{th}$ of the cell in a predictable manner. Subsequently, during a read operation, a voltage is applied to the select gate to induce part of the channel region to conduct. Application of a voltage to the select gate attracts carriers to part of the channel region adjacent to the select gate. While the select gate voltage is applied, a voltage greater than $V_{th}$, but less than $V_{th}+\Delta V_{th}$, is applied to the control gate (where $\Delta V_{th}$ is a change in $V_{th}$ due to charge trapped on the floating gate). If the memory cell device turns on (i.e., allows charge to flow), then it is deemed to contain a first data state (e.g., a logical "1" is read). If the memory cell device does not turn on, then it is deemed to contain a second data state (e.g., a logical "0" is read).

Some embodiments of the present disclosure relate to flash memory devices that are formed on a recessed region of a substrate. Although some implementations are illustrated below with regards to split gate flash memory, it will be appreciated that this concept is not limited to split gate flash memory cells, but is also applicable to other types of flash memory cells as well as to other types of semiconductor devices, such as MOSFETs, FinFETs, and the like.

Figure 1B:
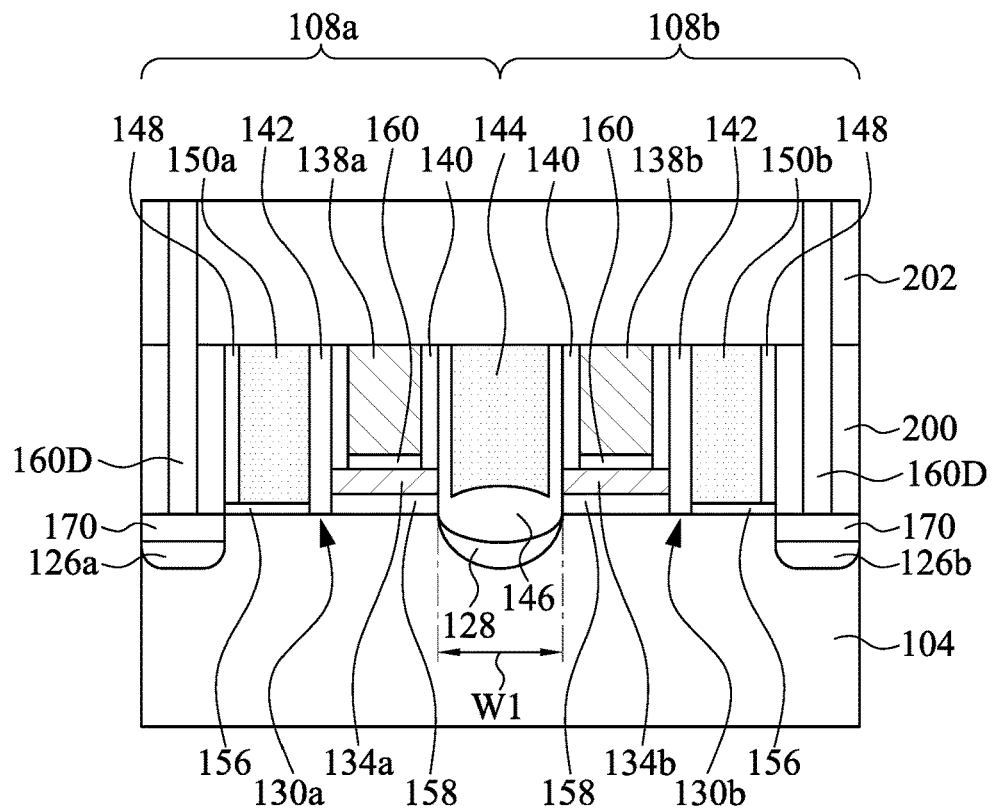
FIG. 1B is a cross-sectional view along line B-B of FIG. 1A in accordance with some embodiments of the present disclosure.
Figure 1C:
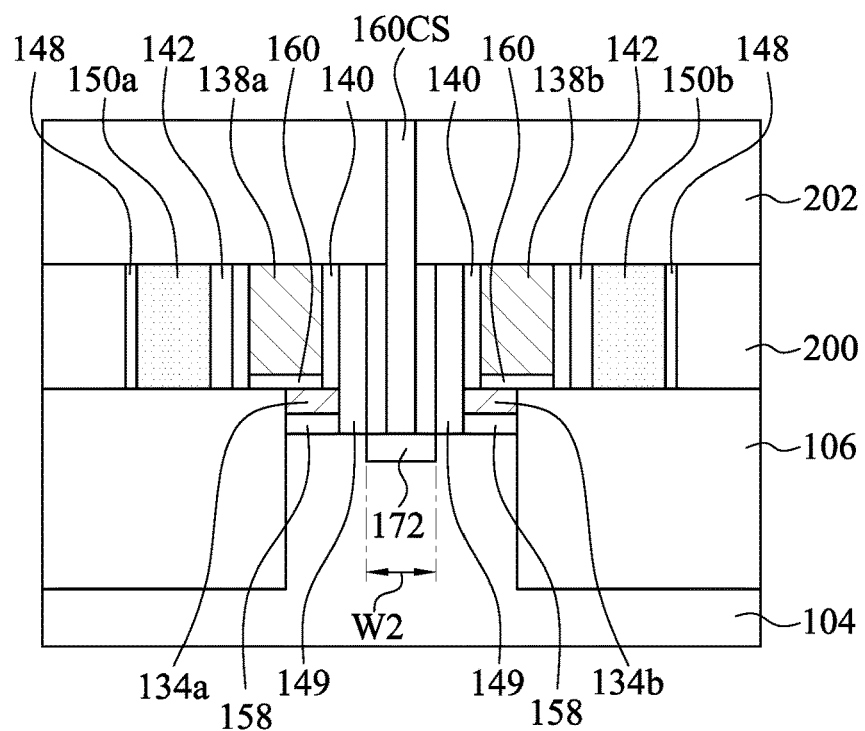
FIG. 1C is a cross-sectional view along line C-C of FIG. 1A in accordance with some embodiments of the present disclosure.
Figure 1D:
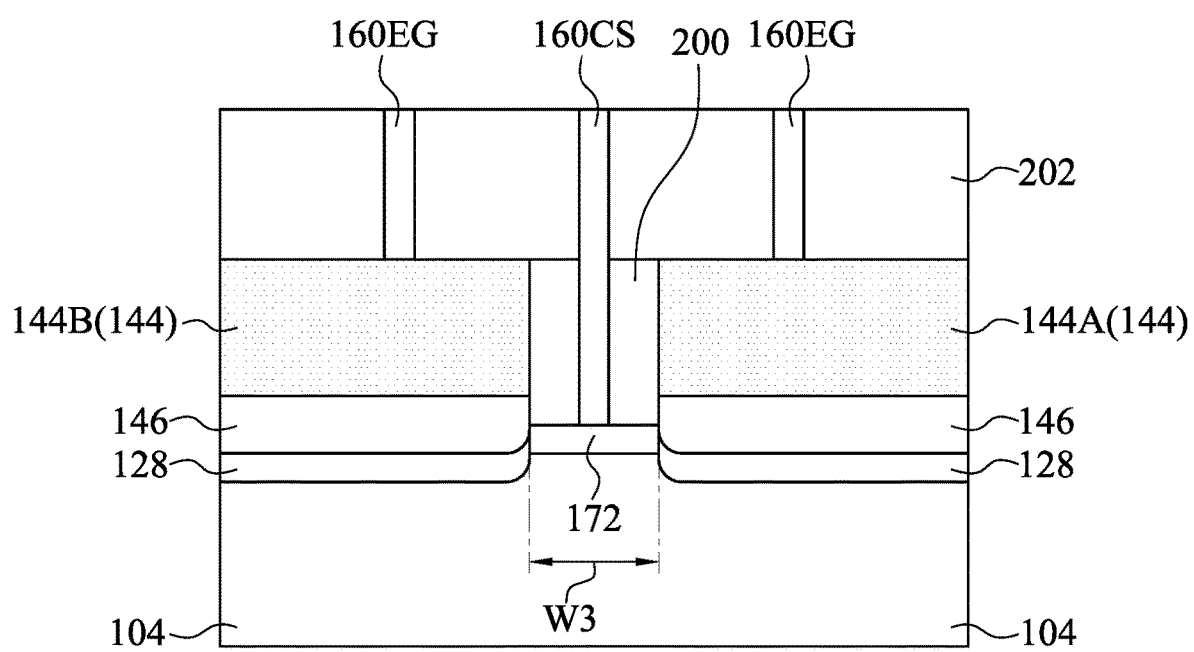
FIG. 1D is a cross-sectional view along line D-D of FIG. 1A in accordance with some embodiments of the present disclosure.

FIG. 1A is a top view of a memory device 100 in accordance with some embodiments of the present disclosure. FIG. 1B is a cross-sectional view along line B-B of FIG. 1A in accordance with some embodiments of the present disclosure. FIG. 1C is a cross-sectional view along line C-C of FIG. 1A in accordance with some embodiments of the present disclosure. FIG. 1D is a cross-sectional view along line D-D of FIG. 1A in accordance with some embodiments of the present disclosure.

The memory device 100 includes a substrate 104. In some embodiments, the substrate 104 has active regions 104P laterally surrounded by an isolation structure 106 formed of dielectric material. The semiconductor substrate 104 may be or otherwise include, for example, a bulk silicon substrate, a group III-V substrate, a silicon-on-insulator (SOI) substrate, another suitable semiconductor substrate(s), or the like. The isolation structure 106 may be a shallow trench isolation (STI) structure, a deep trench isolation (DTI) structure, another suitable isolation structure(s), a combination of the foregoing, or the like. In some embodiments where the STI region 106 is made of oxide (e.g., silicon oxide), the active regions 104P can be interchangeably referred to as oxide defined (OD) regions.

In FIG. 1A, the memory device 100 includes an array of memory cells. In the illustrated example, the array of memory cells includes a number of split gate flash memory cell pairs 108, in which each pair of split gate flash memory cells 108 includes a first memory cell 108a and a second memory cell 108b.

As illustrated in FIGS. 1A and 1B, FIG. 1B is a cross-sectional view along a direction perpendicular to the lengthwise direction of an erase gate electrode 144 and through the erase gate electrode 144. First and second drain regions 126a, 126b (corresponding to the first and second memory cells 108a, 108b, respectively) are disposed in semiconductor substrate 104, and a common source region 128 (shared between the first and second memory cells 108a, 108b) is disposed in the semiconductor substrate 104 and laterally spaced between the first and second drain regions 126a, 126b. The first drain region 126a is separated from the common source region 128 by a first channel region 130a, and the common source region 128 is separated from second drain region 126b by a second channel region 130b.

The erase gate electrode 144 is disposed over the common source region 128 and is separated from the common source region 128 by an erase gate dielectric 146. First and second floating gate electrodes 134a, 134b are located respectively over first and second channel regions 130a, 130b of the substrate 104. First and second control gate electrodes 138a, 138b overlie the first and second floating gate electrodes 134a, 134b, respectively. First and second select gate electrodes 150a, 150b overlie the first and second channel regions 130a, 130b respectively, and are laterally spaced from erase gate electrode 144 by the first and second floating gate electrodes 134a, 134b, respectively.

In some embodiments, the erase gate dielectric 146 cups an underside of the erase gate electrode 144 to vertically space the erase gate electrode 144 from the common source region 128 and to laterally space the erase gate electrode 144 from the floating gate electrodes 134a, 134b. The erase gate dielectric 146 may have a concave upper surface and a concave bottom surface, and may be doped polysilicon, metal, another suitable conductive material(s), a combination of the foregoing, or the like. In some embodiments, the erase gate dielectric 146 and the common source region 128 have a curved interface, and the erase gate dielectric 146 and the erase gate electrode 144 have a curved interface.

The erase gate electrode 144, the control gate electrodes 138a, 138b, the floating gate electrodes 134a, 134b, and the select gate electrodes 150a, 150b may be doped polysilicon, metal, another suitable conductive material(s), a combination of the foregoing, or the like. The erase gate dielectric 146 may be or otherwise include, for example, oxide, nitride, or another suitable dielectric(s), a combination of the foregoing, or the like.

A pair of control gate spacers 140 overlies each of the floating gate electrodes 134a, 134b and line opposite sidewalls of control gate electrodes 138a, 138b, respectively. Select gate dielectrics 156 separate the select gate electrodes 150a, 150b from the semiconductor substrate 104, and floating gate dielectrics 158 separate the floating gate electrodes 134a, 134b from semiconductor substrate 104, respectively. Control gate dielectrics 160 separate the floating gate electrodes 134a, 134b from the control gate electrodes 138a, 138b, respectively. In some embodiments, at least two of the select gate dielectrics 156, floating gate dielectrics 158, and/or control gate dielectrics 160 have the same composition and the same thickness as one another, but in other embodiments, each of the select gate dielectrics 156, floating gate dielectrics 158, and control gate dielectrics 160 have different compositions and/or different thicknesses than the others.

The control gate spacers 140 may have suitable composition. In some embodiments, the control gate spacers 140 may be or otherwise include, for example, nitride, oxide, another suitable dielectric(s), combination of the foregoing, or the like. In some embodiments, the control gate spacers 140 are homogeneous. In some other embodiments, the control gate spacers 140 are each ONO films. For example, the control gate spacers 140 may include an oxide-nitride-oxide structure, with an outer oxide layer, middle-nitride layer, and an inner oxide layer.

The select gate dielectric 156 may be or otherwise include, for example, oxide, nitride, another suitable dielectric(s), a combination of the foregoing, or the like. The control gate dielectric 160 may be or otherwise include, for example, nitride, oxide, another suitable dielectric(s), combination of the foregoing, or the like.

Floating gate spacers 142 space the select gate electrodes 150a, 150b from the floating gate electrodes 134a, 134b and the control gate electrodes 138a, 138b. The floating gate spacers 142 overlie the first and second channel regions 130a, 130b. Each of the floating gate spacers 142 lines a sidewall of one of the floating gate electrodes 134a, 134b in FIG. 1B. Select gate spacers 148 line the sidewalls of the select gate electrodes 150a, 150b, respectively.

The floating gate spacers 142 may have suitable composition. In some embodiment, the floating gate spacers 142 may be or otherwise include, for example, nitride, oxide, another suitable dielectric(s), combination of the foregoing, or the like. In some embodiments, the floating gate spacers 142 are homogeneous. In some other embodiments, the floating gate spacers 142 are each ONO films. For example, the floating gate spacers 142 may include an oxide-nitride-oxide structure, with an outer oxide layer, middle-nitride layer, and an inner oxide layer. In some embodiments, the floating gate spacers 142 may have the same composition as the control gate spacers 140. The select gate spacers 148 may be or otherwise include, for example, nitride, oxide, another suitable dielectric(s), combination of the foregoing, or the like.

Silicide pads 170 are disposed over the first and second drain regions 126a, 126b, respectively. In some embodiments, the silicide pads 170 include dopants the same as the dopants of first and second drain regions 126a, 126b. In some embodiments, the silicide pads 170 may be nickel silicide (NiSi) or another suitable silicide(s) and may be formed by suitable saliciding process(es).

A first interlayer dielectric (ILD) layer 200 overlies the first and second drain regions 126a, 126b and the silicide pads 170. In some embodiments, the silicide pads 170 space the first ILD layer 200 from the first and second drain regions 126a, 126b. A second interlayer dielectric (ILD) layer 202 overlies the erase gate electrode 144, the control gate electrode 138a, 138b, and the select gate electrodes 150a, 150b. Drain straps 160D extend through the first and second ILD layers 200 and 202 to the silicide pads 170. In some embodiments, the drain straps 160D can be interchangeably referred to as drain contacts 160D.

In some embodiments, the first and second ILD layers 200 and 202 may be oxide, a low κ dielectric, another suitable dielectric(s), combination of the foregoing, or the like. As used herein, a low κ dielectric is a dielectric material with a dielectric constant κ less than about 3.9. In some embodiments where the first and second ILD layers 200 and 202 are made of the same material, the first and second ILD layers 200 and 202 may merge together and do not have distinguishable interface therebetween. The drain straps 160D are conductive material and may be tungsten, aluminum copper, copper, aluminum, another suitable metal(s) or other conductive material(s), a combination of the foregoing, or the like.

As illustrated in FIGS. 1A and 1C, FIG. 1C is a cross-sectional view along the direction perpendicular to the lengthwise direction of the erase gate electrode 144 and through a common source strap 160CS. Some elements in FIG. 1C are similar to those described in FIG. 1B, and thus such elements are labeled the same and relevant structural details will not be repeated for brevity. It is noted that FIGS. 1B and 1C have the same scale, and thus the proportions of the elements respectively in FIGS. 1B and 1C are the same.

In FIG. 1C, the top surfaces of the floating gate electrodes 134a, 134b are co-terminus with the top surface of the isolation structure 106. In some embodiments, the control gate dielectric 160 under the control gate electrodes 138a extends from the top surface of the floating gate electrode 134a to the top surface of the isolation structure 106, and the control gate dielectric 160 under the control gate electrodes 138b extends from the top surface of the floating gate electrode 134b to the top surface of the isolation structure 106. In the cross section of FIG. 1C, the floating gate electrodes 134a, 134b and the floating gate dielectrics 158 are narrower than the control gate electrodes 138a, 138b and the control gate dielectrics 160. However, in the cross section of FIG. 1B, the floating gate electrodes 134a, 134b and the floating gate dielectrics 158 are wider than the control gate electrodes 138a, 138b and the control gate dielectrics 160.

A silicide pad 172 is disposed in the substrate 104. The first ILD layer 200 is disposed above and contacts the silicide pad 172. The common source strap 160CS extends through the first and second ILD layers 200 and 202 to the silicide pad 172. In some embodiments, the common source strap 160CS can be interchangeably referred to as common source contact 160CS. In some embodiments, the silicide pad 172 may be nickel silicide (NiSi) or another suitable silicide(s) and may be formed by suitable saliciding process(es). In some embodiments, the dopant concentration (i.e., implanted impurity concentration) in the silicide pad 172 is lower than the dopant concentration in the silicide pads 170 of FIG. 1B. In some other embodiments, the silicide pad 172 is free of the dopant in the silicide pads 170.

In the cross-section perpendicular to the lengthwise direction of the erase gate electrode 144, the top surface of the silicide pad 172 (see FIG. 1C) is flatter than the bottom surface of the erase gate dielectric 146 (see FIG. 1B). For example, the bottom surface of the erase gate dielectric 146 is curved, while the top surface of the silicide pad 172 is substantially flat.

In some embodiments of FIG. 1C, floating gate spacers 149 line the sidewalls of the floating gate electrodes 134a, 134b, the sidewalls of the floating gate dielectrics 158, and the sidewalls of the control gate spacers 140, so as to separate the floating gate electrodes 134a, 134b, the floating gate dielectrics 158, and the control gate spacers 140 from the first ILD layer 200. In some embodiments, the regions of the substrate 104 directly under the floating gate spacers 149 are at least in part free of the silicide pad 172. In some embodiments, the silicide pad 172 is laterally spaced from the floating gate electrodes 134a, 134b and the floating gate dielectrics 158 by the floating gate spacers 149. That is, the silicide pad 172 is laterally spaced from the floating gate electrodes 134a, 134b by non-zero distances. In some embodiments, the floating gate spacers 149 are made of nitride, and the first ILD layer 200 is made of oxide. In some embodiments, the thickness of the floating gate spacers 149 is lower than about 10 nm and greater than about 5 nm.

It is noted that the floating gate spacers 149 are absent in the cross-section of FIG. 1B, and thus the erase gate dielectric 146 in FIG. 1B lines and contacts the sidewalls of the floating gate electrodes 134a, 134b, the sidewalls of the floating gate dielectrics 158, and the sidewalls of the control gate spacers 140. In some embodiments, the width of the silicide pad 172 is lower than the width of the erase gate dielectric 146 as well as the width of the common source region 128 in FIG. 1B. For example, the erase gate dielectric 146 has a widest width W1 (see FIG. 1B), and the silicide pad 172 has a width W2, in which W1 is greater than W2. On the other hand, the width W2 of the silicide pad 172 is lower than the distance between the floating gate electrodes 134a, 134b.

As illustrated in FIGS. 1A and 1D, FIG. 1D is a cross-sectional view along the lengthwise direction of the erase gate electrode 144 and through the erase gate electrode 144 and the common source strap 160CS. Some elements in FIG. 1D are similar to those described in FIGS. 1B and 1C, and thus such elements are labeled the same and relevant structural details will not be repeated for brevity. It is noted that FIGS. 1B, 1C, and 1D have the same scale, and thus the proportions of the elements respectively in FIGS. 1B, 1C, and 1D are the same.

In the cross-section of FIG. 1D, the erase gate electrode 144 is divided into a first portion 144A and a second portion 144B by the common source strap 160CS and the first ILD layer 200. A plurality of erase gate straps 160EG extend through the second ILD layer 202 and respectively contact the first portion 144A and the second portion 144B of the erase gate electrode 144. In some embodiments, the top surface of the silicide pad 172 is lower than the top surface of the erase gate dielectric 146, and is higher than the bottom surface of the erase gate dielectric 146. In some embodiments, in the cross-section of FIG. 1D, the silicide pad 172 has a width W3 in a range from about 80 nm to about 120 nm. The silicide pad 172 is in contact with the common source regions 128 and the common source strap 160CS, so as to electrically connects the common source strap 160CS to the common source regions 128. In some embodiments, the dopant concentration (e.g., implanted impurity) in the silicide pad 172 (or in the region under the silicide pad 172) is lower than the dopant concentration in the common source region 128. In some embodiments, the silicide pad 172 is substantially free of dopants of the common source region 128.

FIGS. 2A to 33D illustrate a method in various stages of fabricating a memory device in accordance with some embodiments of the present disclosure. In greater detail, FIGS. 2A to 33D illustrate a method for forming the memory device 100 described in FIGS. 1A to 1D.

Figure 2A:
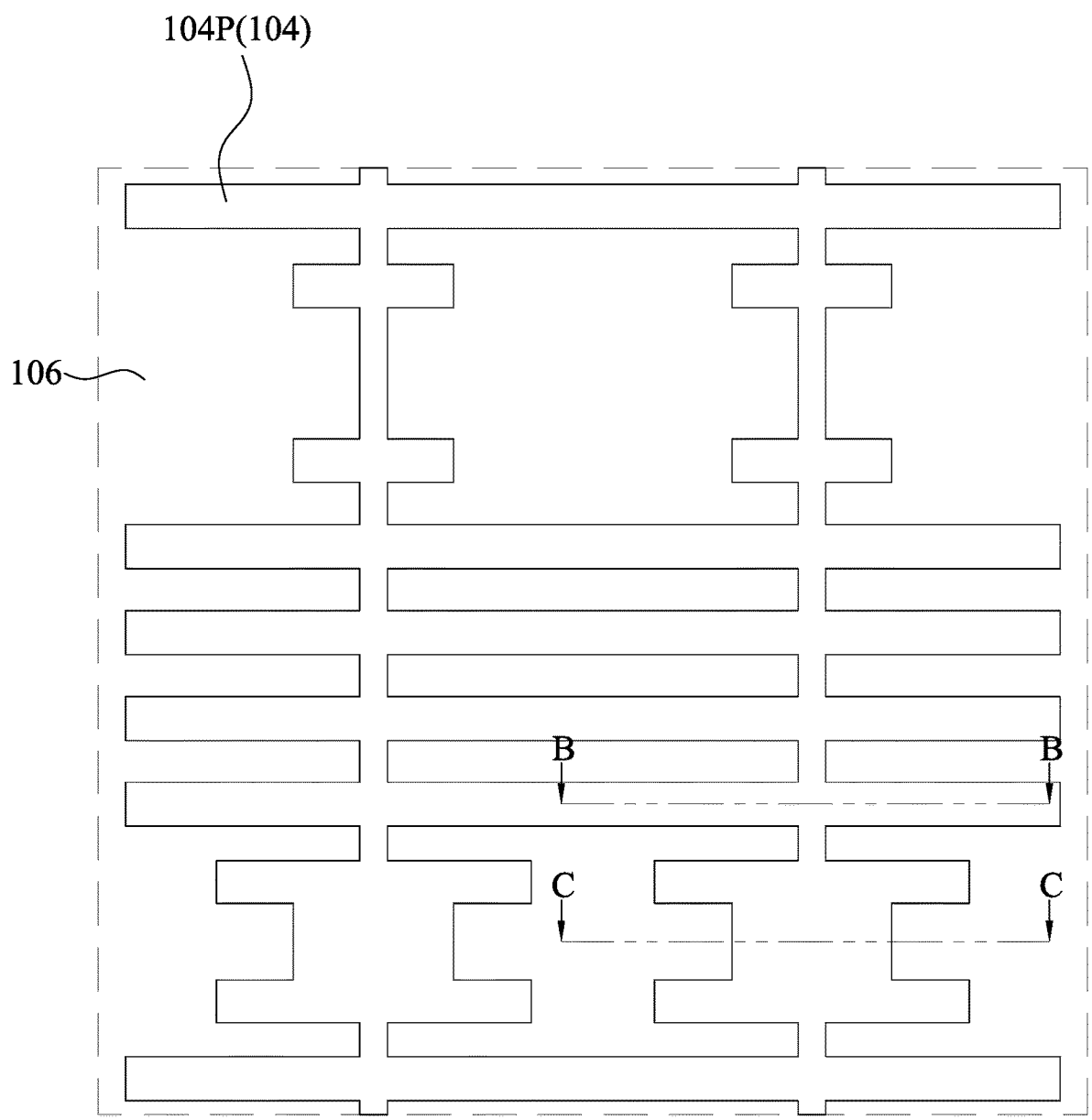
FIGS. 2A to 33D illustrate a method of manufacturing in accordance with some embodiments of the present disclosure.
Figure 2B:
Figure 2C:
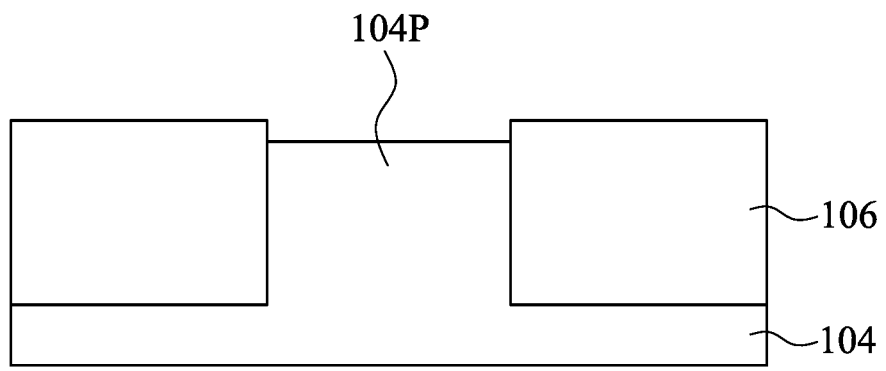

Reference is made to FIGS. 2A to 2C, in which FIG. 2A is an initial structure of the memory device 100 described in FIG. 1A and has the same a top view as FIG. 1A, FIG. 2B is a cross-sectional view along line B-B of FIG. 2A, and FIG. 2C is a cross-sectional view along line C-C of FIG. 2A. Shown there is a semiconductor substrate 104. In some embodiments, the semiconductor substrate 104 may be or otherwise include, for example, a bulk silicon substrate, a SOI substrate, a group III-V substrate, suitable semiconductor substrate(s). Semiconductor substrate 104 may also be a binary semiconductor substrate (e.g., GaAs), a tertiary semiconductor substrate (e.g., AlGaAs), a higher order semiconductor substrate. In some embodiments, the semiconductor substrate 104 includes active regions 104P, in which the active regions 104P may be formed by recessing the substrate 104 according to a predetermined pattern of the active regions 104P.

An isolation structure 106 is then formed in the substrate 104 and surrounding the active regions 104P, so as to provide electrical separation between the active regions 104P. The resulting structure is shown in FIGS. 2A-2C. In some embodiments, the isolation structure 106 may be or otherwise include, for example, a STI structure, a DTI structure, or another suitable isolation structure(s). In some embodiments, formation of the isolation structure 106 includes, for example, forming a pad oxide layer over the substrate 104 and a pad nitride layer over the pad oxide layer, forming a patterned mask over the pad nitride layer, etching through the pad nitride layer, the pad oxide into the substrate 104 by using the patterned mask as an etch mask, forming the oxide of the isolation structure 106 by depositing the oxide or an oxide precursor, performing a chemical mechanical polish (CMP) process to level the isolation structure 106 with the pad nitride layer, and then removing the pad layers from the substrate 104. As a result of these process steps, the top surface of the isolation structure 106 is higher than a top surface of the active region 104P of the substrate 104, as shown in FIG. 2C. By way of example and not limitation, the step height between the top surface of the isolation structure 106 and the top surface of the active region 104P is comparable to a total thickness of the removed pad layers.

Figure 3A:
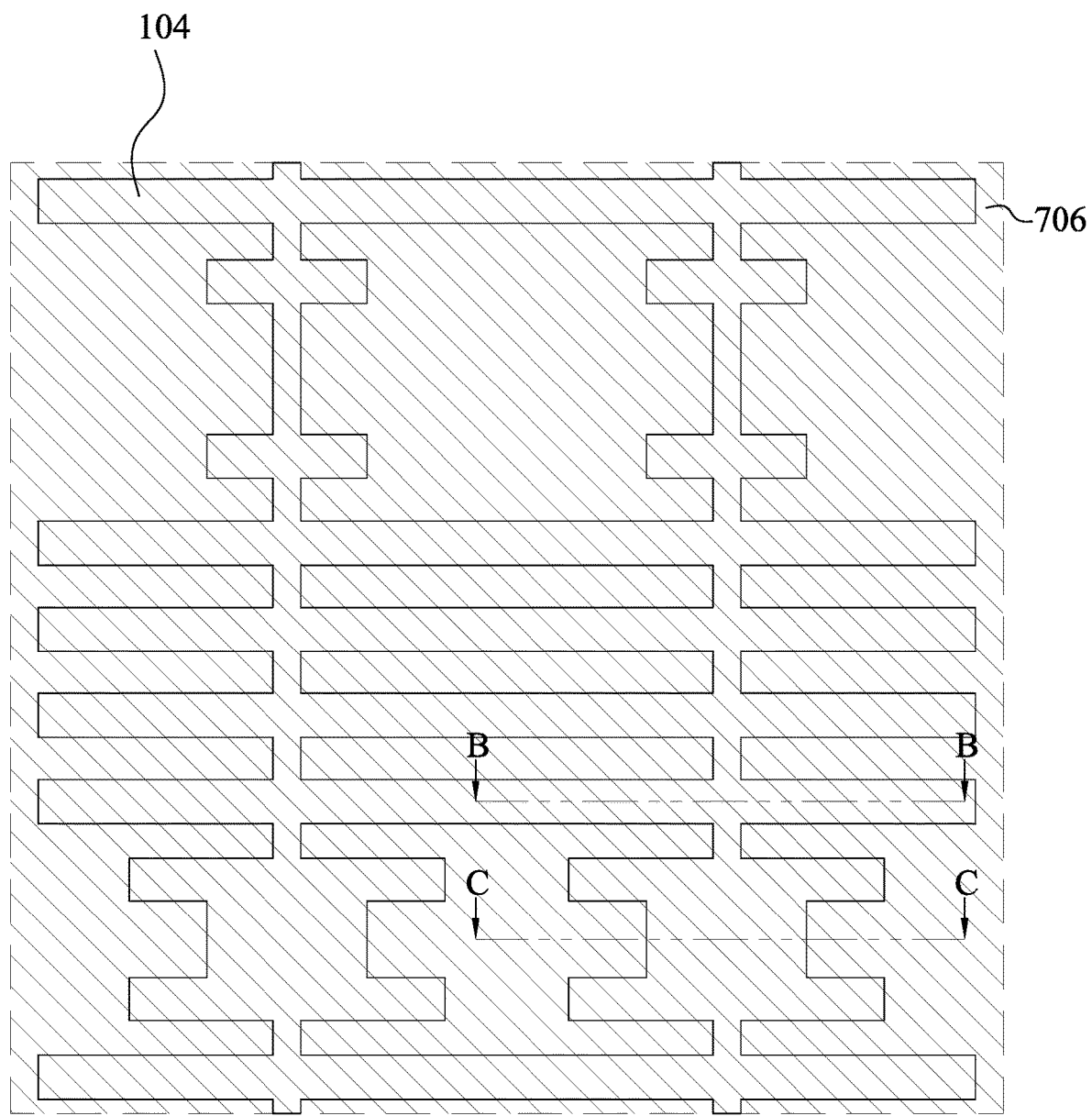
Figure 3B:
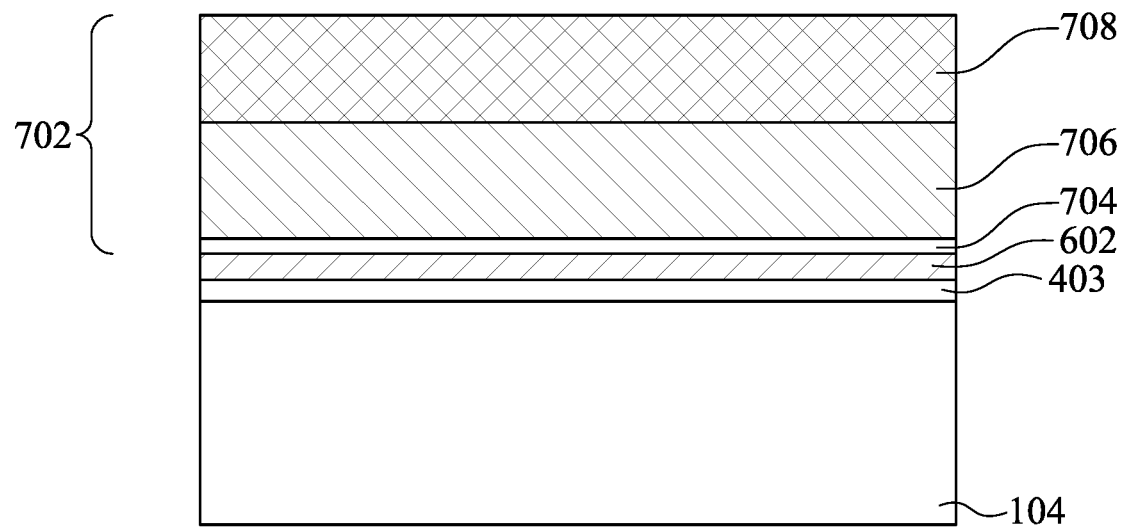
Figure 3C:
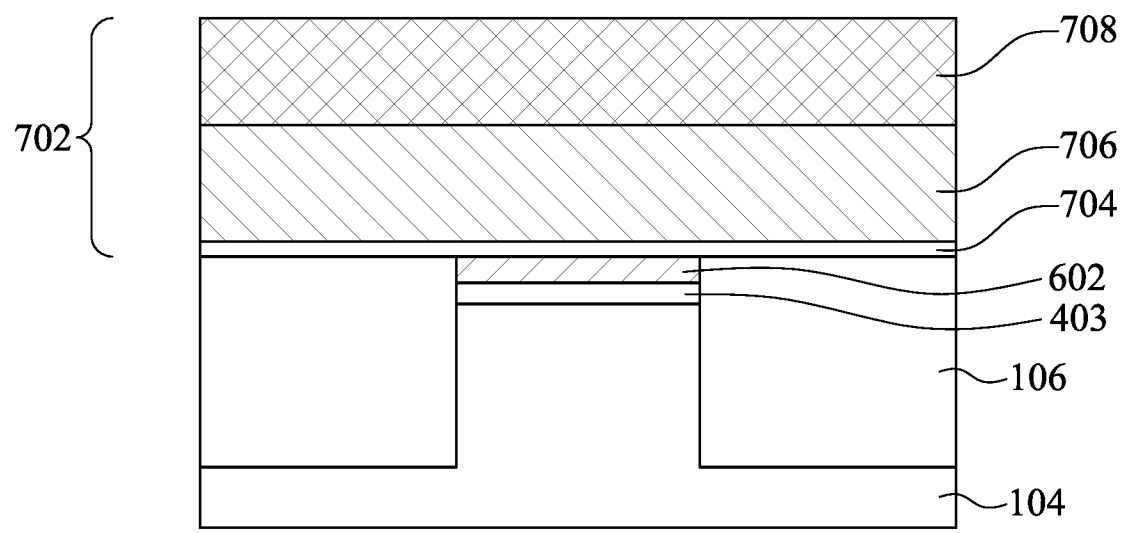

Reference is made to FIGS. 3A to 3C, in which FIG. 3A is a top view of a memory device after the process described in FIGS. 2A to 2C and has the same top view as FIG. 2A, FIG. 3B is a cross-sectional view along line B-B of FIG. 3A, and FIG. 3C is a cross-sectional view along line C-C of FIG. 3A. It is noted that some elements shown in FIGS. 3B and 3C are omitted in FIG. 3A for brevity. A gate oxide 403 may then be grown on the exposed portion of the semiconductor substrate 104. In some embodiments, the gate oxide 403 may be grown via a selective oxidation process (e.g., wet oxidation and/or thermal oxidation), so as to grow the gate oxide 403 selectively on the exposed portion of the semiconductor substrate 104, while leaving the top surface of the isolation structure 106 substantially uncovered by the gate oxide 403.

A floating gate layer 602 may then be formed covering the semiconductor substrate 104. Floating gate layer 602 may be formed conformally and may be doped polysilicon or another suitable conductive material(s). In some embodiments, the floating gate layer 602 may be formed by CVD, PVD, sputtering, or another suitable deposition process(es). Then, a planarization may be performed stopping on the isolation structure 106 to remove the floating gate layer 602 from the isolation structure 106. The planarization recesses a topmost surface of floating gate layer 602 to substantially even with a topmost surface of the isolation structure 106. In some embodiments, the planarization may be CMP or another suitable planarization process(es).

A control gate stack 702 may be formed over the planarized surfaces of the floating gate layer 602 and the isolation structure 106. In some embodiments, the control gate stack 702 includes a control gate dielectric layer 704, a control gate electrode layer 706, and a control gate hard mask 708. The control gate dielectric layer 704 covers the floating gate layer 602. The control gate dielectric layer 704 may be formed by CVD, PVD, another suitable deposition process(es), combination of the foregoing, or the like. In some embodiments, the total thickness of dielectric layer 704 is in the range from 25-400 Angstroms. In some embodiments, the total thickness of dielectric layer 704 is in the range from 50-200 Angstroms.

The control gate electrode layer 706 may be formed conformally and may be formed of doped polysilicon or another suitable conductive material(s). In some embodiments, a process of forming control gate electrode layer 706 includes depositing a material, implanting dopants into the material, and annealing to activate the dopants. The material of control gate electrode layer 706 may be deposited by CVD, PVD, or another suitable deposition process(es). In some embodiments, control gate electrode layer 706 has a thickness in the range from 600-2000 Angstroms. In some embodiments, control gate electrode layer 706 has a thickness in the range from 300-1000 Angstroms. In some embodiments, control gate electrode layer 706 has a thickness of about 600 Angstroms.

The control gate hard mask 708 may include multiple layers of differing materials. Control gate hard mask 708 may include oxide, nitride, or other suitable materials. In some embodiments, the control gate hard mask 708 includes an oxide layer over a first nitride layer. In some embodiments, the thicknesses of these layers are in the range from 100 to 1400 Angstroms. In some embodiments, the thicknesses of these layers are in the range from 200 to 700 Angstroms for example. In some embodiments, these layers are about 400 Angstroms thick. In some embodiments, the control gate hard mask 708 further includes a second nitride layer over oxide layer. The control gate hard mask 708 may be formed by CVD, PVD, another suitable deposition process(es), combination of the foregoing, or the like.

Figure 4A:
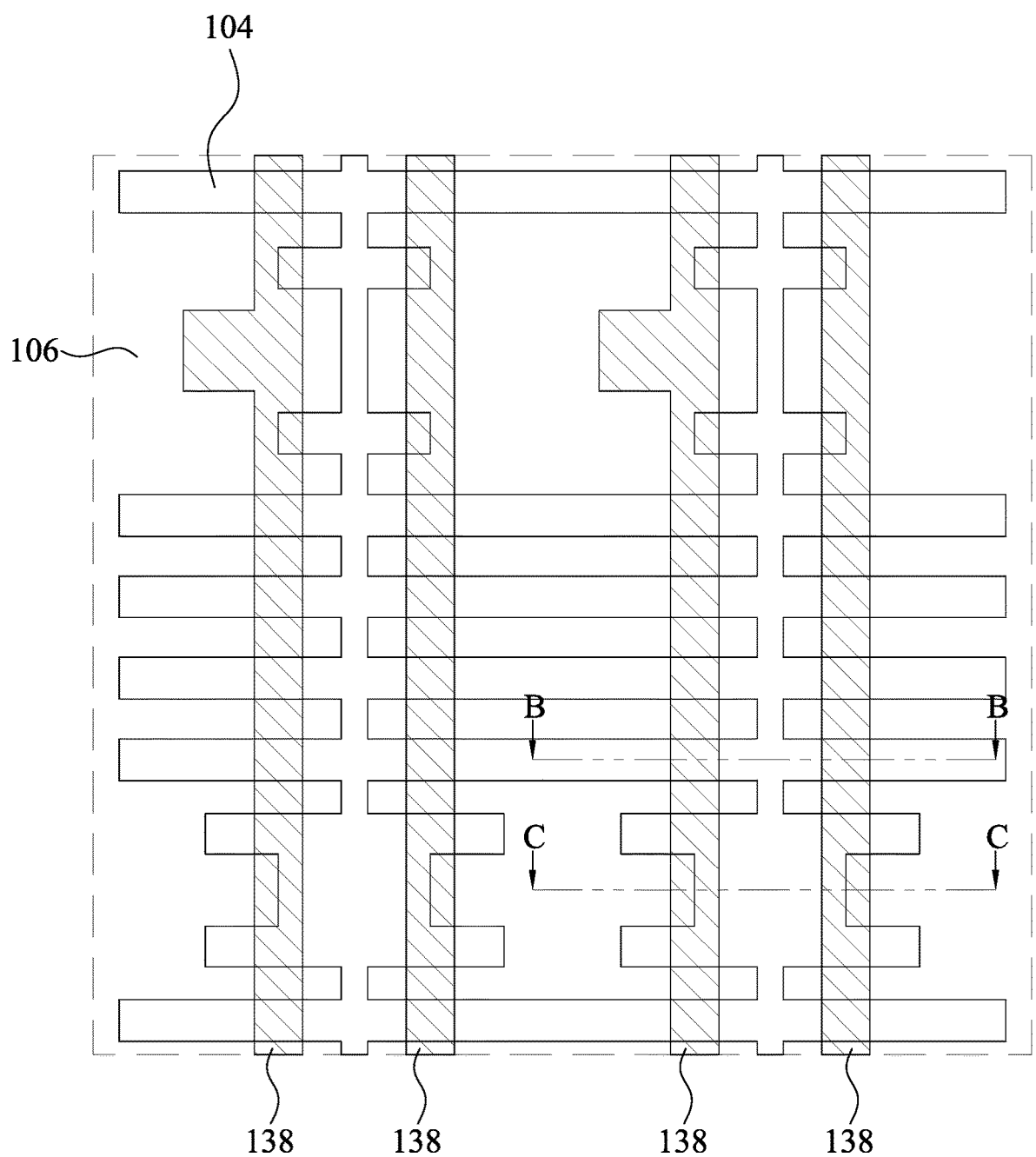
Figure 4B:
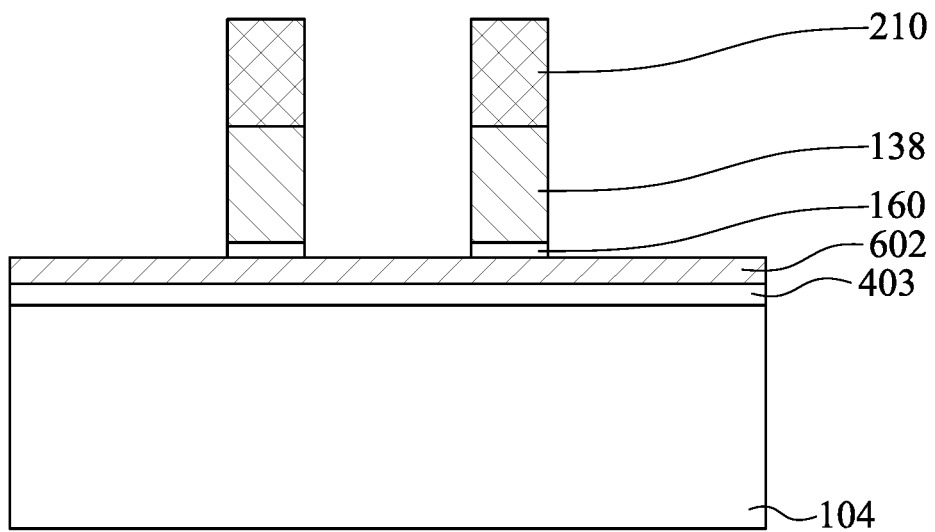
Figure 4C:
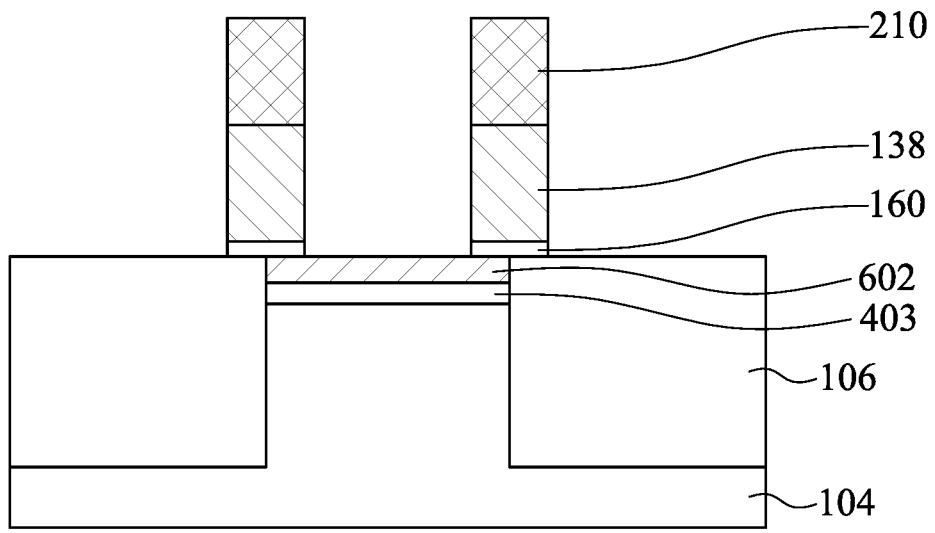

Reference is made to FIGS. 4A to 4C, in which FIG. 4A is a top view of a memory device after the process described in FIGS. 3A to 3C and has the same top view as FIG. 3A, FIG. 4B is a cross-sectional view along line B-B of FIG. 4A, and FIG. 4C is a cross-sectional view along line C-C of FIG. 4A. It is noted that some elements shown in FIGS. 4B and 4C are omitted in FIG. 4A for brevity. A selective etch may be performed to remove portions of control gate stack 702, thereby forming a plurality of control gate hard masks 210, a plurality of control gate electrodes 138, and a plurality of control gate dielectrics 160 over the floating gate layer 602. In some embodiments, a process for performing the selective etch includes forming a photoresist layer. The photoresist layer may be patterned to define the pattern of the control gate electrodes 138. Etch processes may then be applied with photoresist layer in place until the floating gate layer 602 is exposed. The photoresist layer may then be stripped in some embodiments.

Figure 5A:
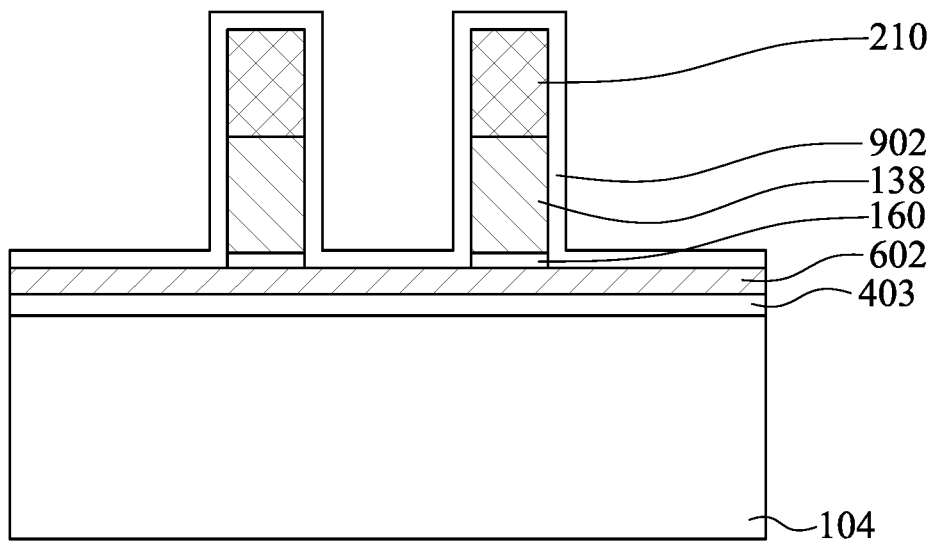
Figure 5B:
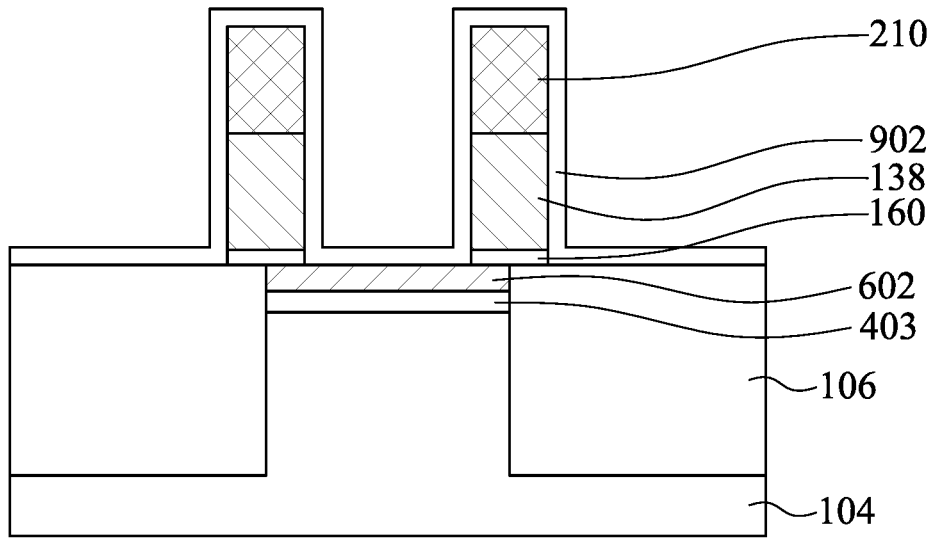

Reference is made to FIGS. 5A and 5B, in which FIG. 5A has the same cross-sectional view as FIG. 4B, and FIG. 5B has the same cross-sectional view as FIG. 4C. A control gate spacer layer 902 may be formed conformally over the floating gate layer 602, the control gate dielectrics 160, the control gate electrodes 138, and the control gate hard masks 210. In some embodiments, the control gate spacer layer 902 may be formed by CVD, PVD, or another suitable deposition process(es).

Figure 6A:
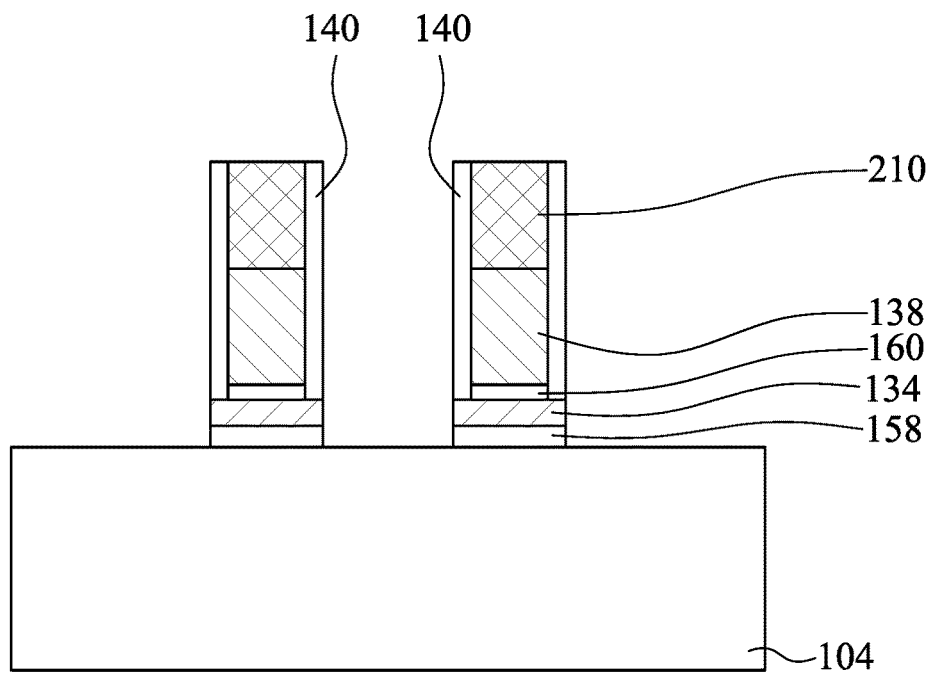
Figure 6B:
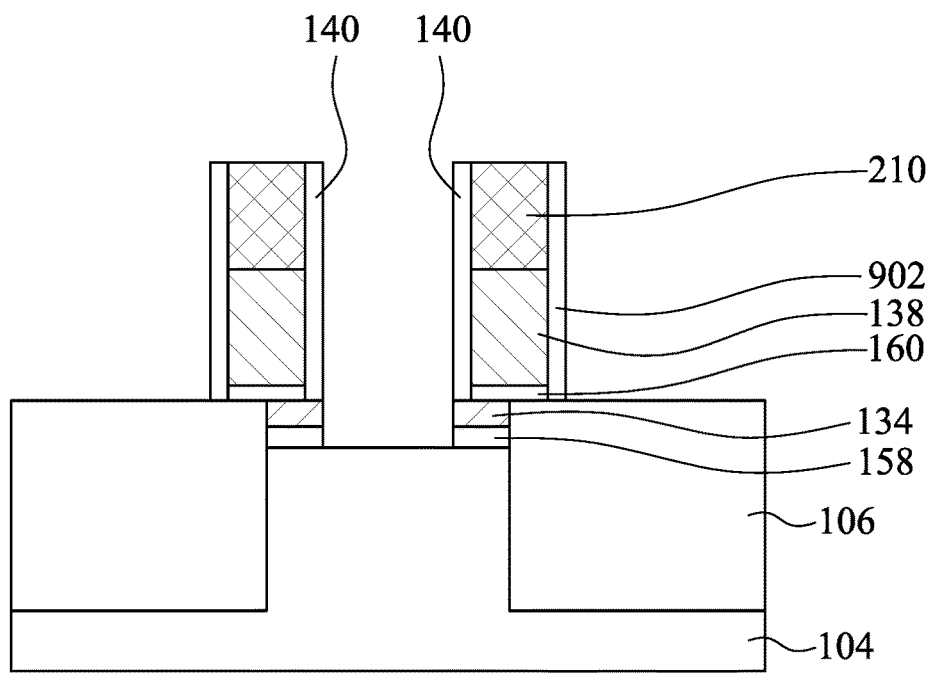

Reference is made to FIGS. 6A and 6B, in which FIG. 6A has the same cross-sectional view as FIG. 5A, and FIG. 6B has the same cross-sectional view as FIG. 5B. The control gate spacer layer 902 (see FIGS. 5A and 5B) is etched to form a plurality of control gate spacers 140. As a result of the etching, the control gate spacers 140 cover opposite sidewalls of control gate electrodes 138. In some embodiments, the control gate spacers 140 overlie the isolation structure 106, as shown in FIG. 6B. The etching process may include plasma etching or other suitable etch process(es) that selectively removes horizontal portions of control gate spacer layer 902. The control gate spacers 140 are shown with vertical sidewalls for ease of illustration. More typically, these spacers are rounded at the top and form smoothly tapering sidewall surfaces. On the other hand, another etching process may be performed to the floating gate layer 602 and the gate oxide 403 (see FIGS. 5A and 5B) to form a plurality of floating gate electrodes 134 and a plurality of floating gate dielectrics 158. In some embodiments, the control gate spacers 140 and the control gate hard masks 210 may serve as an etching mask for this etching process.

Figure 7A:
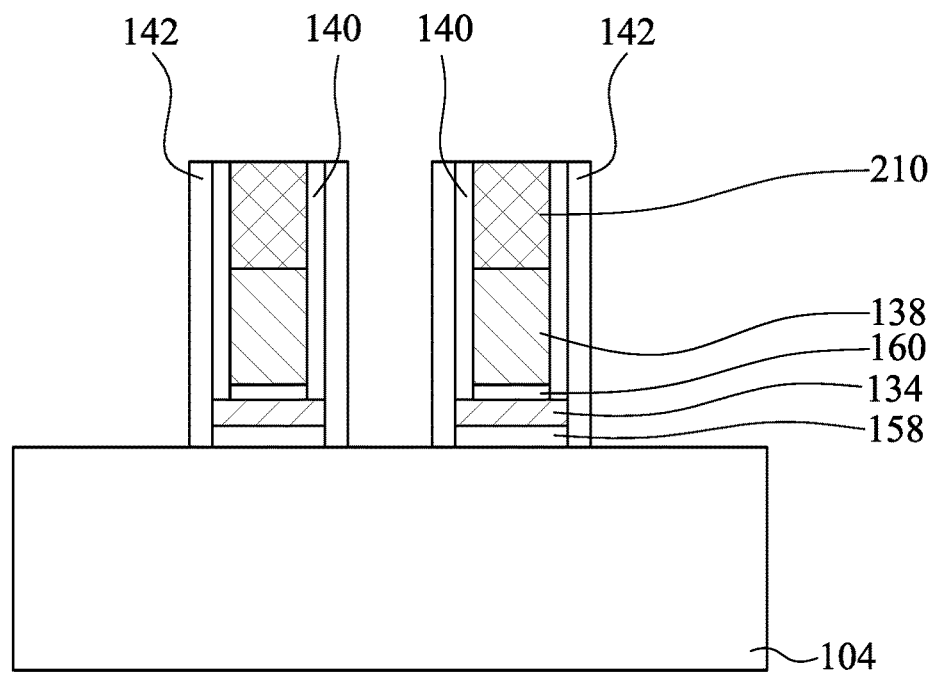
Figure 7B:
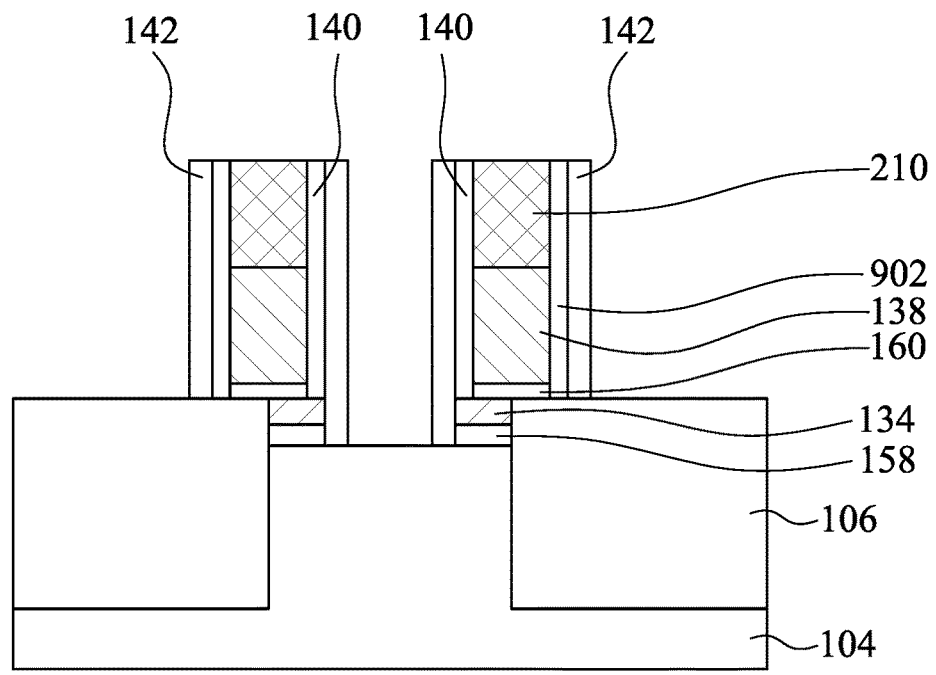

Reference is made to FIGS. 7A and 7B, in which FIG. 7A has the same cross-sectional view as FIG. 6A, and FIG. 7B has the same cross-sectional view as FIG. 6B. A plurality of floating gate spacers 142 may be formed on opposite sidewalls of the floating gate electrodes 134 and on a sidewall of each of the control gate spacers 140. In some embodiments, the process for forming the floating gate spacers 142 may include depositing a floating gate spacer layer over the structure illustrated in FIGS. 6A and 6B, followed by a plasma etching or other suitable etch process(es) that selectively removes the horizontal portions of the floating gate spacer layer. The floating gate spacer layer may be deposited conformally by CVD, PVD, or another suitable deposition process(es). The floating gate spacers 142 are shown with vertical sidewalls for ease of illustration. In some other embodiments, these sidewalls are rounded at the top and form smoothly tapering sidewall surfaces.

Figure 8A:
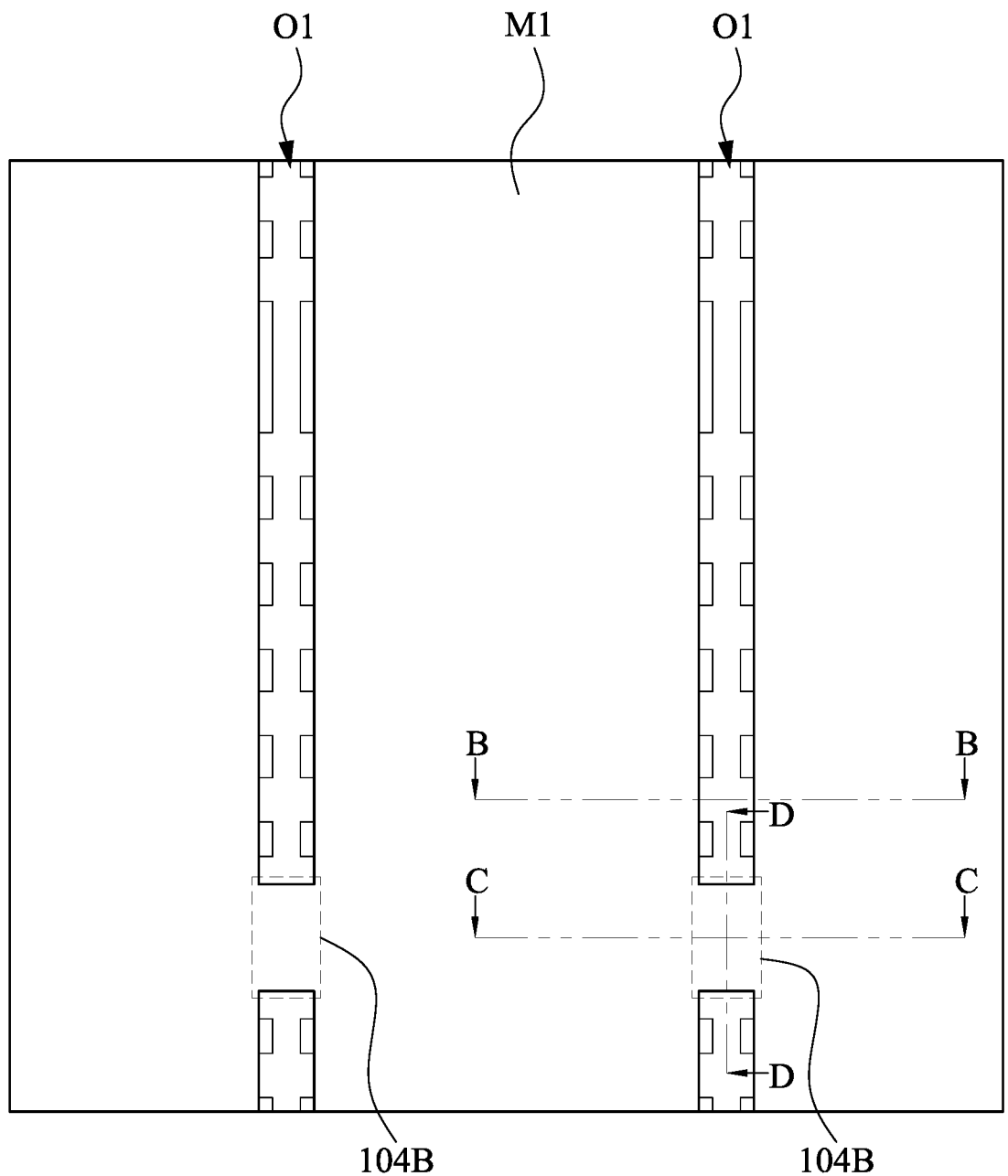
Figure 8B:
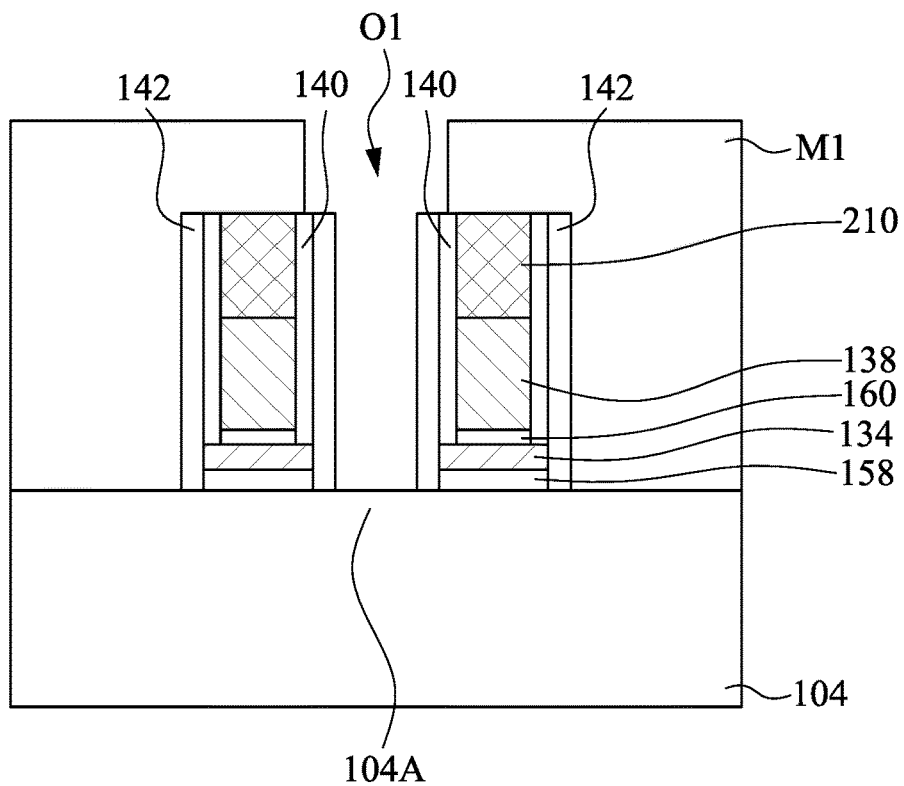
Figure 8C:
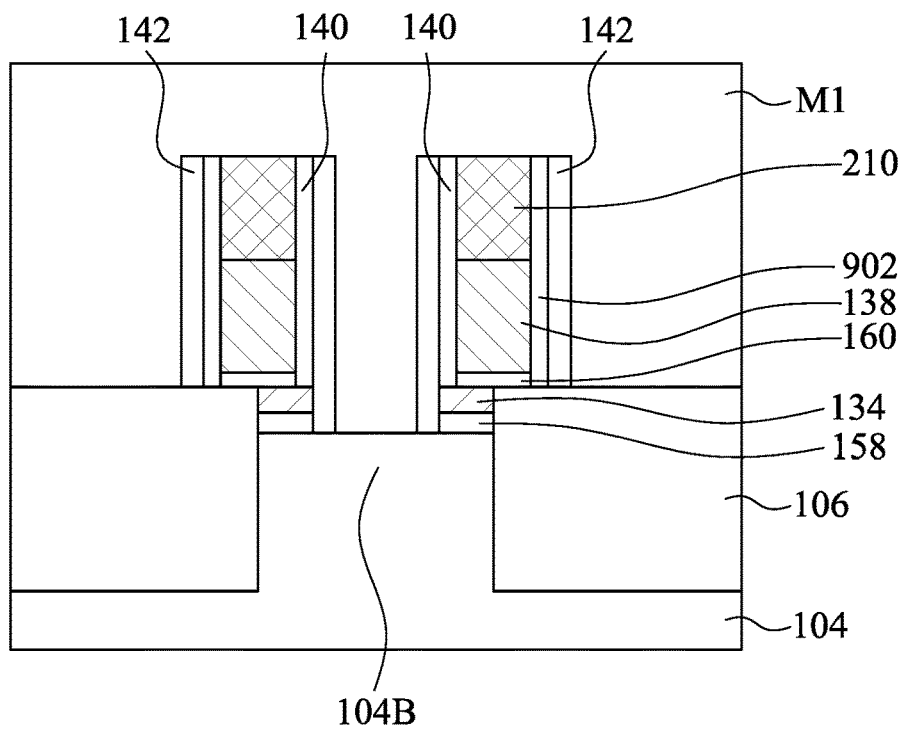
Figure 8D:
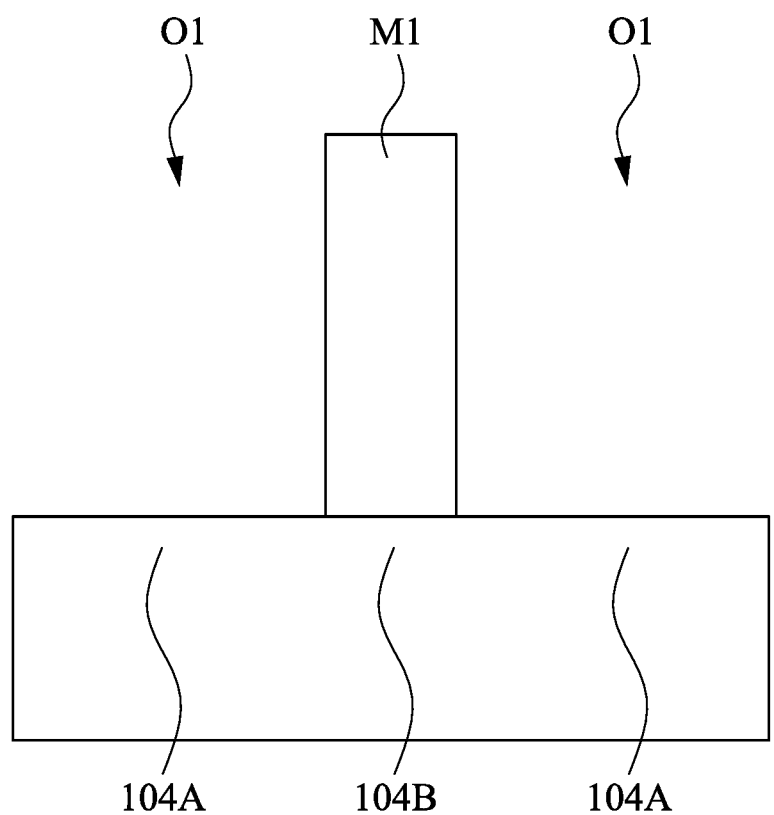

Reference is made to FIGS. 8A to 8D, in which FIG. 8A is a top view of a memory device after the process described in FIGS. 7A and 7B and has the same top view as FIG. 4A, FIG. 8B is a cross-sectional view along line B-B of FIG. 8A, FIG. 8C is a cross-sectional view along line C-C of FIG. 8A, and FIG. 8D is a cross-sectional view along line D-D of FIG. 8A. It is noted that some elements shown in FIGS. 8B to 8D are omitted in FIG. 8A for brevity. A patterned mask M1 is formed over the substrate 104. In some embodiments, the patterned mask M1 may be a photoresist layer. The photoresist layer M1 may be patterned using photolithography.

In some embodiments, the photoresist layer M1 includes a plurality of openings O1 which expose portions 104A of the substrate 104. On the other hand, along the direction parallel to the lengthwise direction of the control gate electrodes 138, the photoresist layer M1 covers portions 104B of the substrate 104 (see FIG. 8A). In greater detail, the portions 104B define the positions of the common source (CS) straps formed in later steps (e.g., the common source strap 160CS in FIGS. 32A to 32D). As a result, the portions 104B can be interchangeably referred to as common source (CS) strap landing region. On the other hand, the photoresist layer M1 expose portions 104A of the substrate 104, in which the portions 104A define the positions of the erase gate electrodes formed in later steps (e.g., the erase gate electrode 144 in FIGS. 22A to 22C).

As shown in FIG. 8D, along the direction parallel to the lengthwise direction of the control gate electrodes 138, the covered portion 104B of the substrate 104 is between the exposed portions 104A of the substrate 104. Stated another way, the exposed portions 104A of the substrate 104 are respectively on opposites of the covered portion 104B of the substrate 104.

Figure 9A:
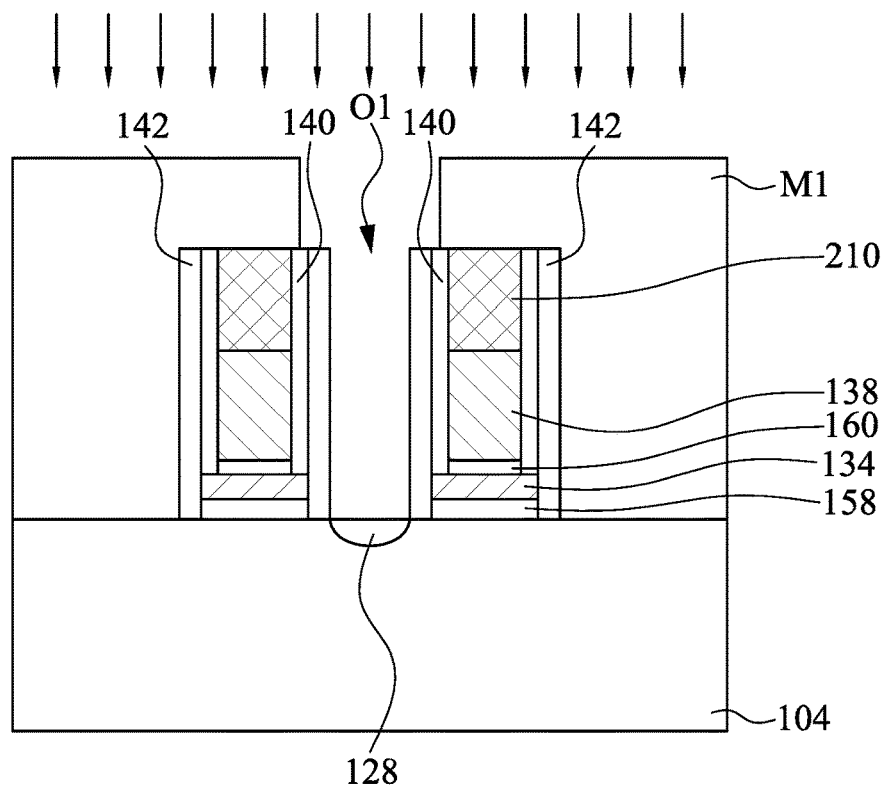
Figure 9B:
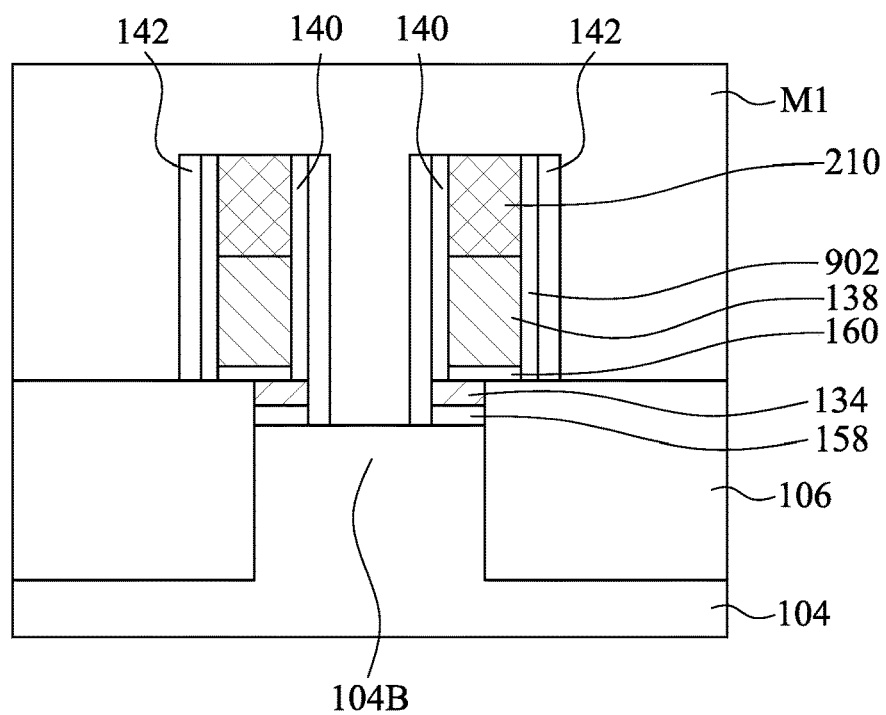
Figure 9C:
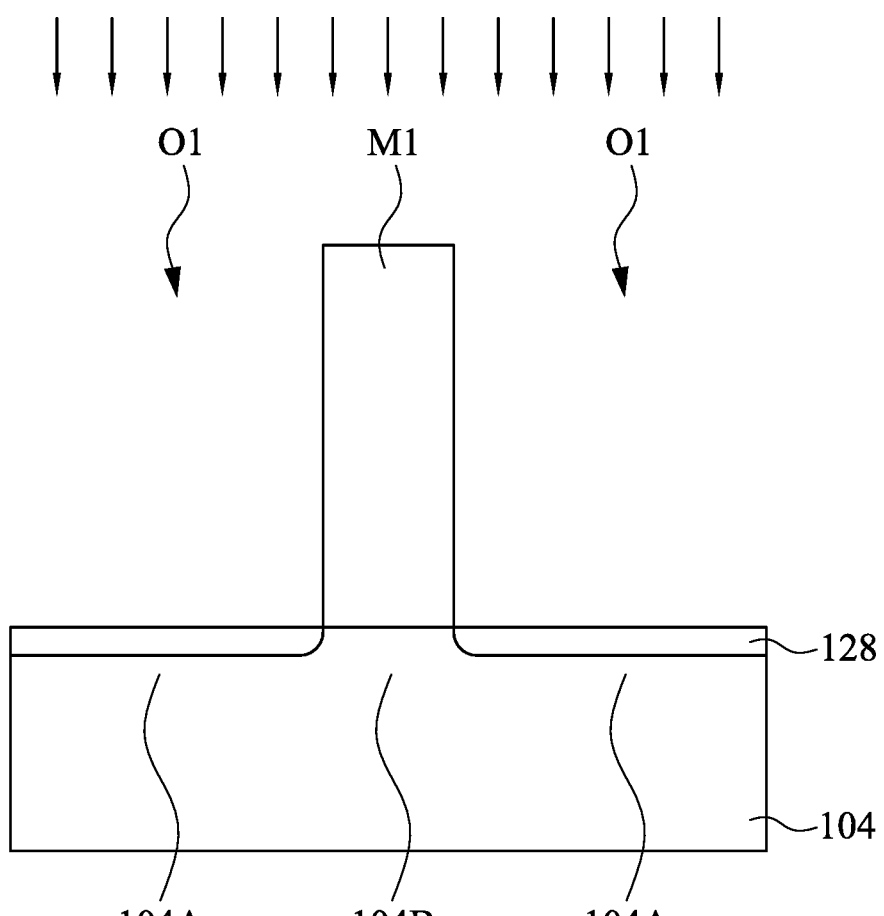

Reference is made to FIGS. 9A to 9C, in which FIGS. 9A to 9C have the same cross sectional views as FIGS. 8B to 8D, respectively. A plurality of common source regions 128 may be formed in the substrate 104 laterally between floating gate electrodes 134. In some embodiments, the process for forming the common source regions 128 may include an ion implantation or another suitable doping process(es). In some embodiments, the dopants are driven into the exposed portions 104A of the substrate 104 via the openings O1 of the patterned mask M1 to form the common source regions 128. On the other hand, the covered portions 104B of the substrate 104 are protected by the patterned mask M1 during the ion implantation, such that that the covered portions 104B of the substrate 104 are free of dopants of the common source regions 128. That is, the dopant concentration of the covered portions 104B of the substrate 104 is lower than the dopant concentration of the common source regions 128 (e.g., the doped exposed portions 104A).

Figure 10A:
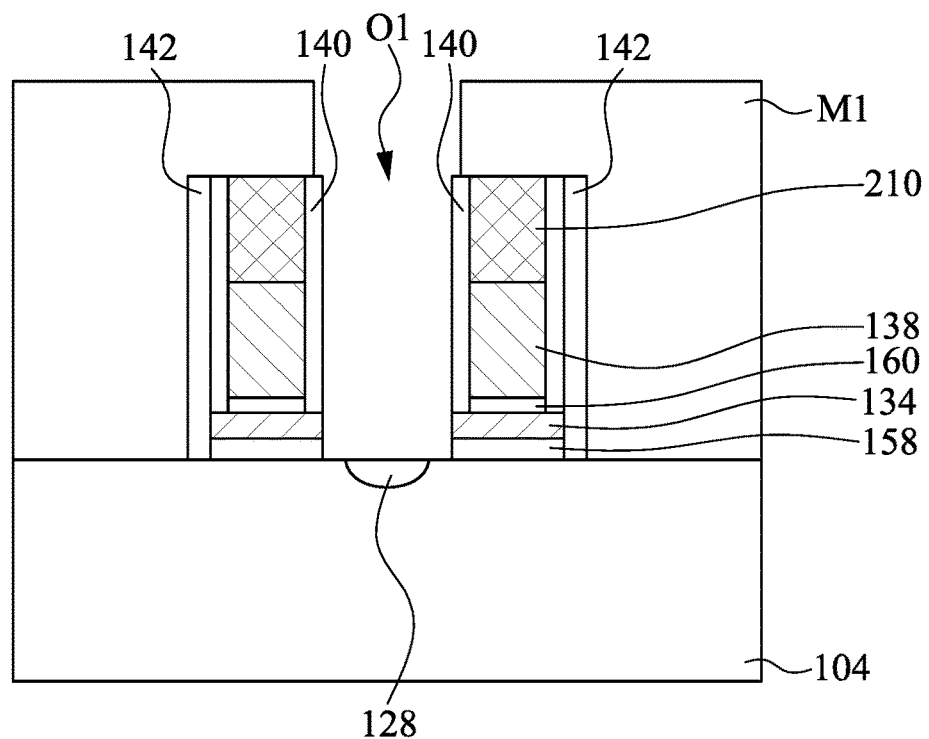
Figure 10B:
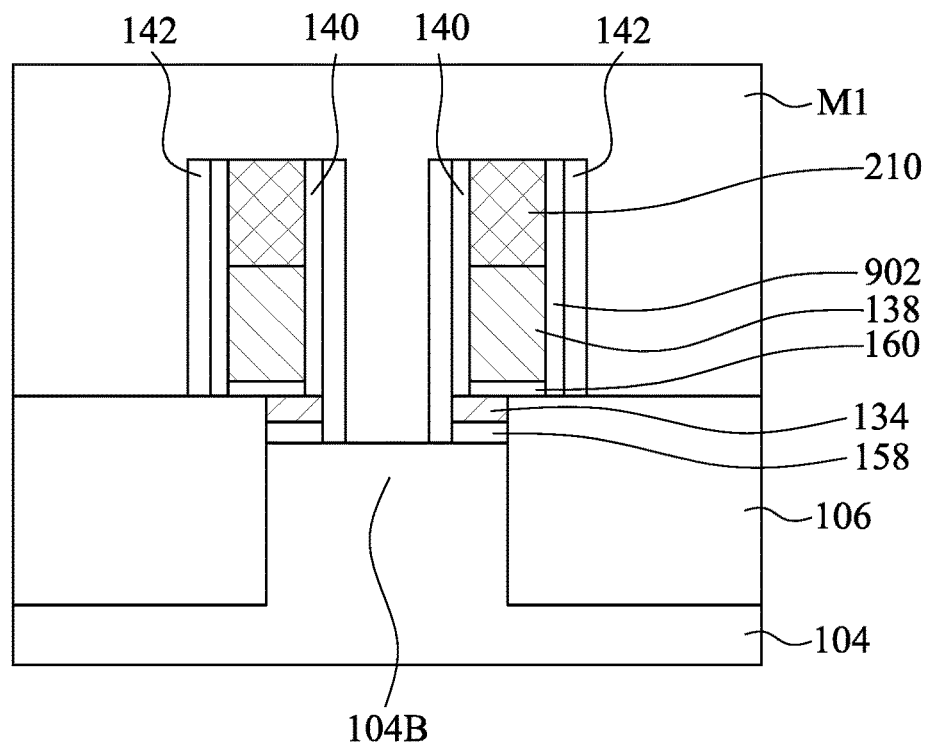
Figure 10C:
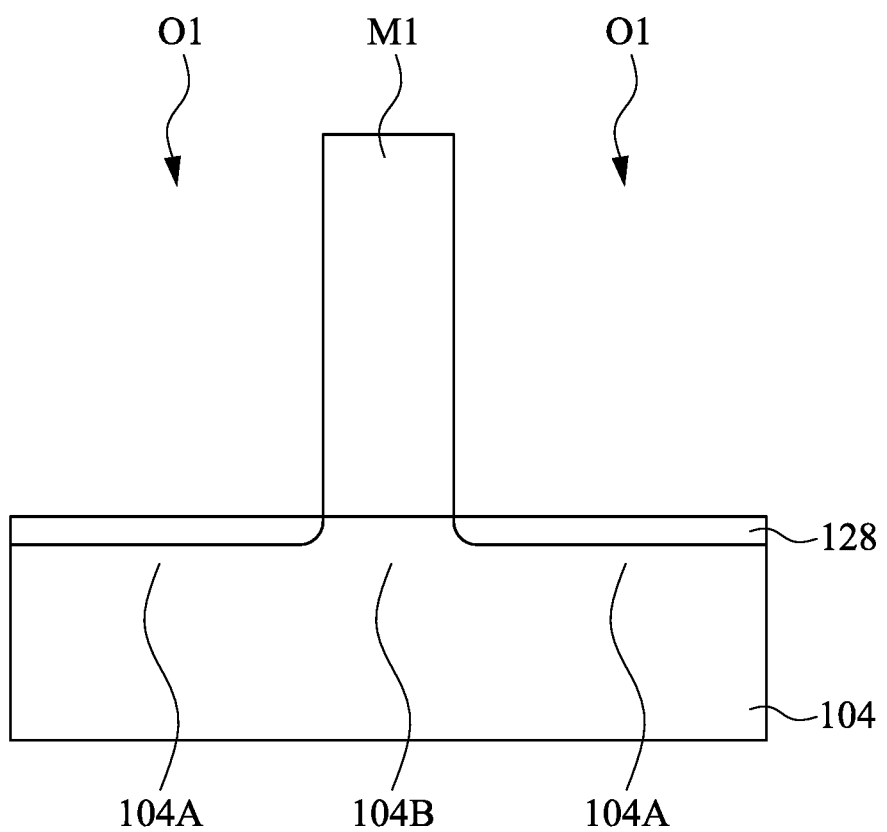

Reference is made to FIGS. 10A to 10C, in which FIGS. 10A to 10C have the same cross sectional views as FIGS. 9A to 9C, respectively. The floating gate spacers 142 exposed by the openings O1 of the patterned mask M1 are removed. A process for removing the floating gate spacers 142 may include etching using the patterned mask M1 as etching mask.

Figure 11A:
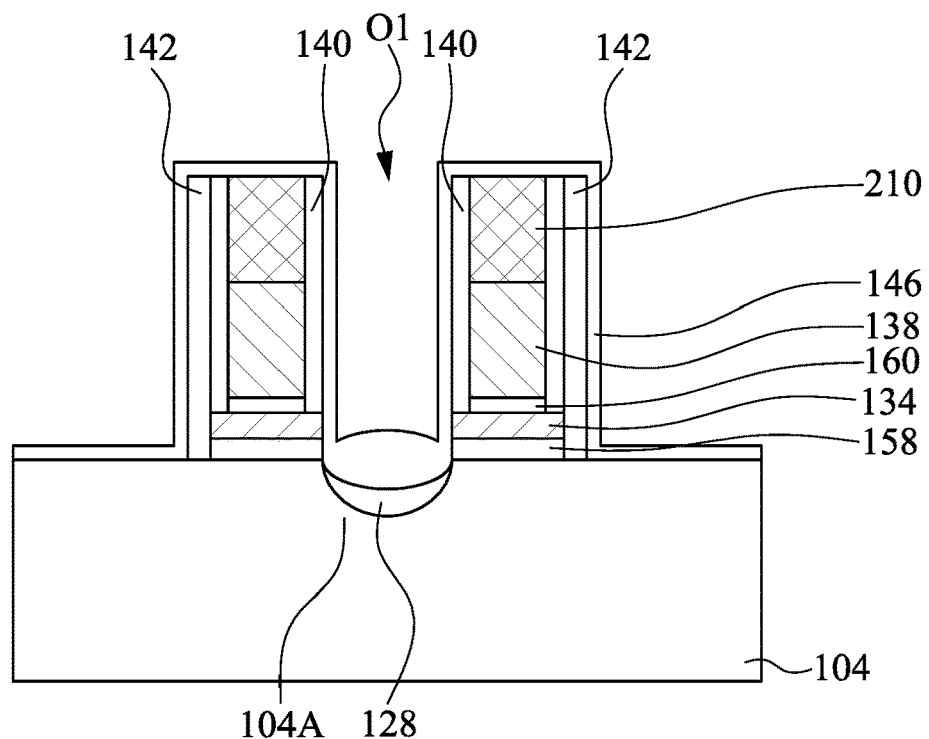
Figure 11B:
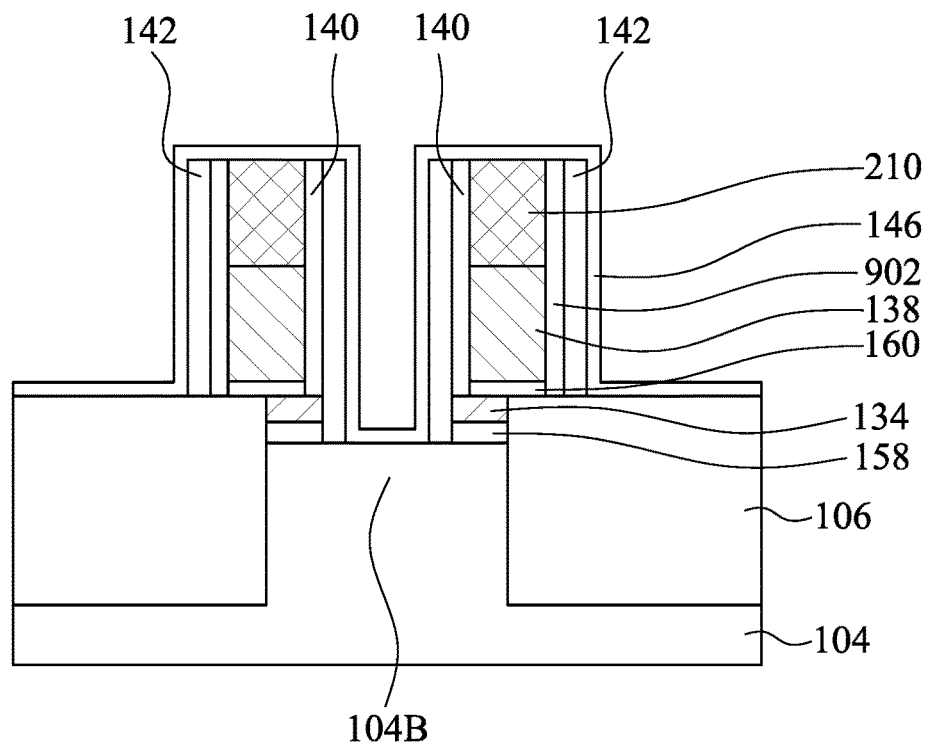
Figure 11C:
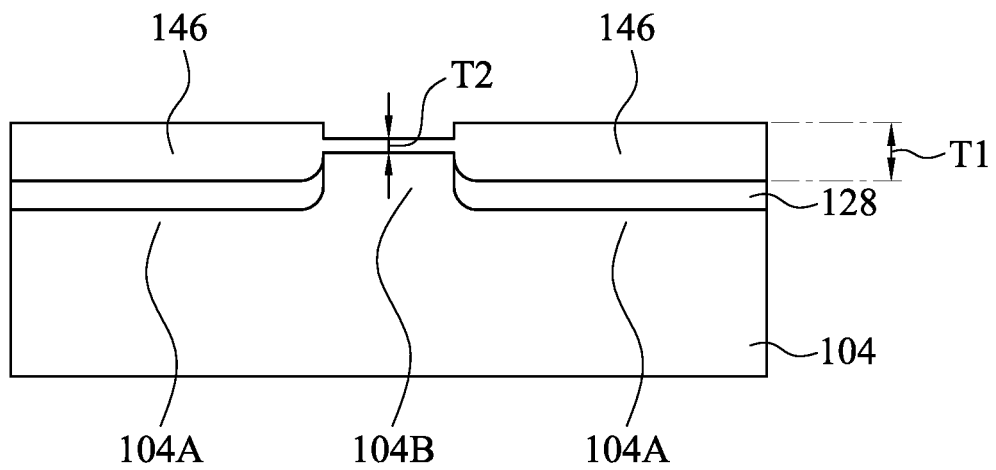

Reference is made to FIGS. 11A to 11C, in which FIGS. 11A to 11C have the same cross sectional views as FIGS. 10A to 10C, respectively. The patterned mask M1 is removed by suitable process, such as stripping. An erase gate dielectric 146 may then be formed covering the common source regions 128 and lining sidewalls of floating gate electrodes 134 and sidewalls of control gate spacers 140. A process of forming the erase gate dielectric 146 may include high temperature oxidation (HTO), in situ steam generation (ISSG) oxidation, another suitable deposition or growth process(es), combination of the foregoing, or the like. In some embodiments, the erase gate dielectric is formed with a by an oxide deposition process followed by an oxide growth process. In some embodiments, in the cross-section of FIG. 11A, the erase gate dielectrics 146 develop a curved or bulbous surface profile due to ion implantation in the common source regions 128. The central region of common source regions 128 receives a larger dose of dopants and as a result undergoes more damage than the peripheral region of the common source regions 128. The oxide may consequentially grow more rapidly in the central region as compared to the peripheral region.

In FIGS. 11B and 11C, as described above, because the portion 104B of the substrate 104 is a dopant-free region, the erase gate dielectrics 146 has a lower growth rate on the un-doped portions 104B of the substrate 104 than on the doped portions 104A of the substrate 104. As a result, the portions of the erase gate dielectrics 146 over the doped portions 104A have a thickness T1, and the portion of the erase gate dielectrics 146 over the un-doped portion 104B of the substrate 104 has a thickness T2, in which T1 is greater than T2. That is, the portions of the erase gate dielectrics 146 over the doped portions 104A are thicker than the portion of the erase gate dielectrics 146 over the un-doped portion 104B of the substrate 104. In the cross-section of FIG. 11B, the portion of the erase gate dielectrics 146 over the un-doped portion 104B has substantially a flat bottom surface. That is, along the direction perpendicular to the lengthwise direction of the control gate electrodes 138, the bottom surface of the portion of the erase gate dielectrics 146 over the un-doped portion 104B is flatter than the bottom surface of the portion of the erase gate dielectrics 146 over the doped portions 104A.

Figure 12A:
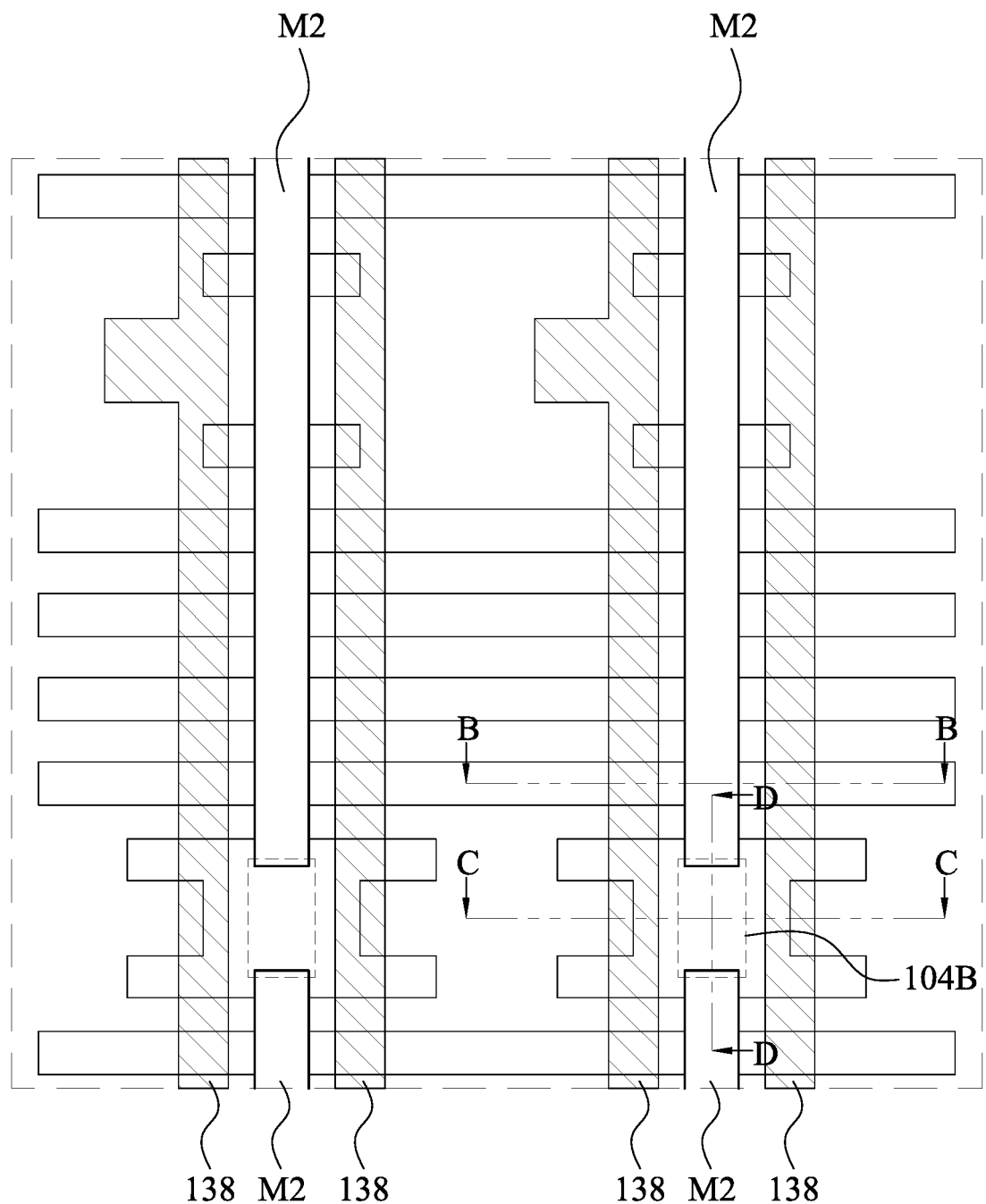
Figure 12B:
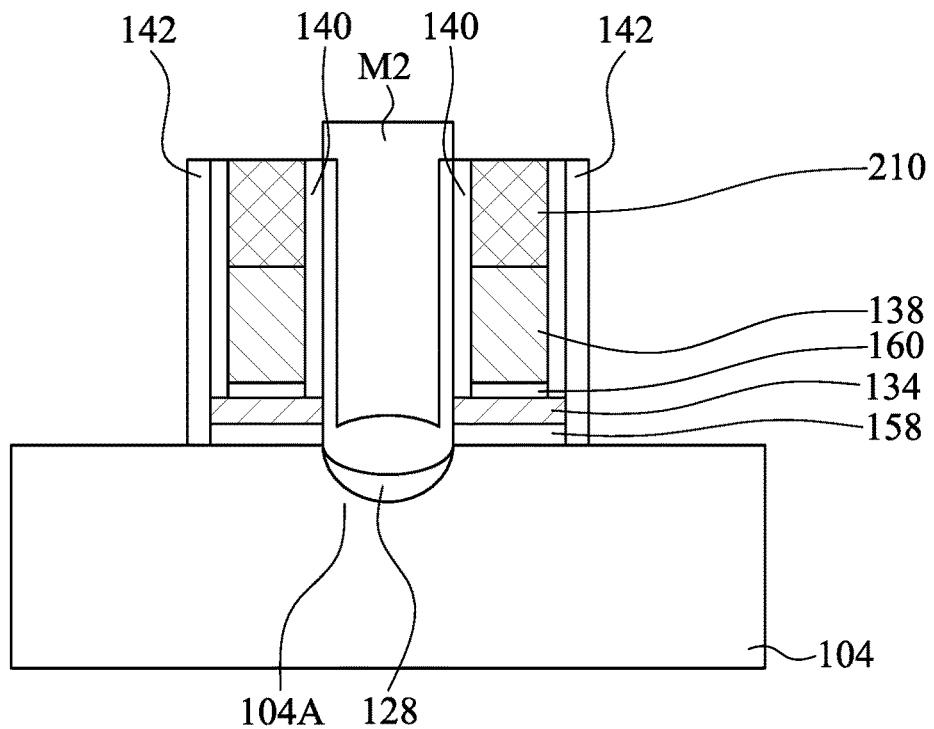
Figure 12C:
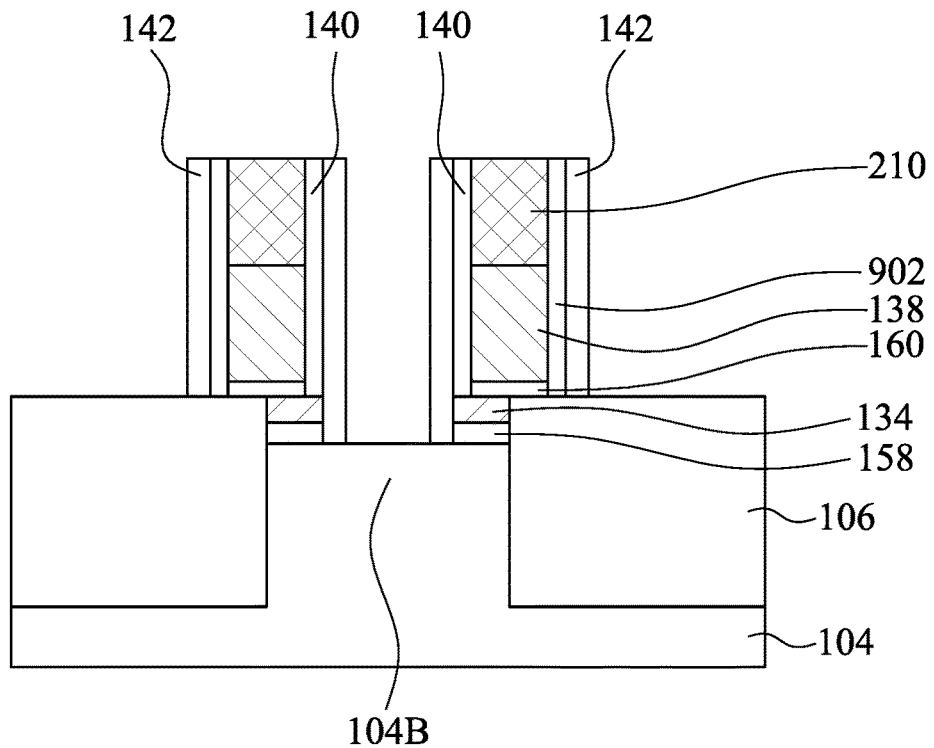
Figure 12D:
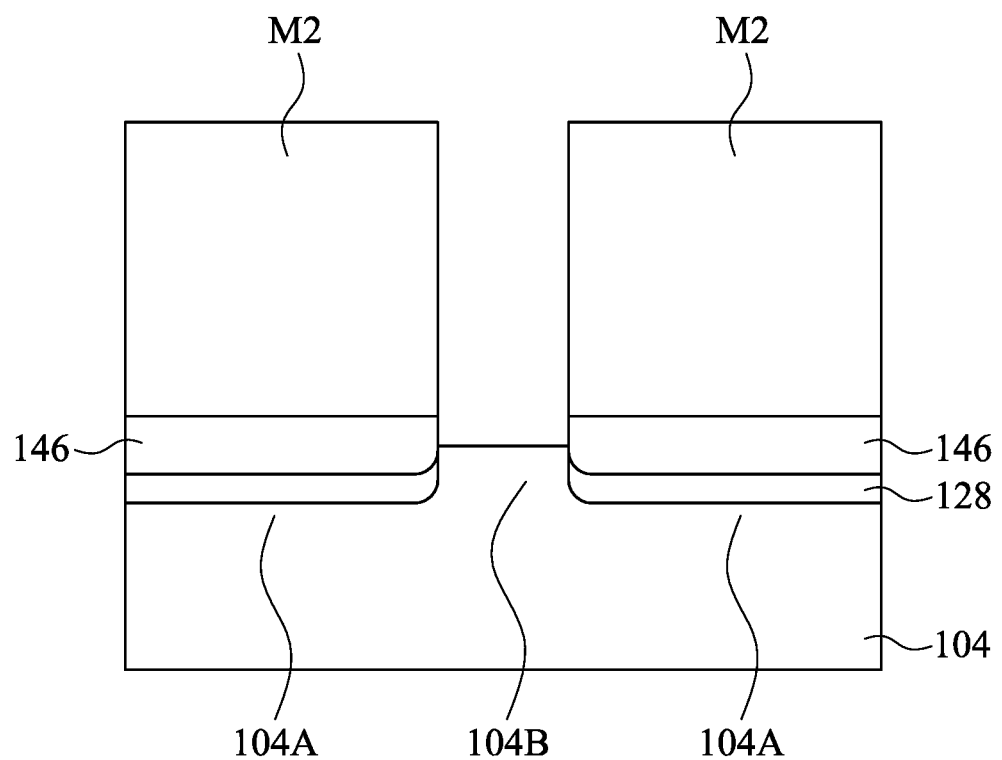

Reference is made to FIGS. 12A to 12D, in which FIG. 12A is a top view of a memory device after the process described in FIGS. 11A to 11C and has the same top view as FIG. 8A, FIG. 12B is a cross-sectional view along line B-B of FIG. 12A, FIG. 12C is a cross-sectional view along line C-C of FIG. 12A, and FIG. 12D is a cross-sectional view along line D-D of FIG. 12A. A patterned mask M2 is formed over the substrate 104. Then, an etching process is performed to remove unwanted portions of the erase gate dielectrics 146. In greater detail, the patterned mask M2 is formed over and protects the erase gate dielectrics 146 over the common source regions 128. For example, the patterned mask M2 covers the portions 104A of the substrate 104 while exposing the portions 104B of the substrate 104. Accordingly, the erase gate dielectrics 146 over the portions 104B of the substrate 104 is etched via the patterned mask M2, and the portion 104B of the substrate 104 is then exposed by the patterned mask M2. In some embodiments, the patterned mask M2 has a pattern substantially reversed to the pattern of the patterned mask M1 shown in FIG. 8A.

Figure 13A:
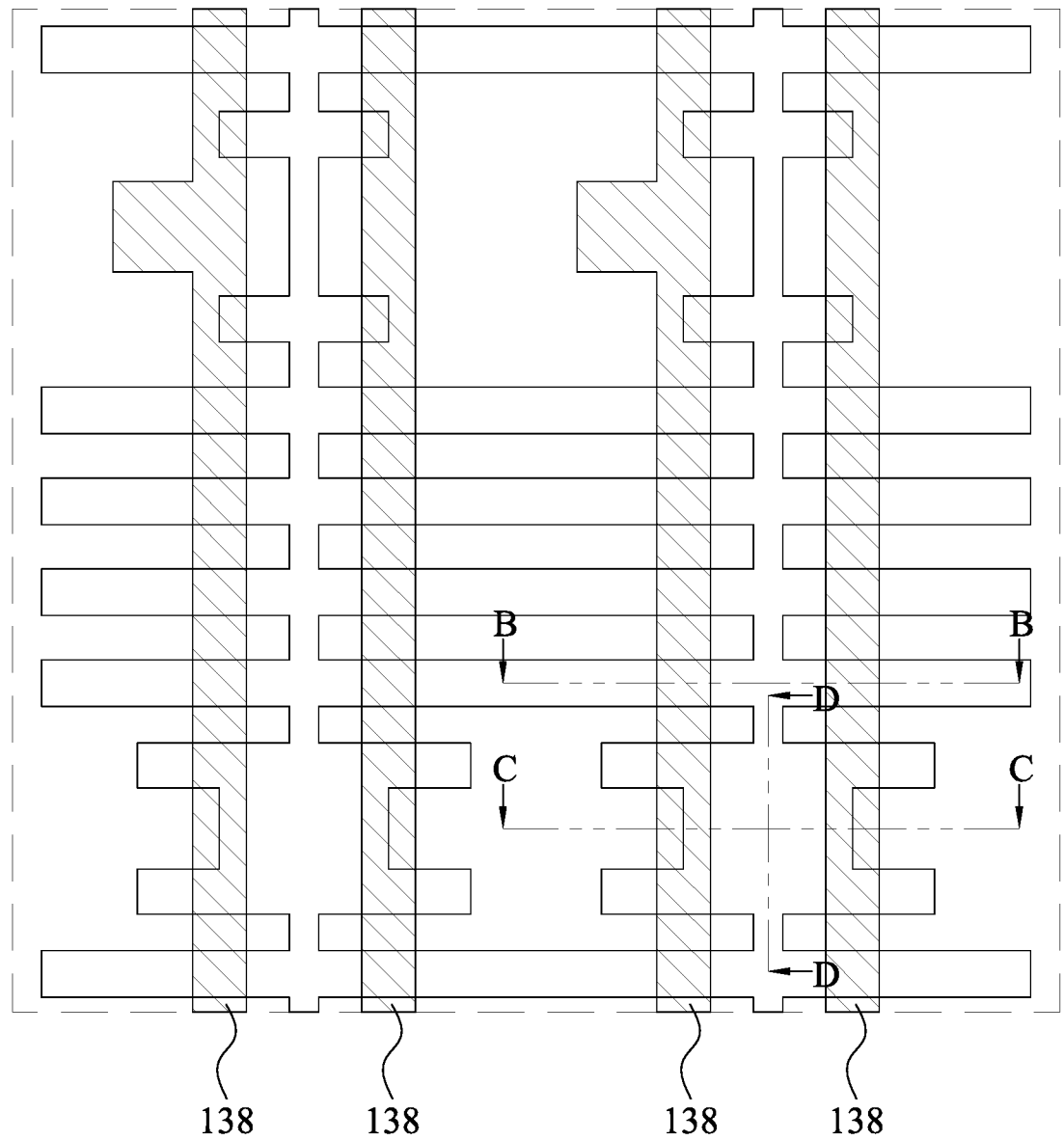
Figure 13B:
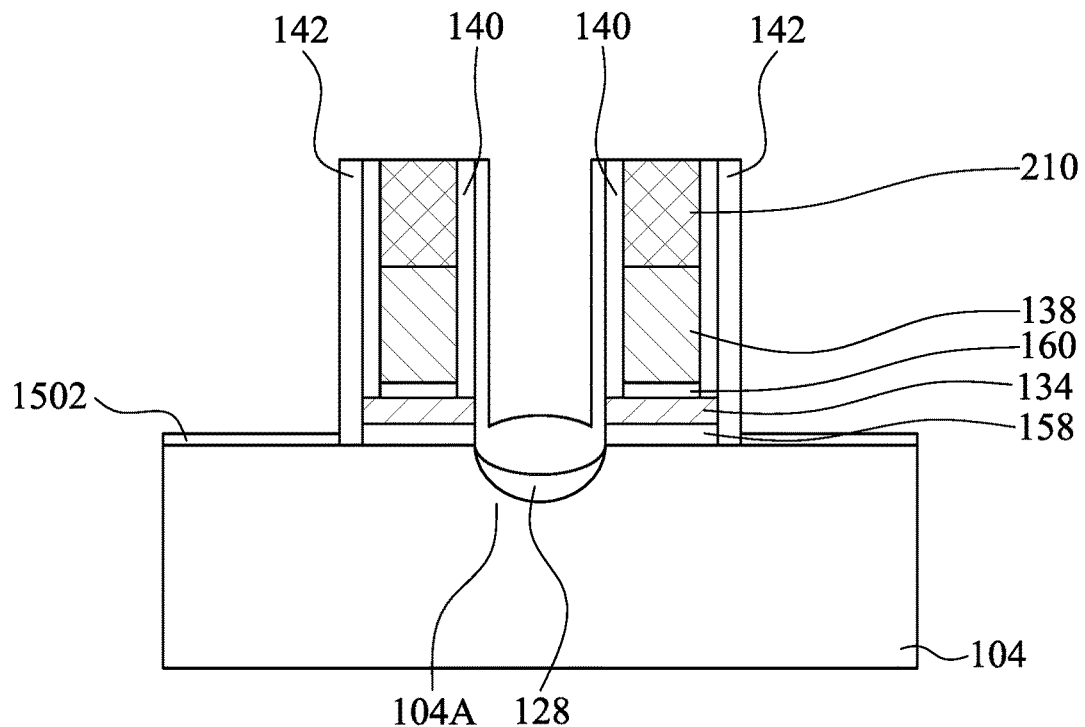
Figure 13C:
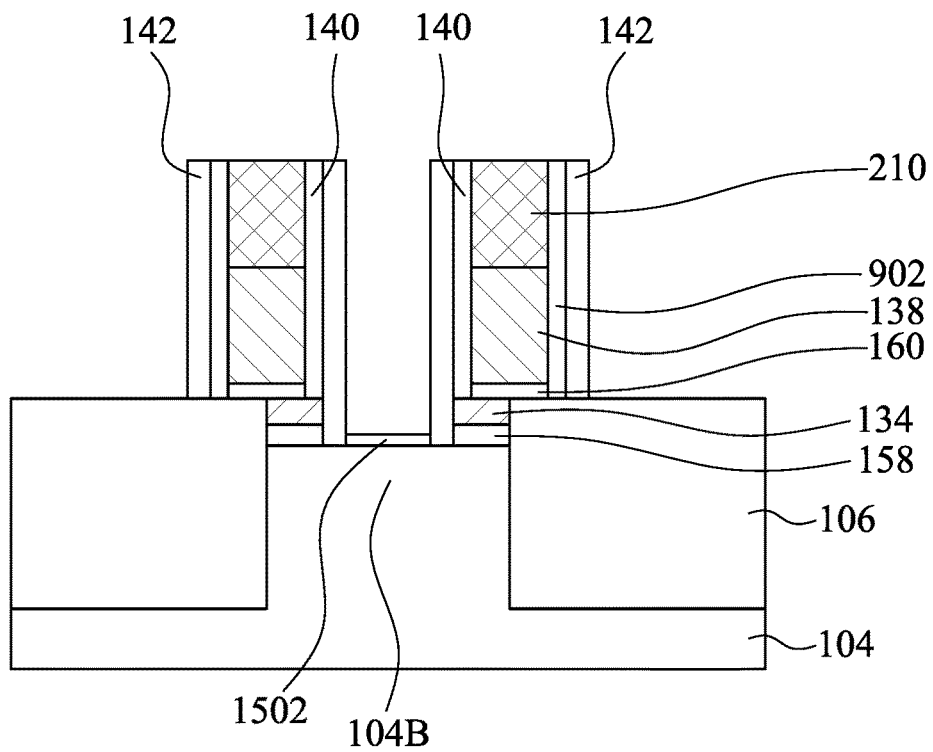
Figure 13D:
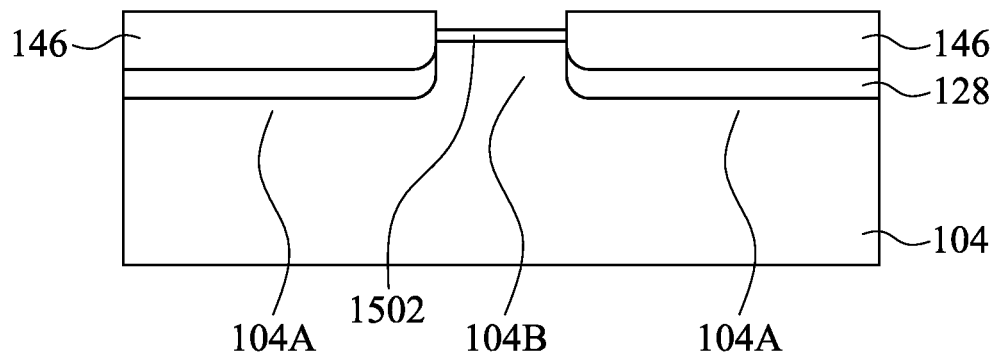

Reference is made to FIGS. 13A to 13D, in which FIG. 13A is a top view of a memory device after the process described in FIGS. 12A to 12D and has the same top view as FIG. 12A, FIG. 13B is a cross-sectional view along line B-B of FIG. 13A, FIG. 13C is a cross-sectional view along line C-C of FIG. 13A, and FIG. 13D is a cross-sectional view along line D-D of FIG. 13A. The patterned mask M2 is removed. A dielectric layer 1502 may then be selectively formed on the exposed surface of the substrate 104. For example, the dielectric layer 1502 covers the portions 104B of the substrate 104. The dielectric layer 1502 may be formed by HTO, ISSG oxidation, another suitable deposition or growth process(es), combination of the foregoing, or the like.

Figure 14A:
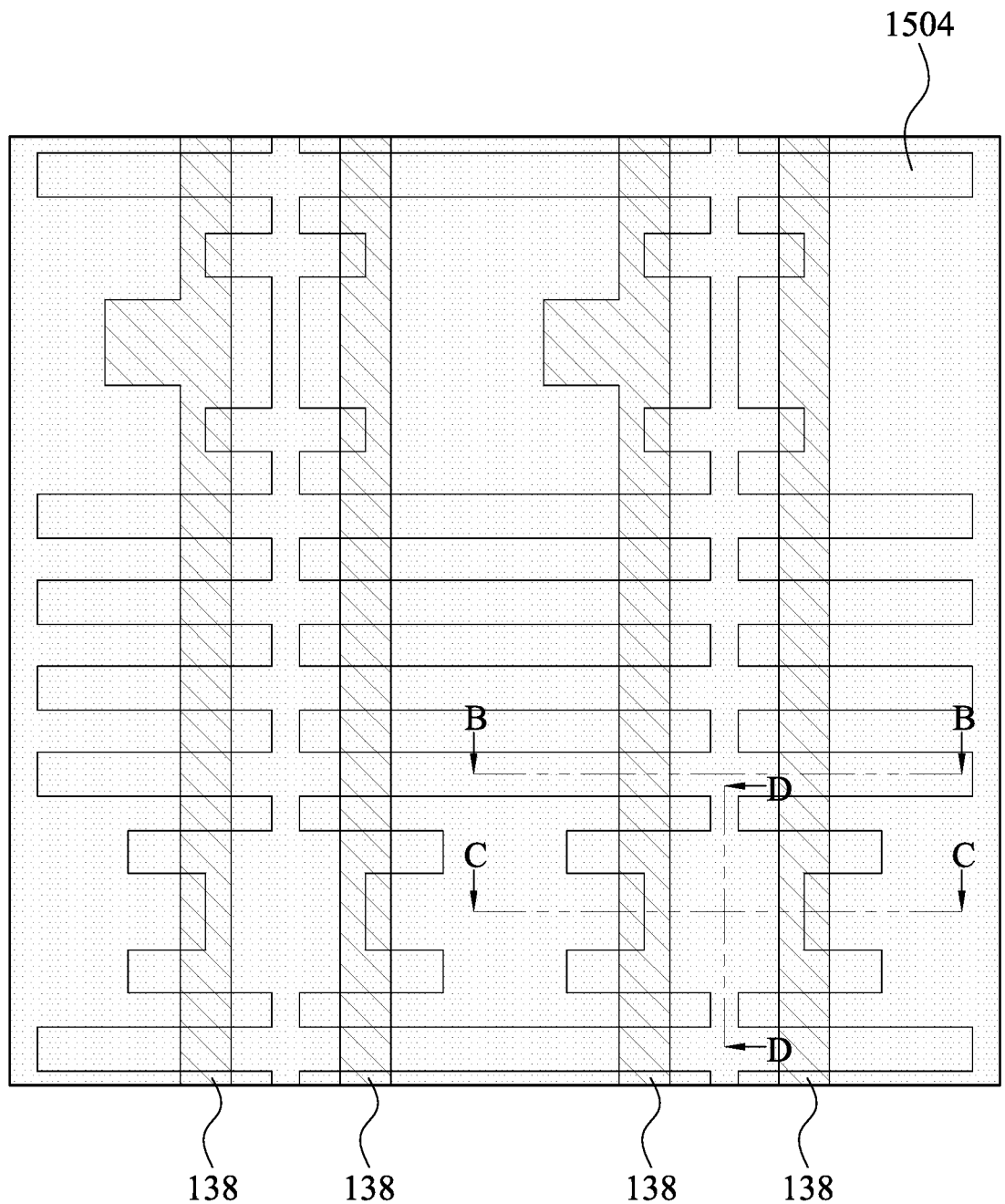
Figure 14B:
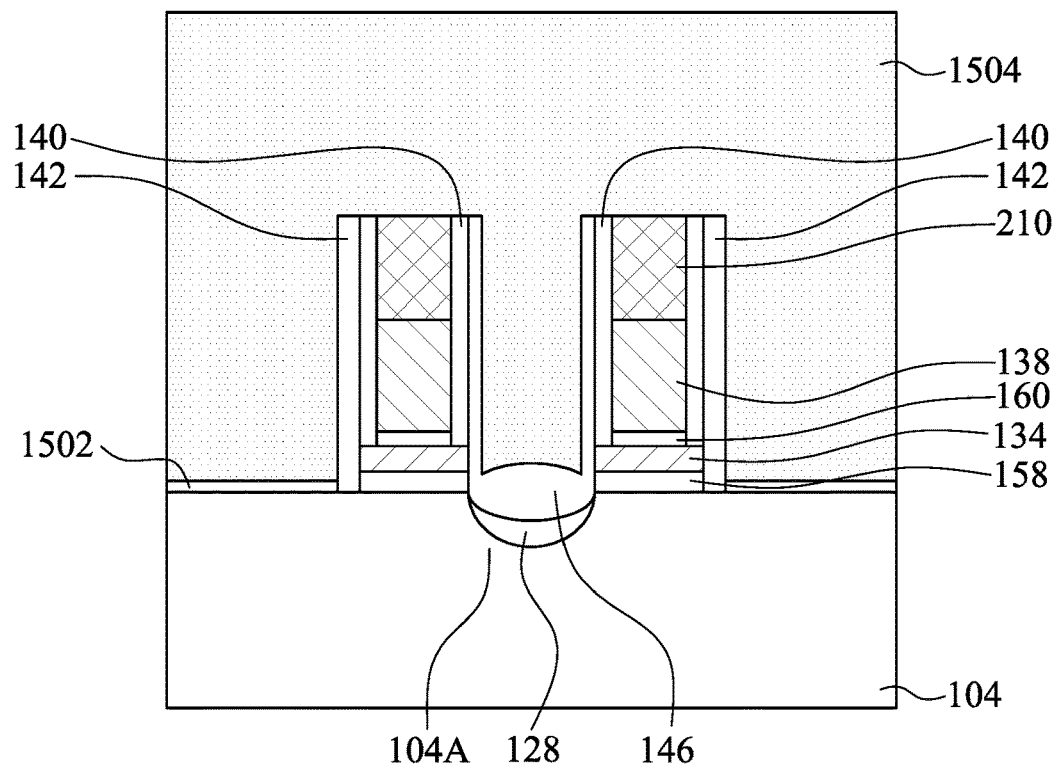
Figure 14C:
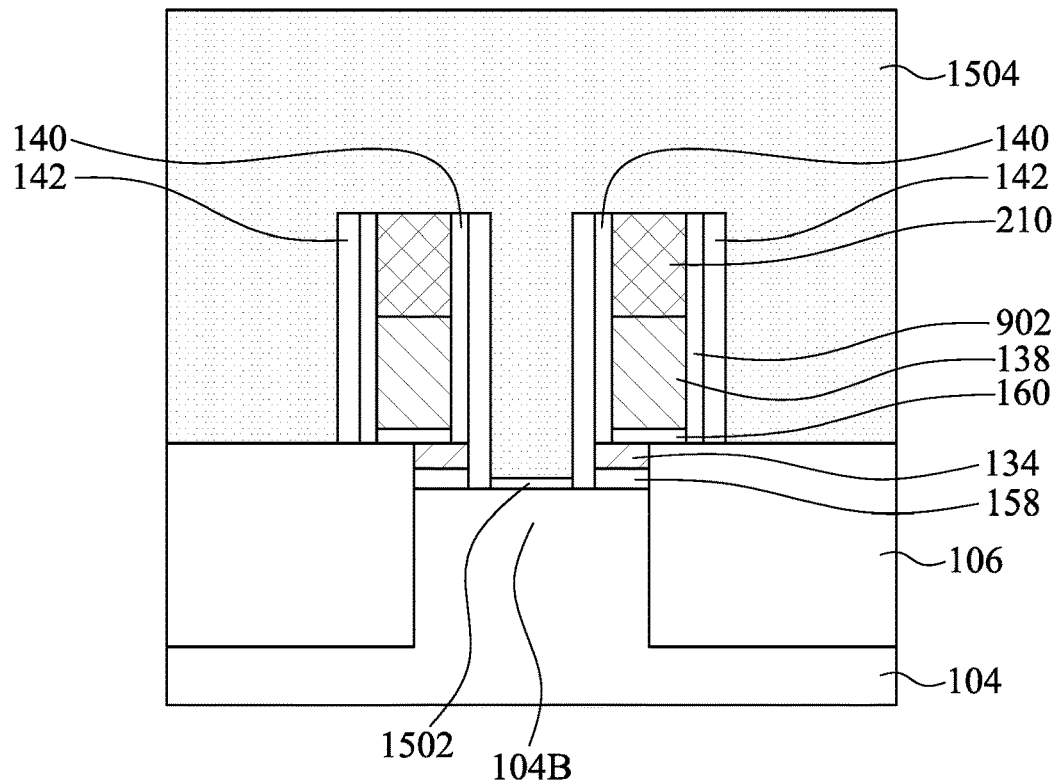
Figure 14D:
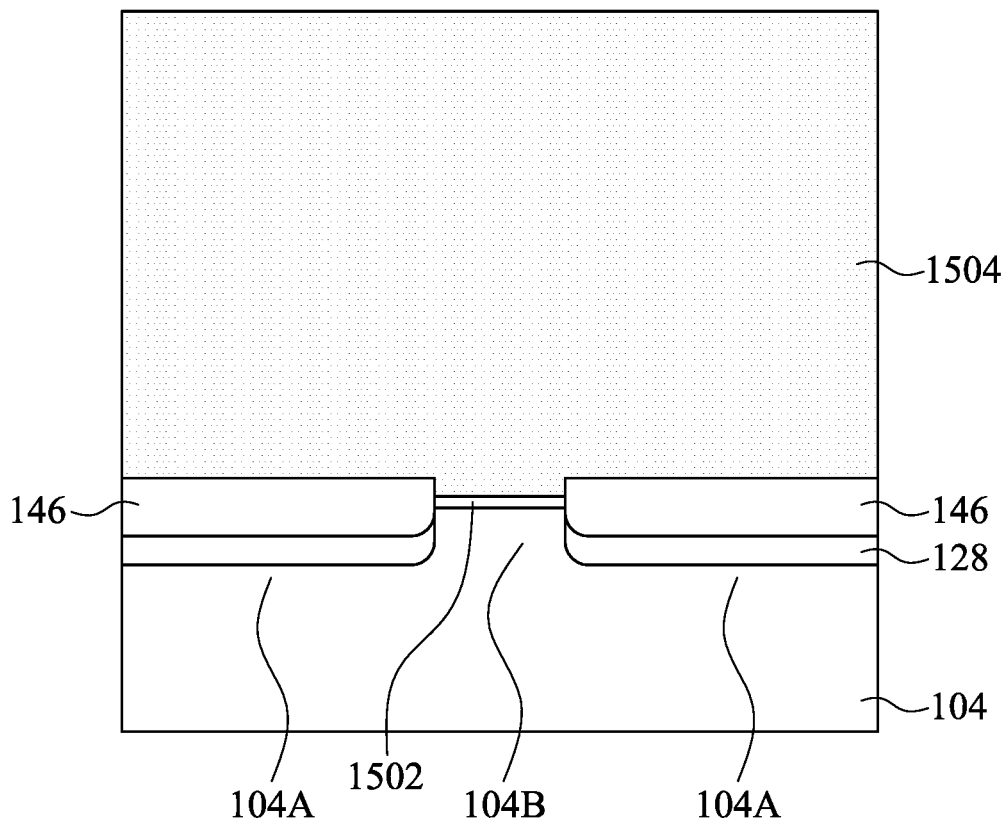

Reference is made to FIGS. 14A to 14D, in which FIG. 14A is a top view of a memory device after the process described in FIGS. 13A to 13D and has the same top view as FIG. 13A, FIG. 14B is a cross-sectional view along line B-B of FIG. 14A, FIG. 14C is a cross-sectional view along line C-C of FIG. 14A, and FIG. 14D is a cross-sectional view along line D-D of FIG. 14A. A gate layer 1504 may be formed over the substrate 104 and covers the dielectric layer 1502. The gate layer 1504 may be formed of doped polysilicon, metal, or another suitable conductive material(s) and may be formed by CVD, PVD, or another suitable deposition process(es).

Figure 15A:
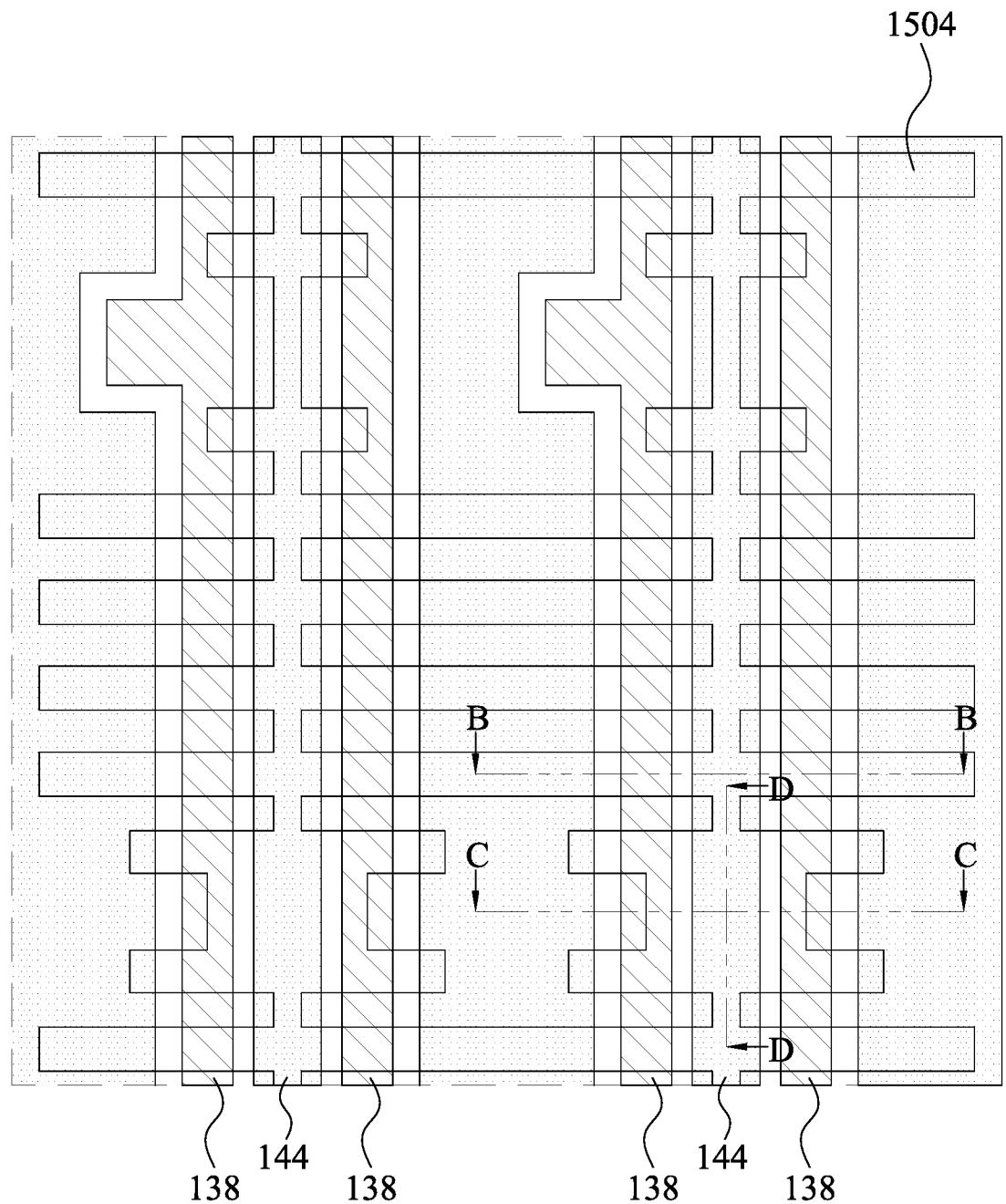
Figure 15B:
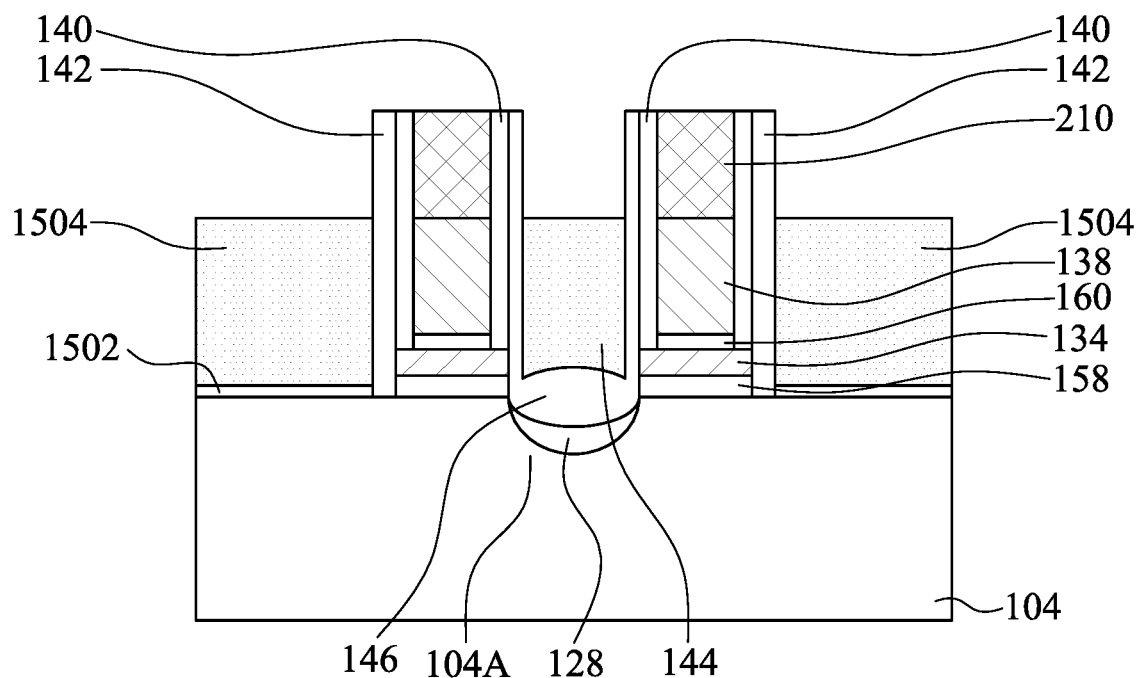
Figure 15C:
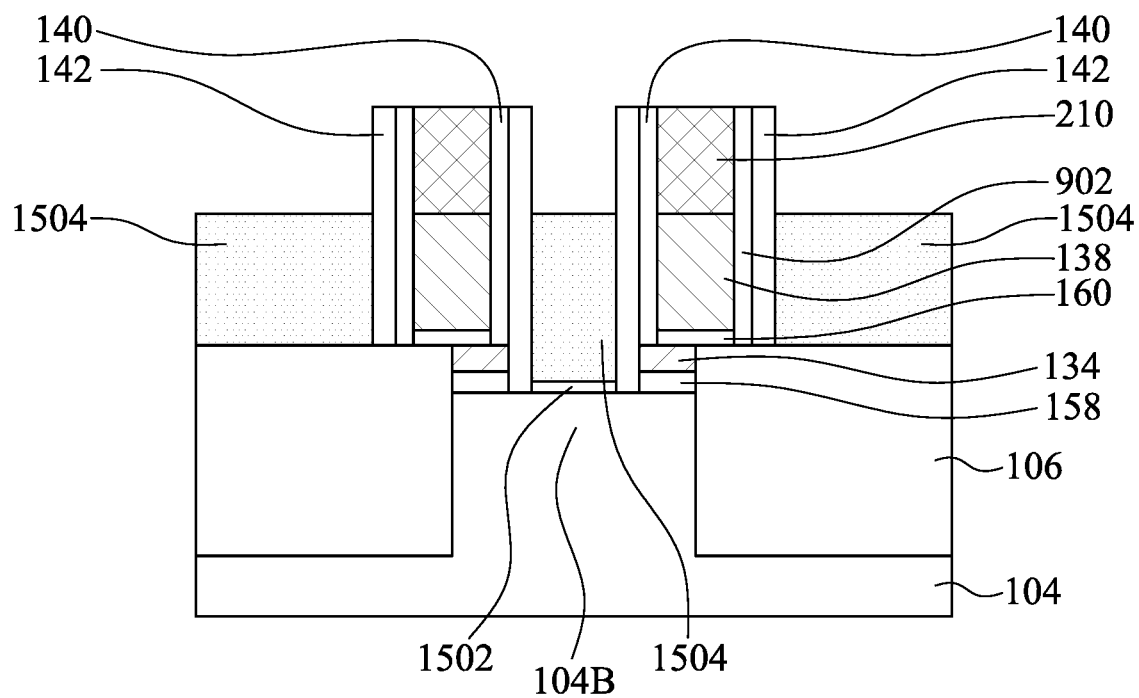
Figure 15D:
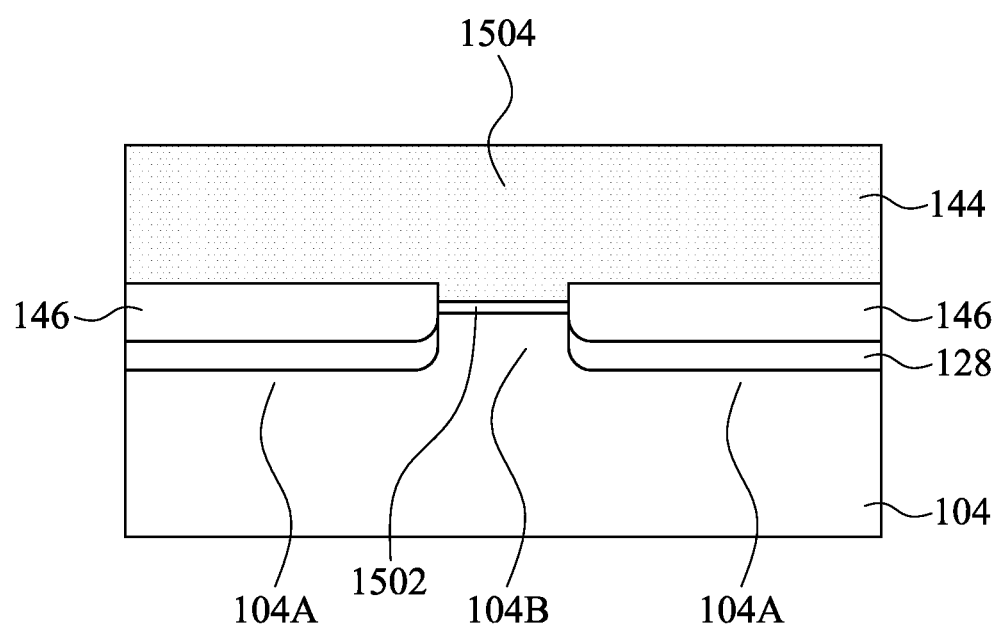

Reference is made to FIGS. 15A to 15D, in which FIG. 15A is a top view of a memory device after the process described in FIGS. 14A to 14D and has the same top view as FIG. 14A, FIG. 15B is a cross-sectional view along line B-B of FIG. 15A, FIG. 15C is a cross-sectional view along line C-C of FIG. 15A, and FIG. 15D is a cross-sectional view along line D-D of FIG. 15A. The gate layer 1504 is etched back until the top surface of the gate layer 1504 is lower than the top surfaces of the control gate hard masks 210. In some embodiments, the top surface of the gate layer 1504 is substantially level with the top surfaces of the control gate electrodes 138. In some embodiments, the etching process leaves the recessed gate layer 1504 with a substantially planar surface. Dopants may be implanted into the gate layer 1504 after the etching process followed by an annealing process to activate the dopants. In some embodiments, the remaining portions of the gate layer 1504 over the erase gate dielectrics 146 are referred to as erase gate electrodes 144.

Figure 16A:
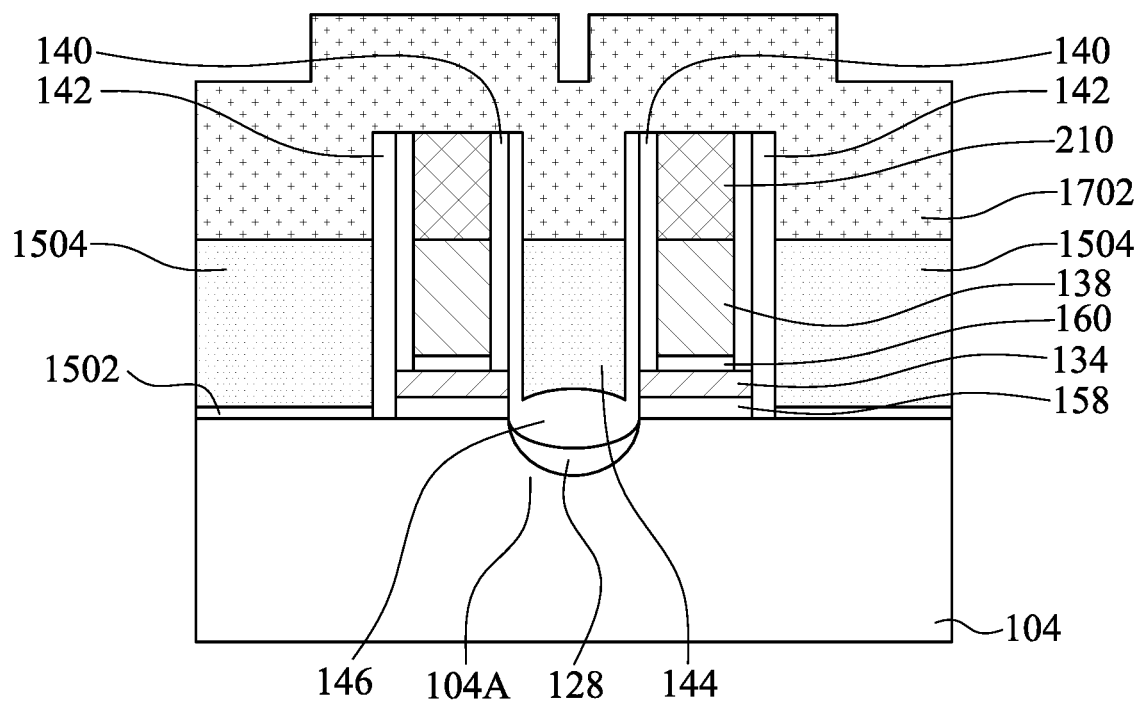
Figure 16B:
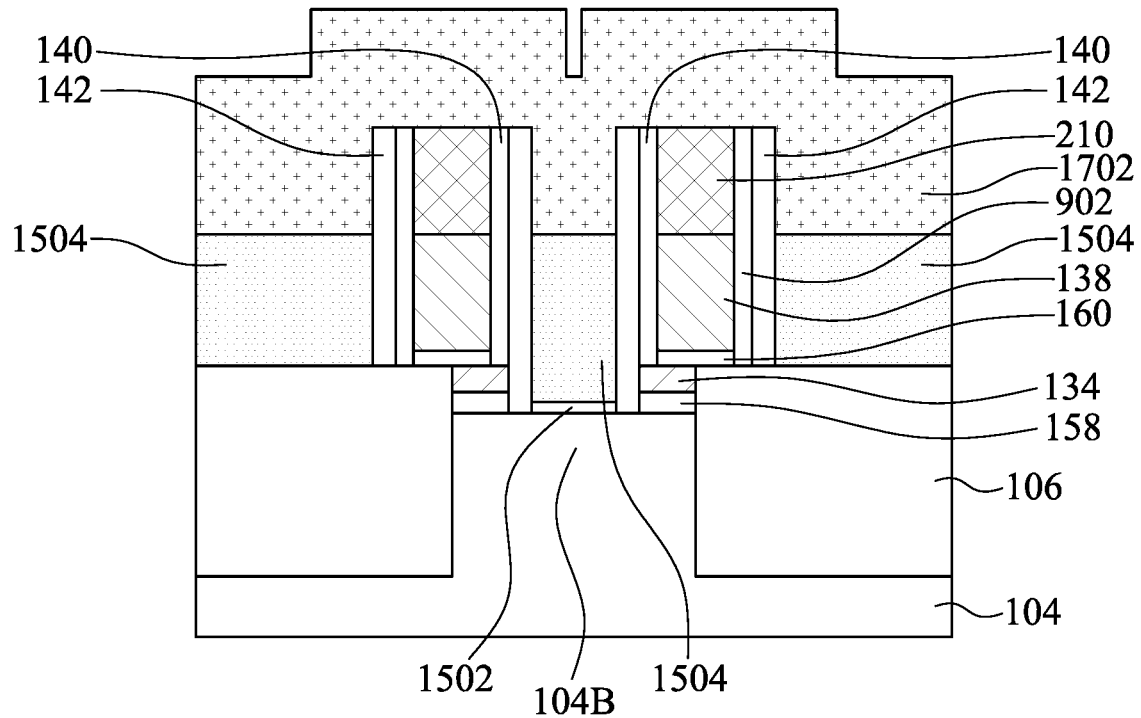
Figure 16C:
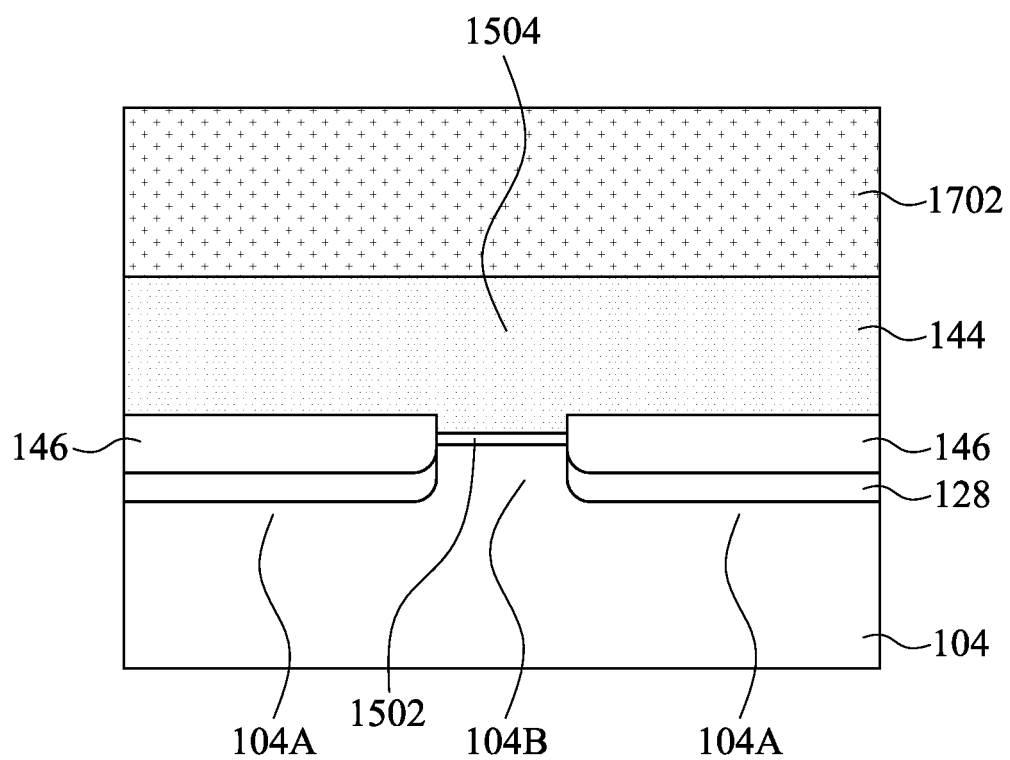

Reference is made to FIGS. 16A to 16C, in which FIGS. 16A to 16C have the same cross sectional views as FIGS. 15B to 15D, respectively. A hard mask layer 1702 is formed conformally over the substrate 104. The hard mask layer 1702 may be formed by CVD, PVD, or another suitable deposition process(es).

Figure 17A:
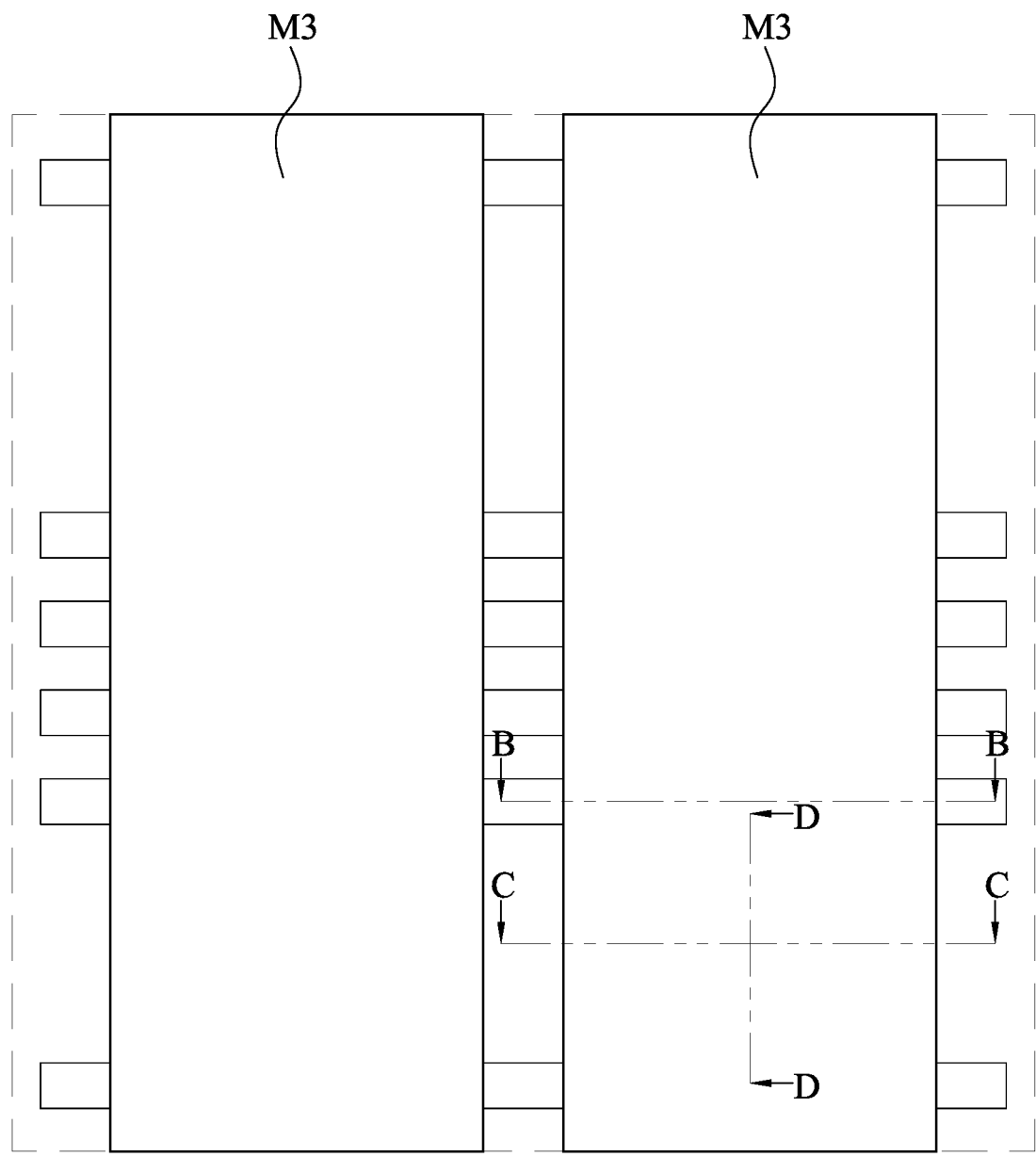
Figure 17B:
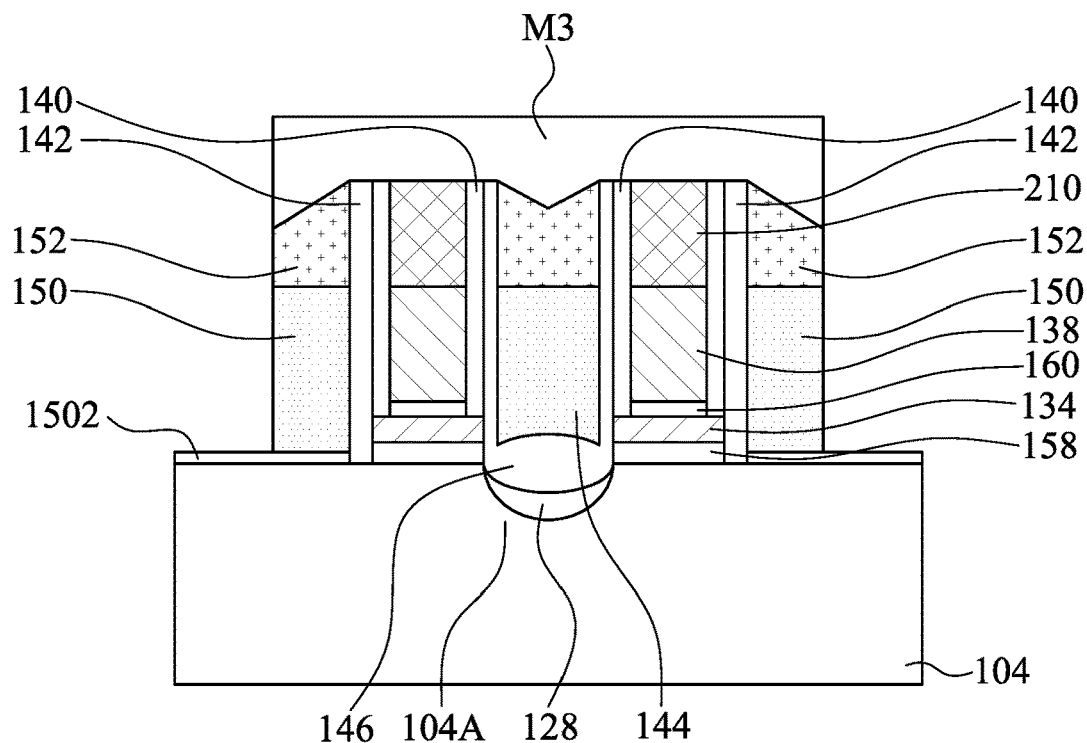
Figure 17C:
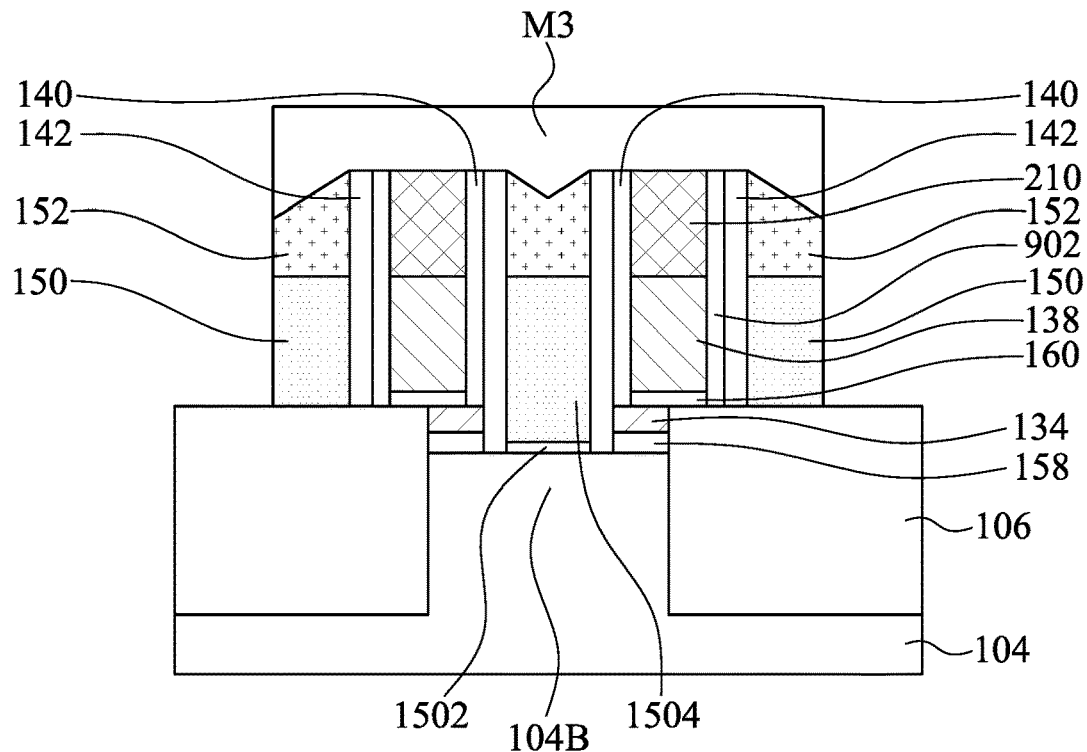
Figure 17D:
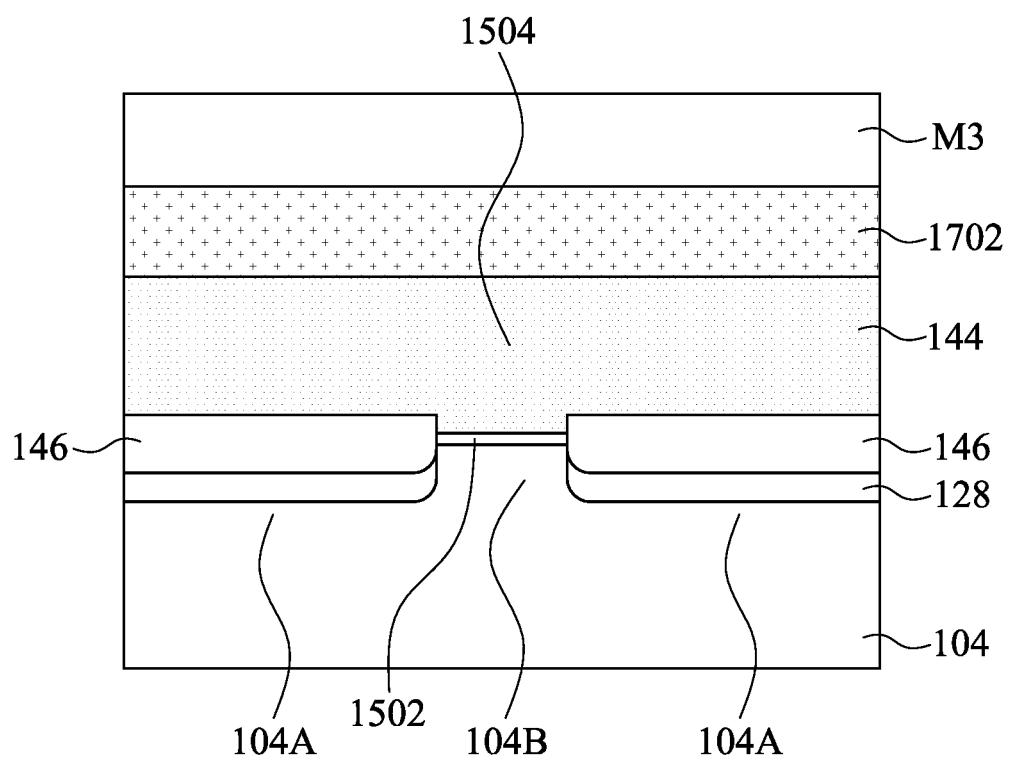

Reference is made to FIGS. 17A to 17D, in which FIG. 17A is a top view of a memory device after the process described in FIGS. 16A to 16C and has the same top view as FIG. 15A, FIG. 17B is a cross-sectional view along line B-B of FIG. 17A, FIG. 17C is a cross-sectional view along line C-C of FIG. 17A, and FIG. 17D is a cross-sectional view along line D-D of FIG. 17A. A patterned mask M3 is formed over the substrate 104. An etching process is then perform to pattern the hard mask layer 1702 and the gate layer 1504 (see FIGS. 16A to 16C) via the patterned mask M3 to form select gate electrodes 150. In some embodiments, the patterned mask M3 may be photoresist.

Figure 18A:
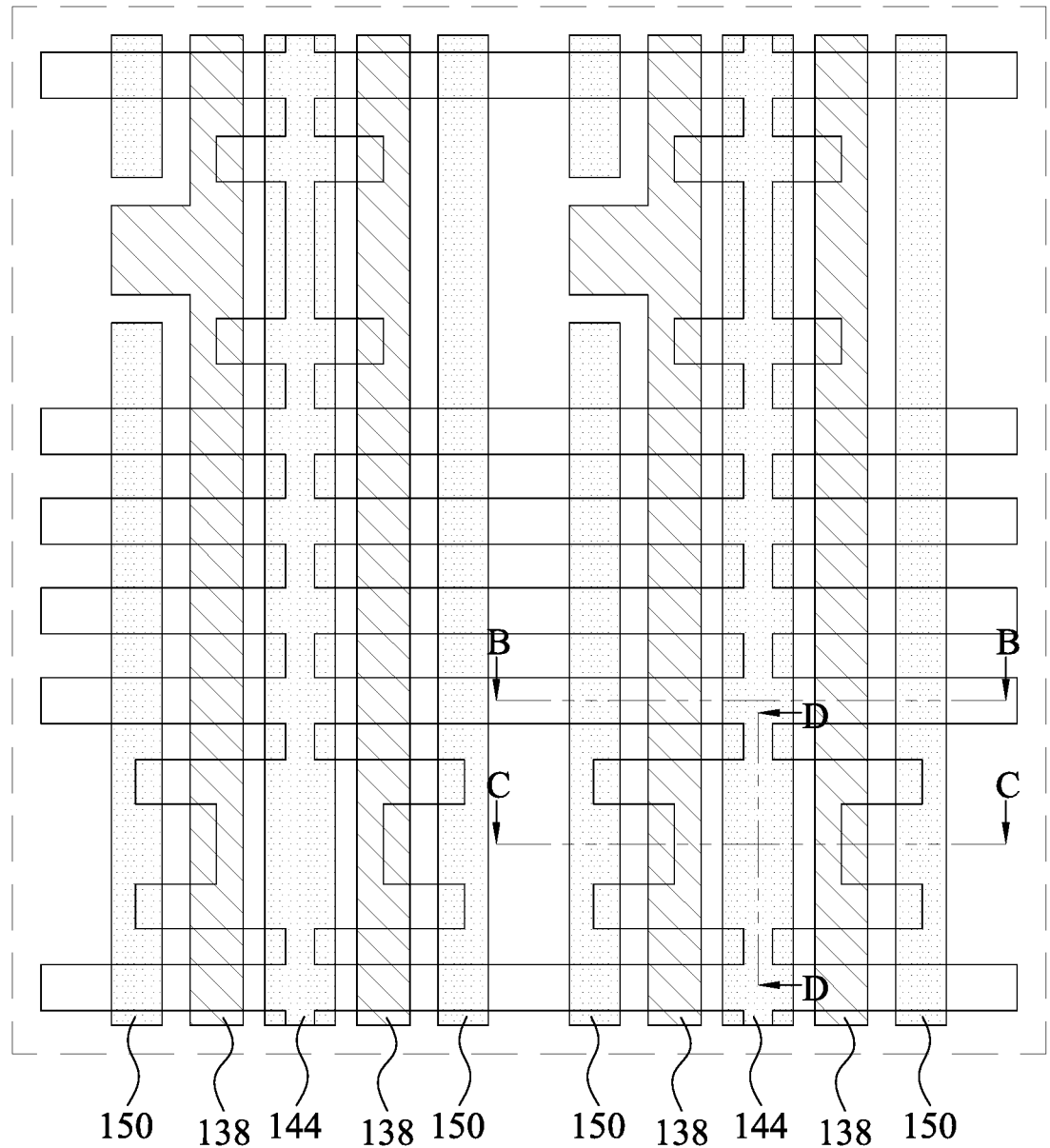
Figure 18B:
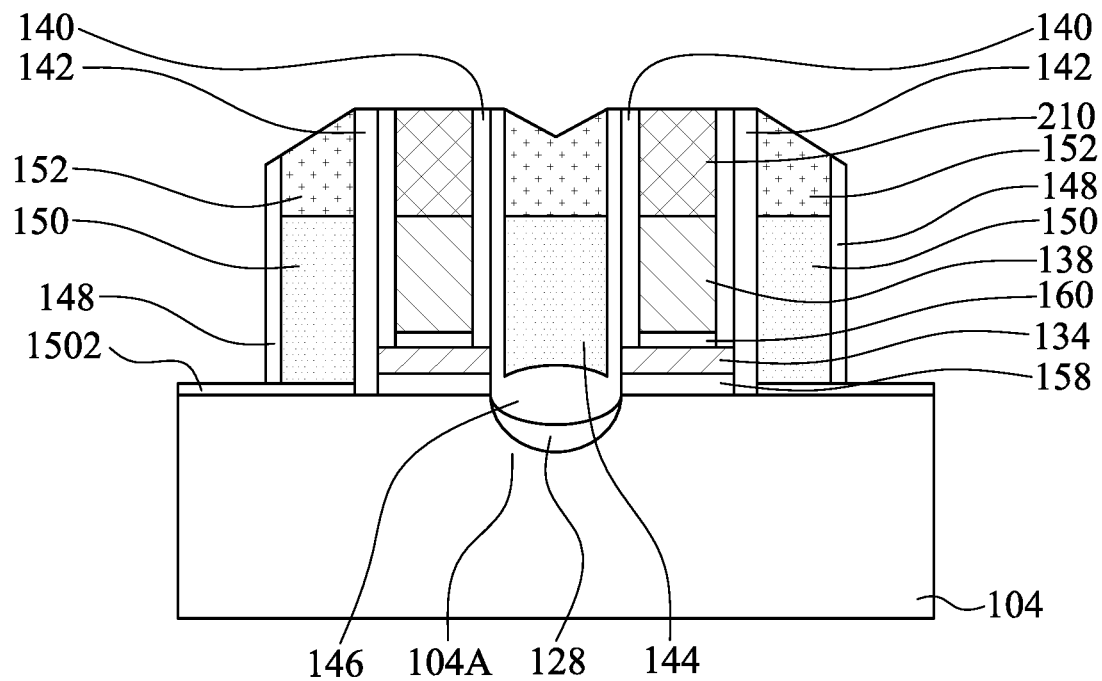
Figure 18C:
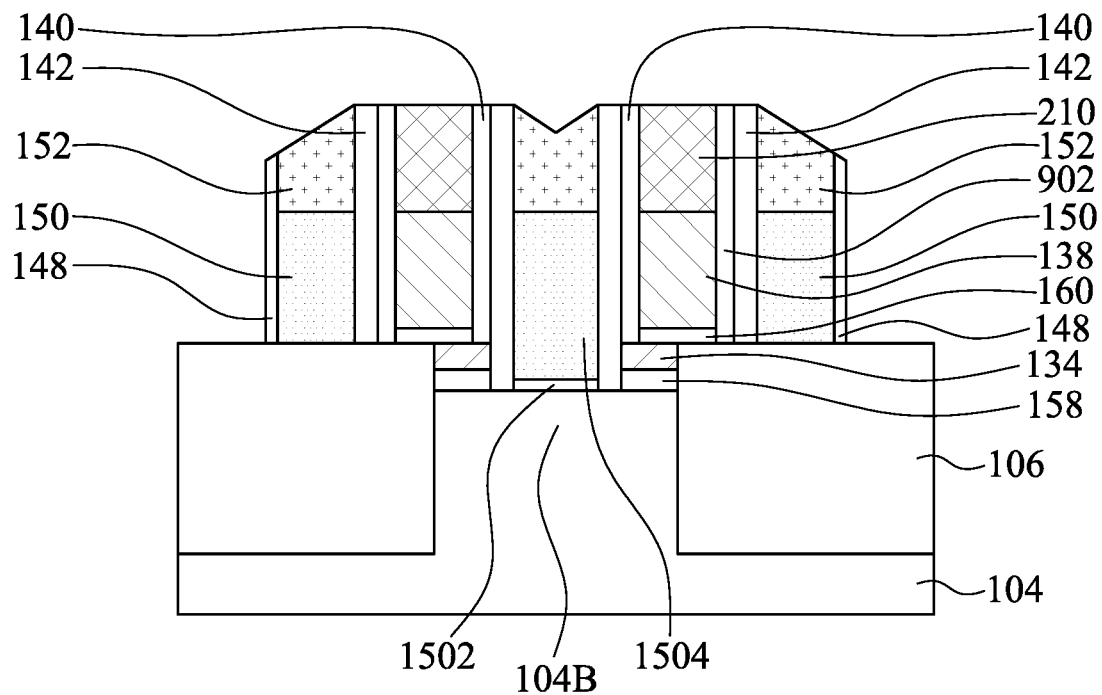
Figure 18D:
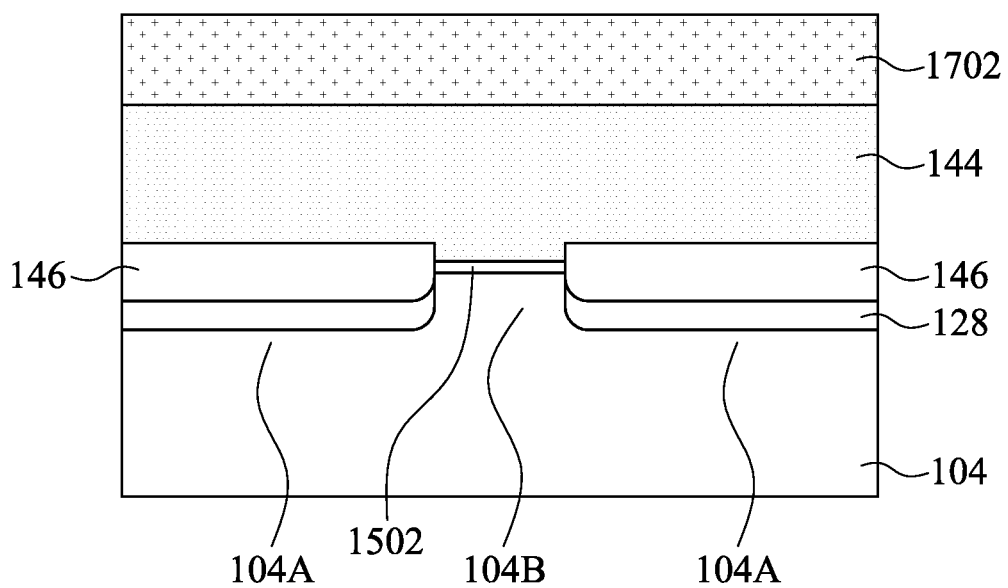

Reference is made to FIGS. 18A to 18D, in which FIG. 18A is a top view of a memory device after the process described in FIGS. 17A to 17D and has the same top view as FIG. 17A, FIG. 18B is a cross-sectional view along line B-B of FIG. 18A, FIG. 18C is a cross-sectional view along line C-C of FIG. 18A, and FIG. 18D is a cross-sectional view along line D-D of FIG. 18A. The patterned mask M3 (see FIGS. 17A to 17D) is removed. In some embodiments, the patterned mask M3 may be removed by suitable process, such as stripping. Select gate spacers 148 are formed along outer sidewalls of select gate electrodes 150. The select gate spacers 148 may be formed by depositing the spacer material followed by etching to remove the spacer material from where it is thinnest. The spacer material may be deposited conformally by CVD, PVD, another suitable deposition process(es), combination of the foregoing, or the like.

Figure 19A:
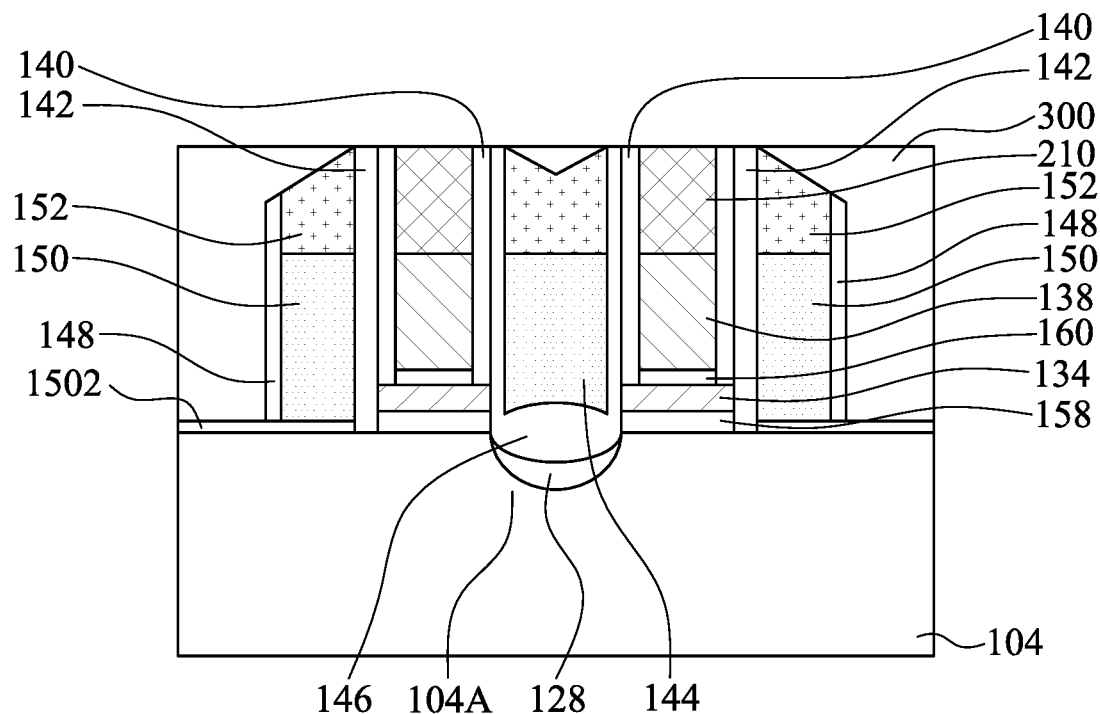
Figure 19B:
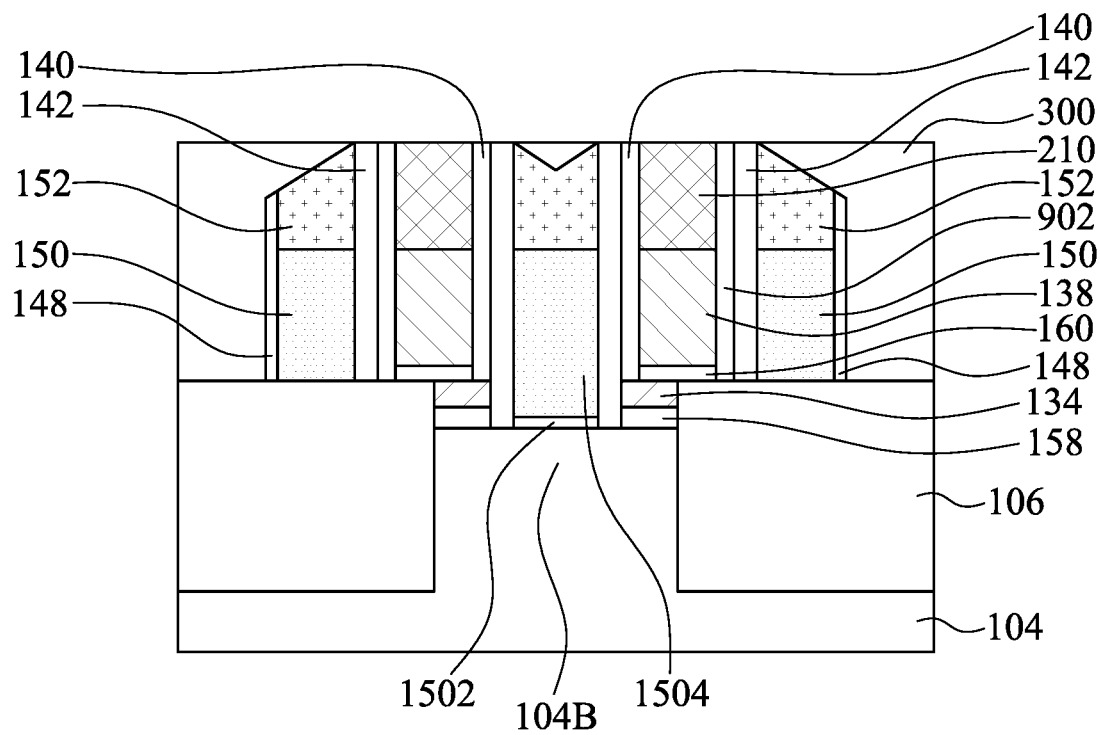
Figure 19C:
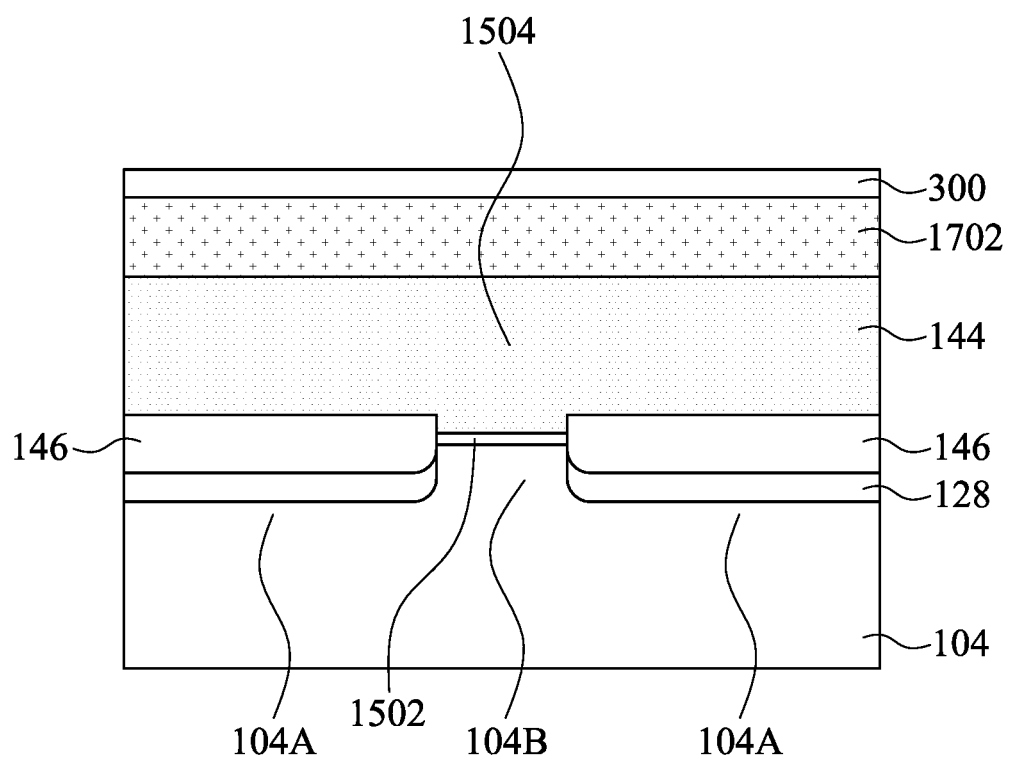

Reference is made to FIGS. 19A to 19C, in which FIGS. 19A to 19C have the same cross sectional views as FIGS. 18B to 18D, respectively. A hard mask 300 is formed over the substrate 104 and adjacent to the select gate spacers 148. In some embodiments, the hard mask 300 may be formed with a top surface that is planarized. A process of forming the hard mask 300 may include spinning on an organic ARC (anti-reflective coating) coating.

Figure 20A:
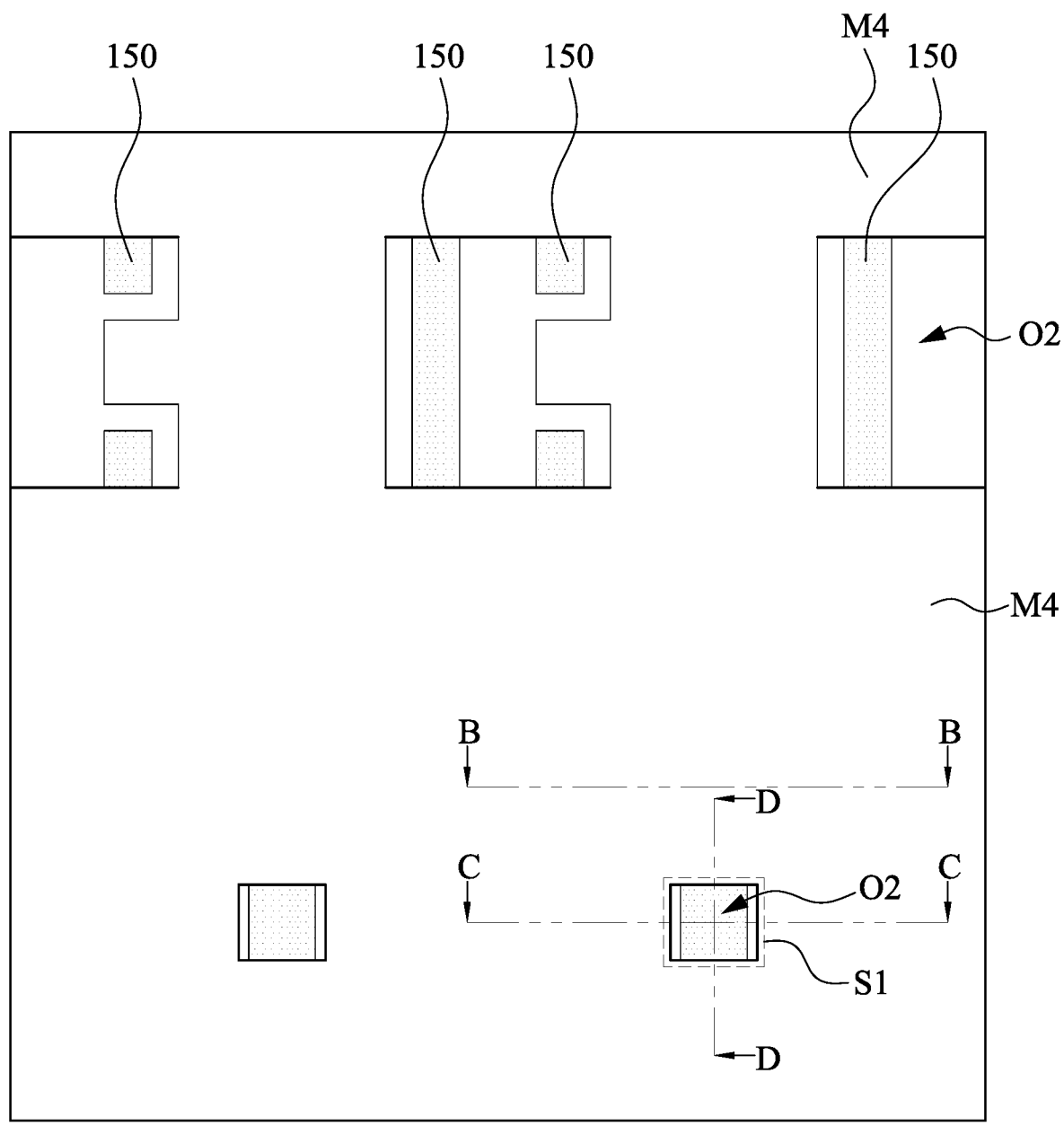
Figure 20B:
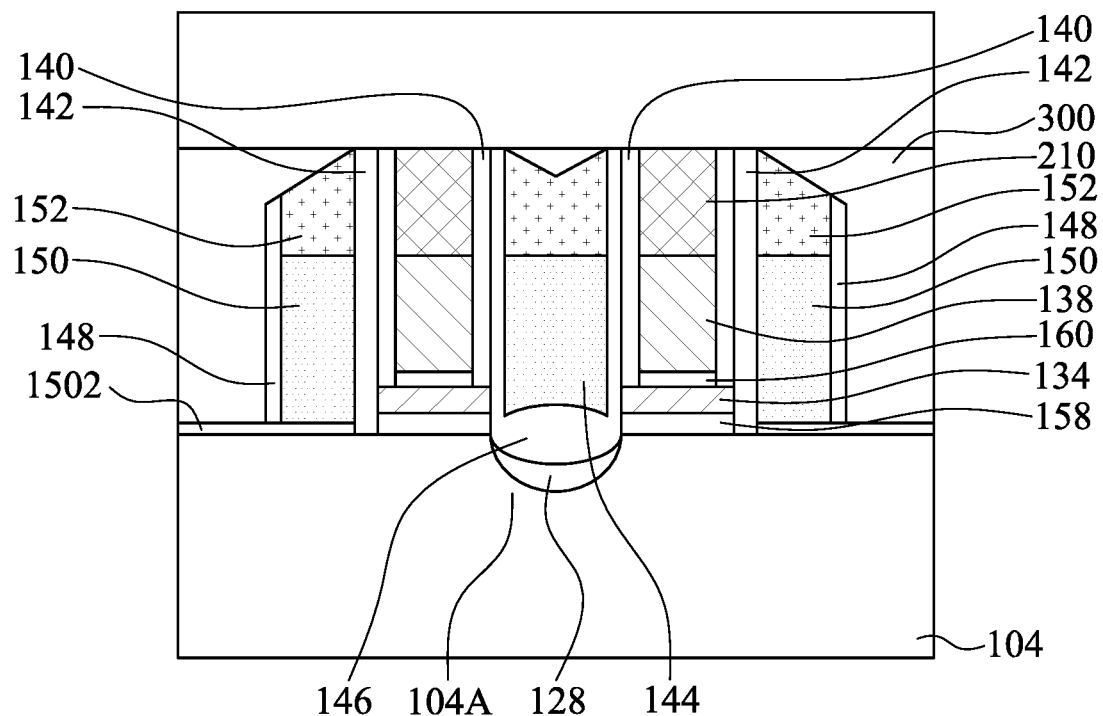
Figure 20C:
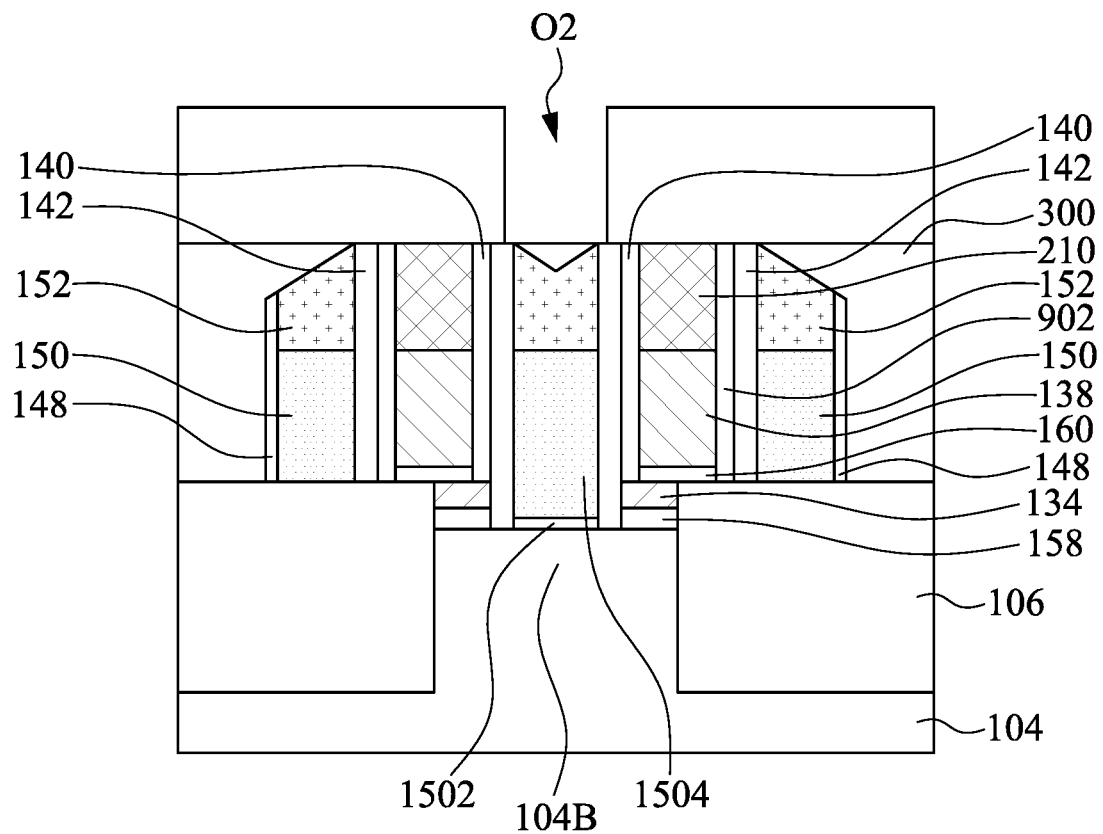
Figure 20D:
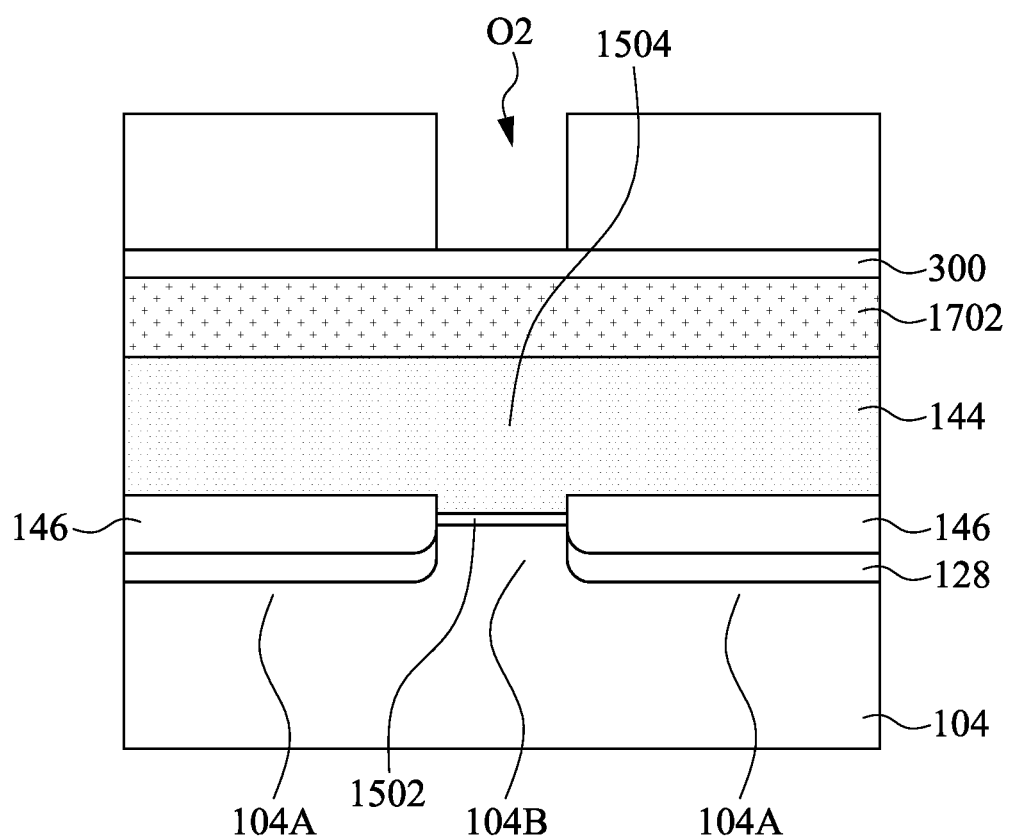

Reference is made to FIGS. 20A to 20D, in which FIG. 20A is a top view of a memory device after the process described in FIGS. 19A to 19C and has the same top view as FIG. 18A, FIG. 20B is a cross-sectional view along line B-B of FIG. 20A, FIG. 20C is a cross-sectional view along line C-C of FIG. 20A, and FIG. 20D is a cross-sectional view along line D-D of FIG. 20A. A patterned mask M4 is formed over the substrate 104. In some embodiments, the patterned mask M4 has openings O2 that expose regions over the portions 104B of the substrate 104. For example, portions of the gate layer 1504 above the portion 104B of the substrate 104 are exposed by the openings O2 of the patterned mask M4. On the other hand, portions of the select gate electrodes 150 are exposed by the patterned mask M4, as shown in FIG. 20A. In some embodiments, the patterned mask M4 is photoresist.

Figure 21A:
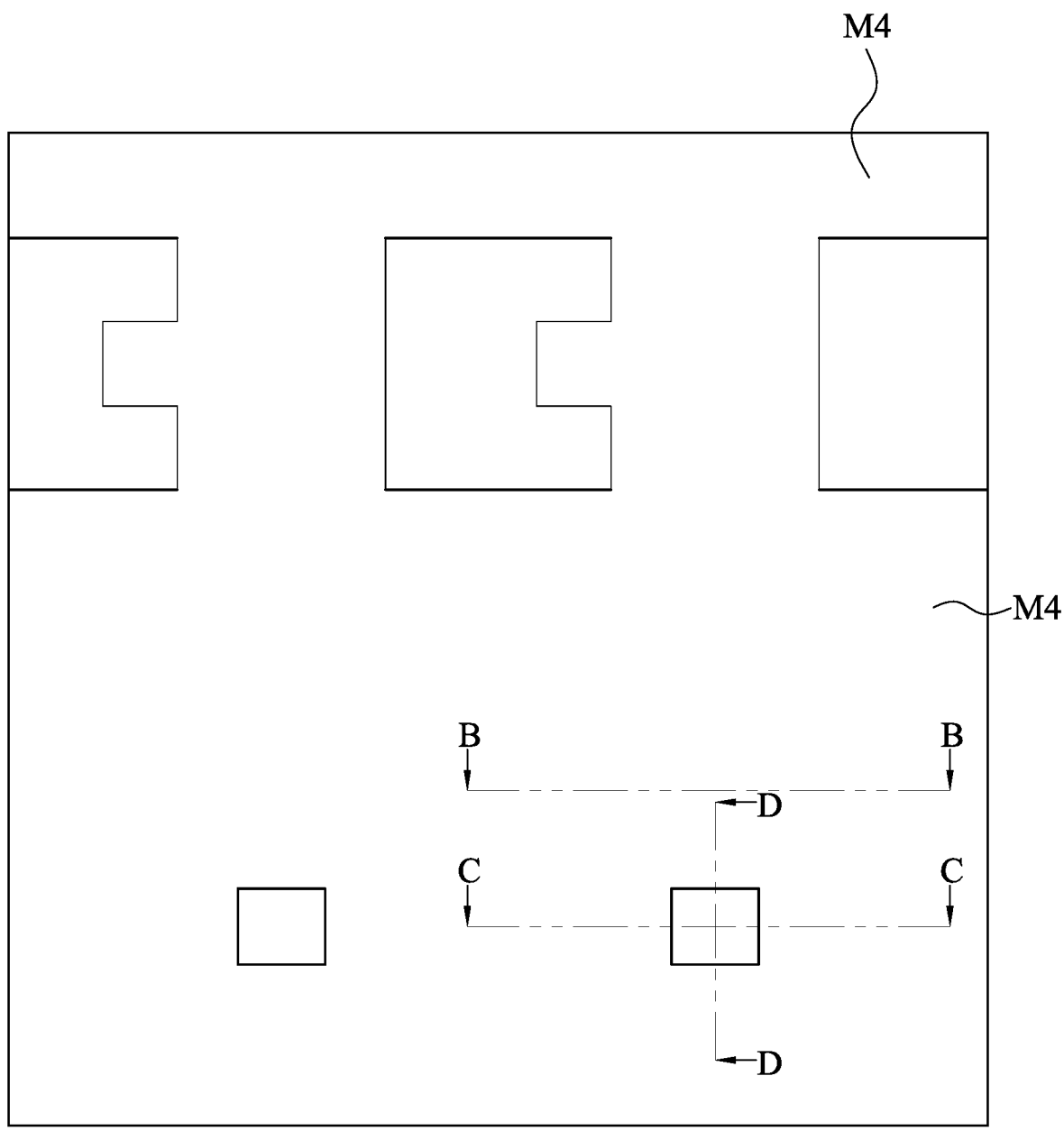
Figure 21B:
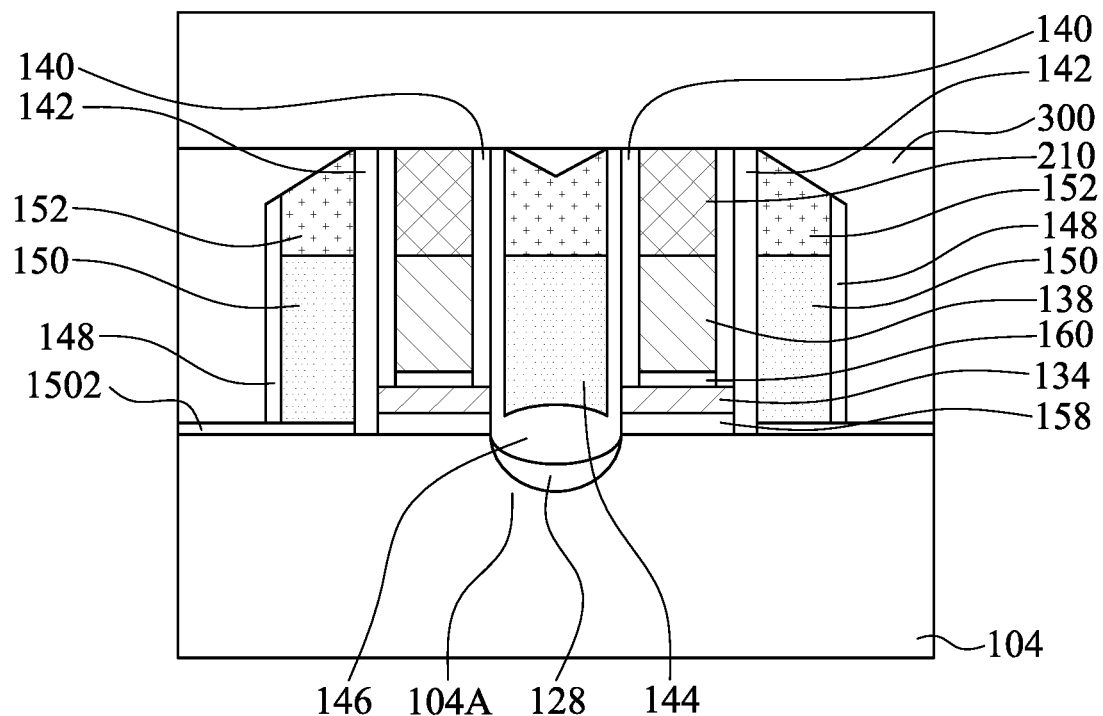
Figure 21C:
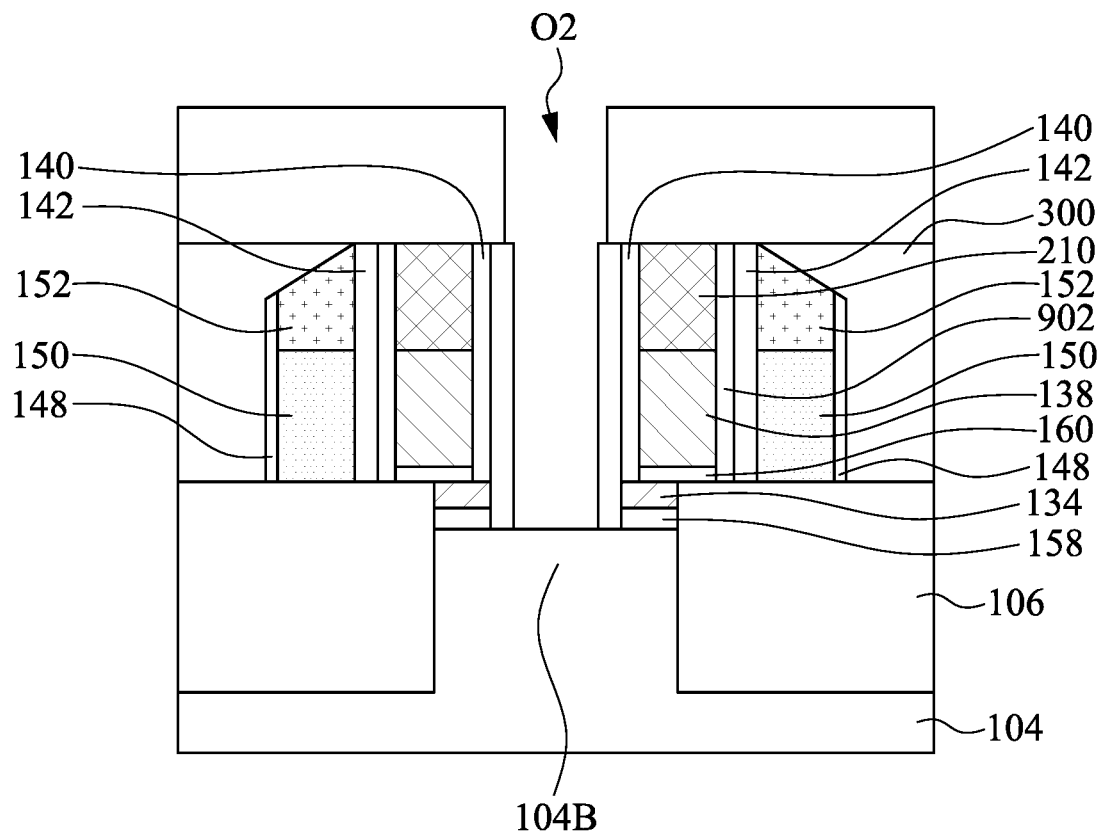
Figure 21D:
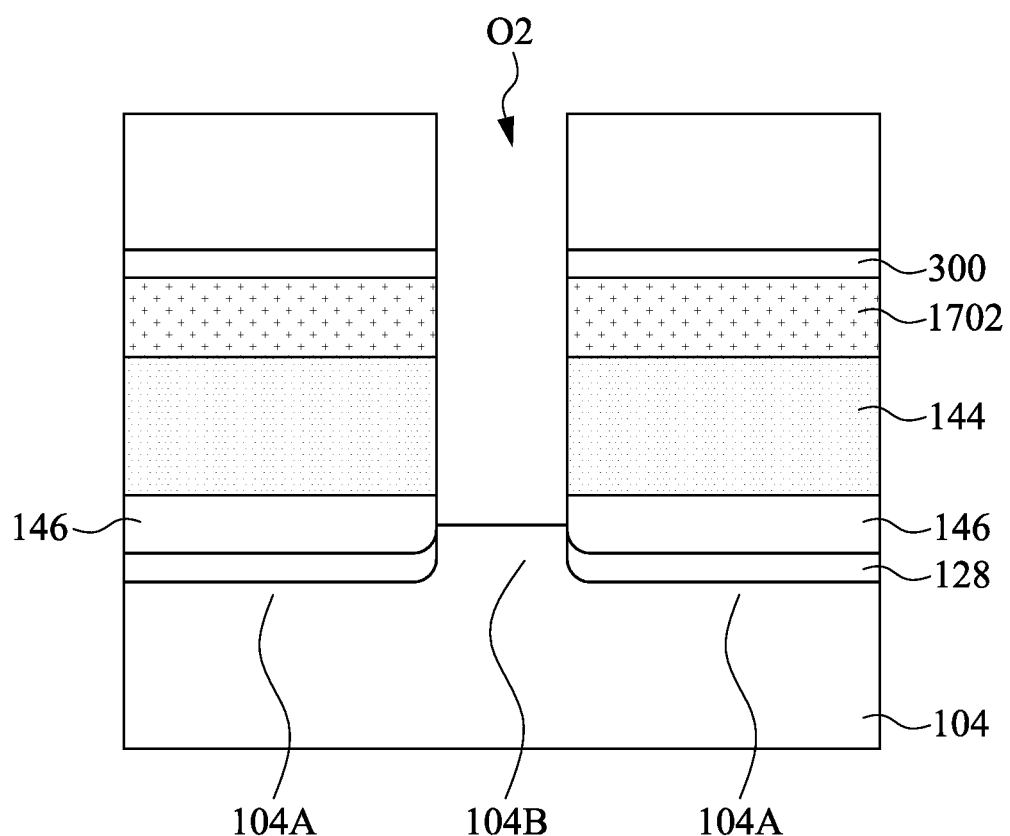

Reference is made to FIGS. 21A to 21D, in which FIG. 21A is a top view of a memory device after the process described in FIGS. 20A to 20D and has the same top view as FIG. 20A, FIG. 21B is a cross-sectional view along line B-B of FIG. 21A, FIG. 21C is a cross-sectional view along line C-C of FIG. 21A, and FIG. 21D is a cross-sectional view along line D-D of FIG. 21A. An etching process is performed to remove the portions of the gate layer 1504 above the portion 104B of the substrate 104 via the openings O2. As a result, the portion 104B of the substrate 104 is exposed via the opening O2 of the patterned mask M4. On the other hand, the portions of the select gate electrodes 150 exposed by the patterned mask M4 are removed, as shown in FIG. 21A.

Figure 22A:
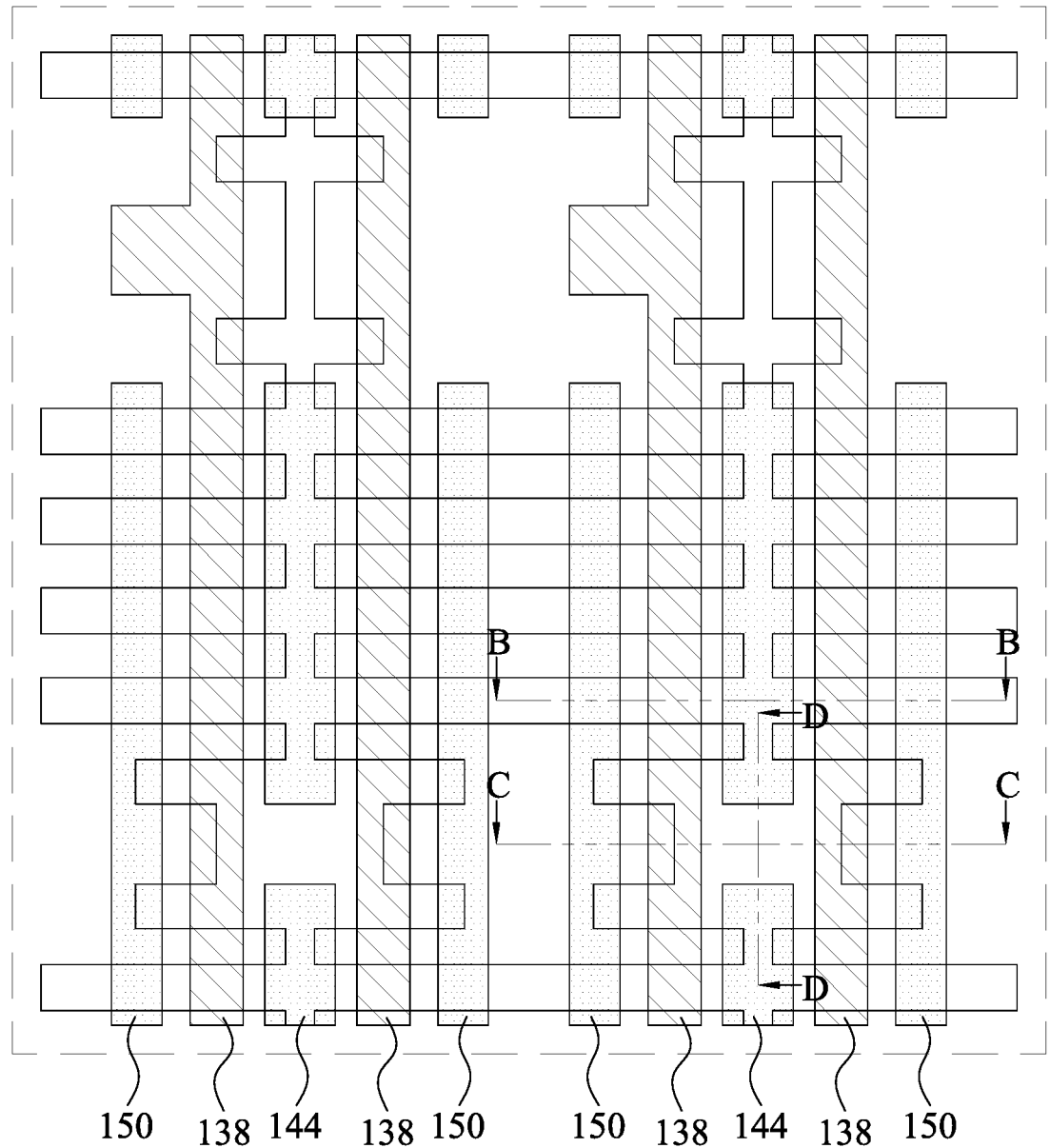
Figure 22B:
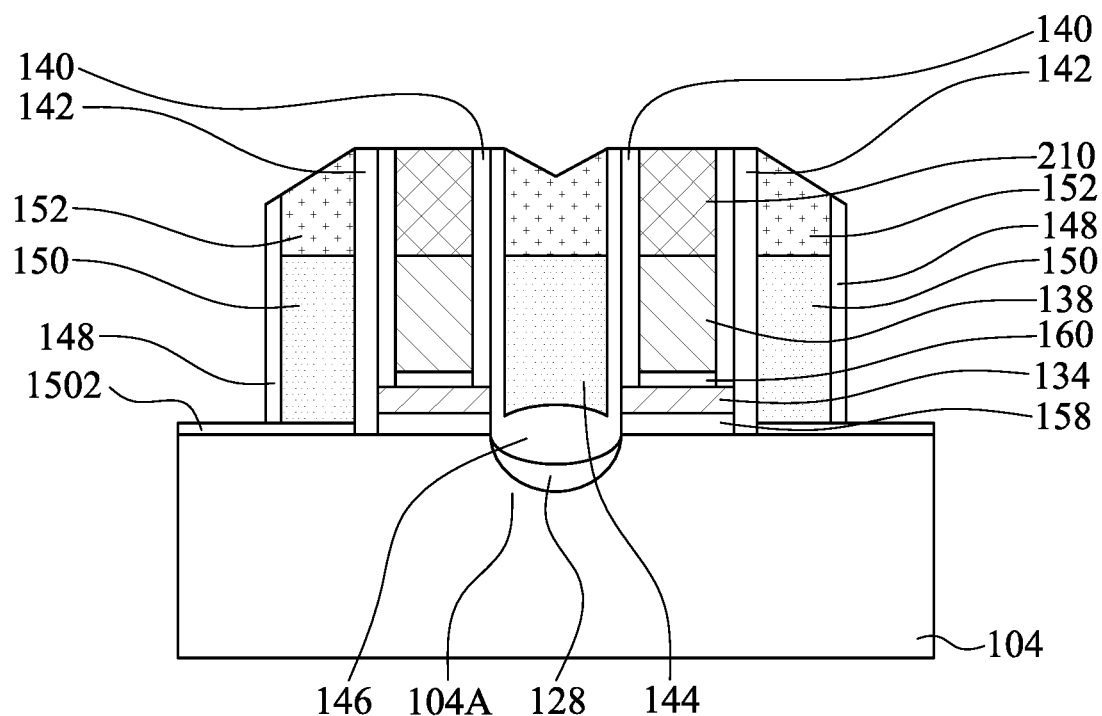
Figure 22C:
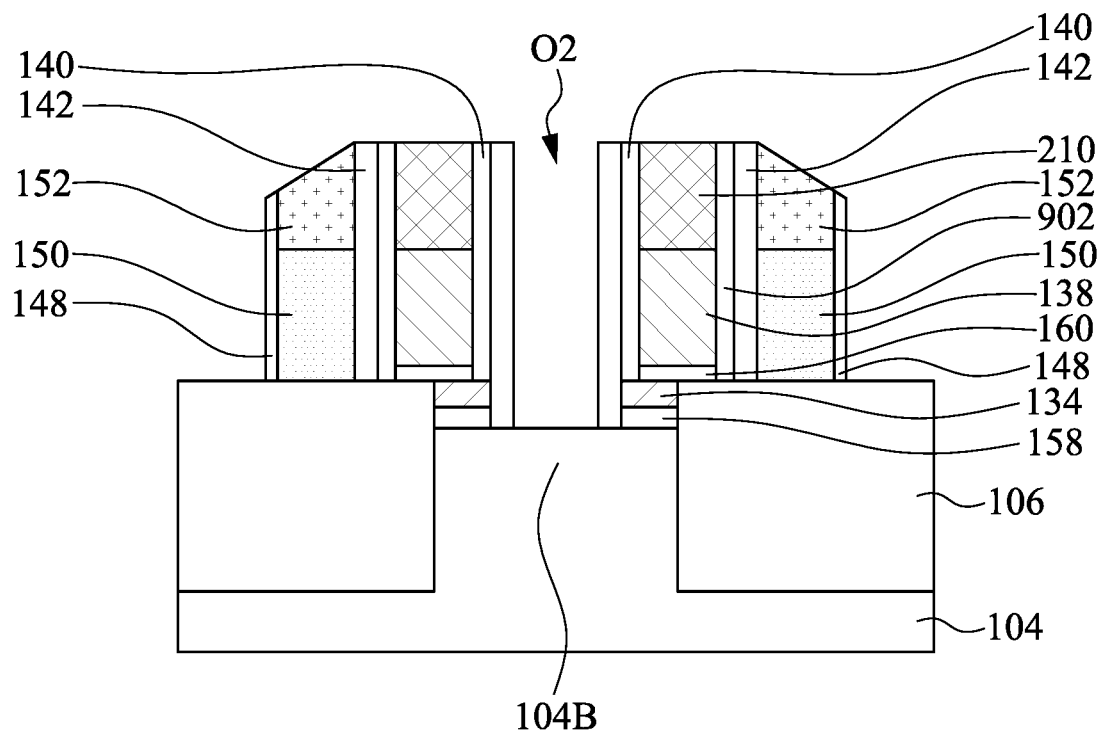
Figure 22D:
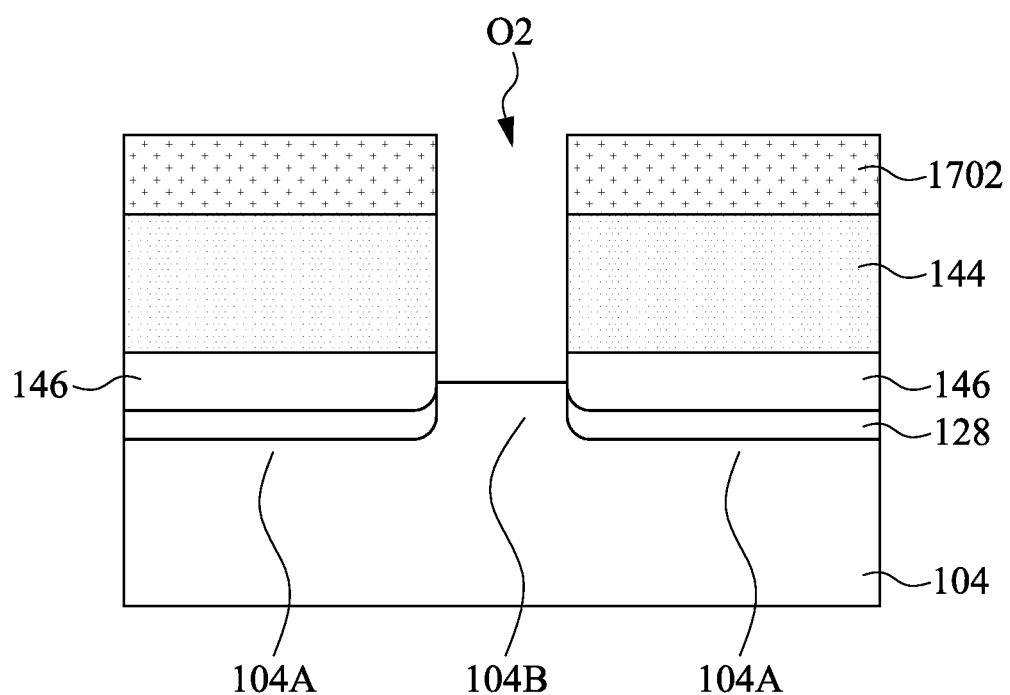

Reference is made to FIGS. 22A to 22D, in which FIG. 22A is a top view of a memory device after the process described in FIGS. 21A to 21D and has the same top view as FIG. 21A, FIG. 22B is a cross-sectional view along line B-B of FIG. 22A, FIG. 22C is a cross-sectional view along line C-C of FIG. 22A, and FIG. 22D is a cross-sectional view along line D-D of FIG. 22A. The patterned mask M4 is removed by suitable process, such as stripping. Then, the hard mask 300 is removed. In some embodiments, the hard mask 300 may be removed by suitable etching process.

Figure 23A:
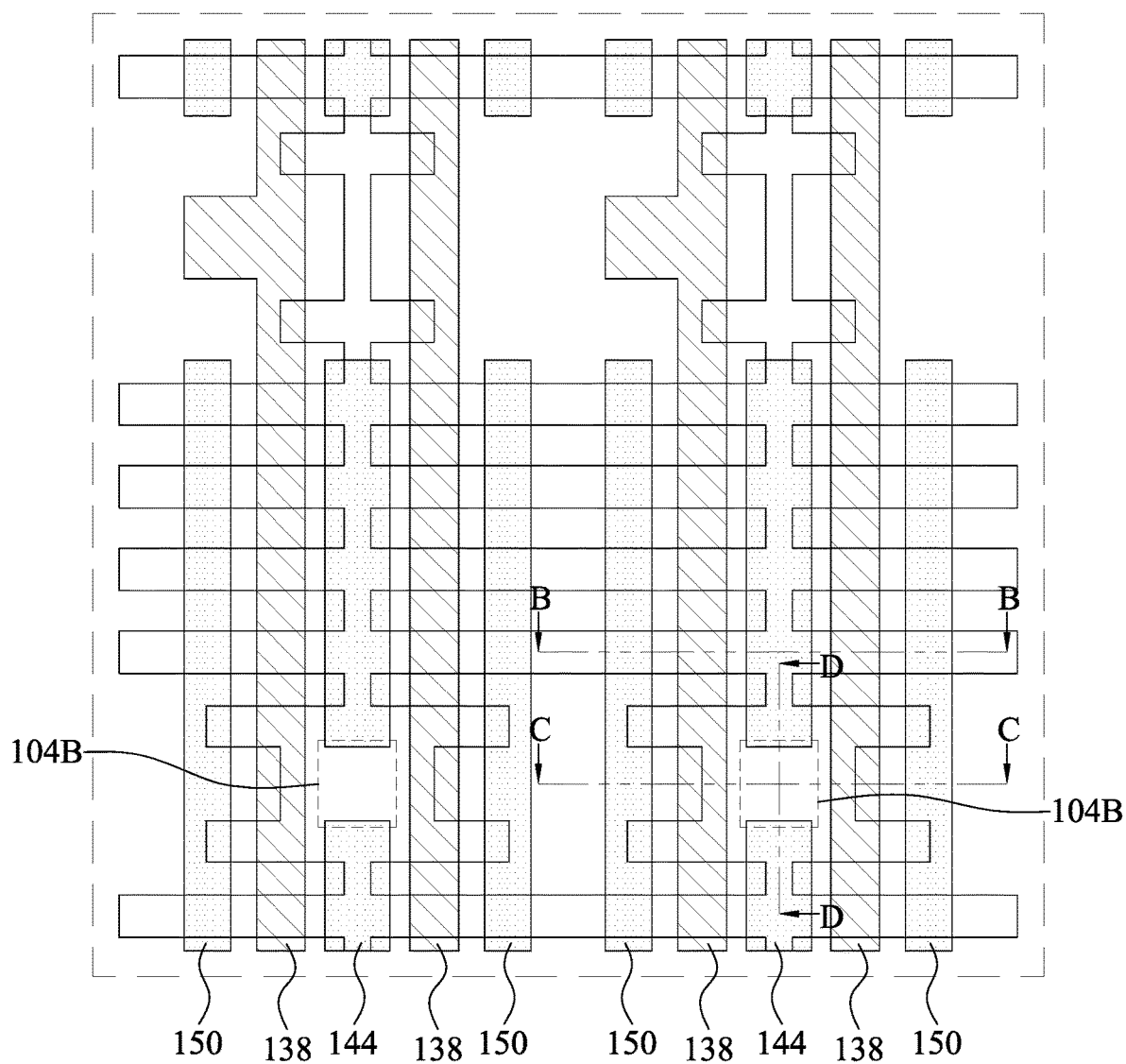
Figure 23B:
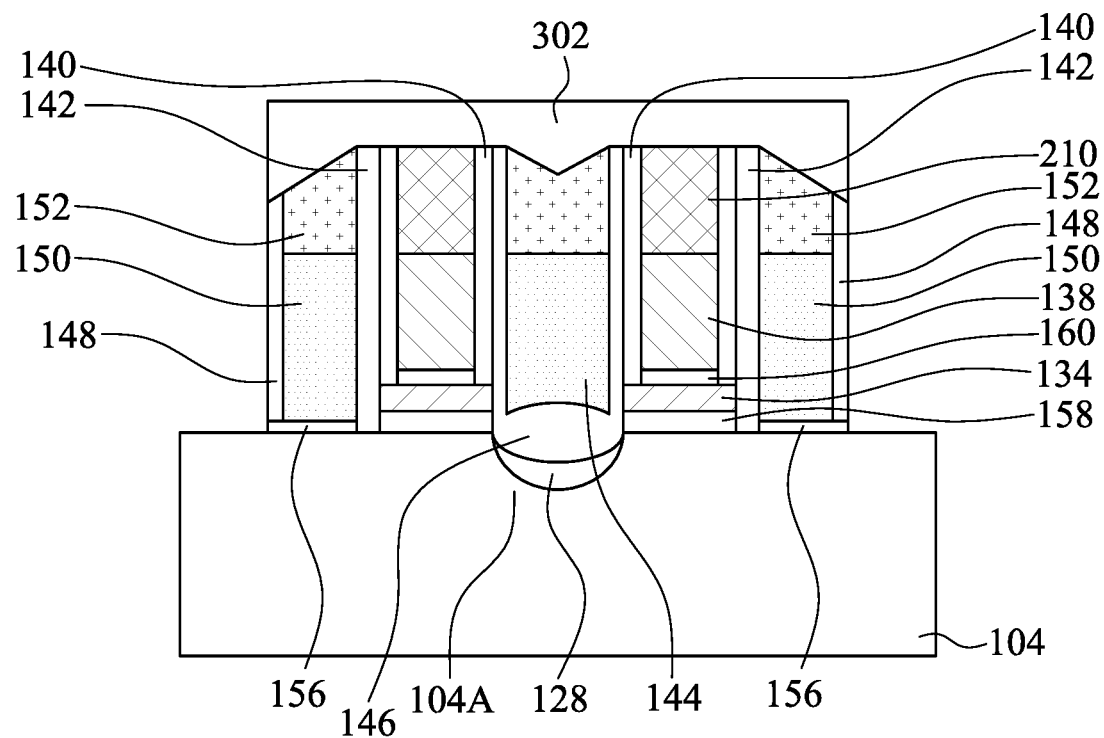
Figure 23C:
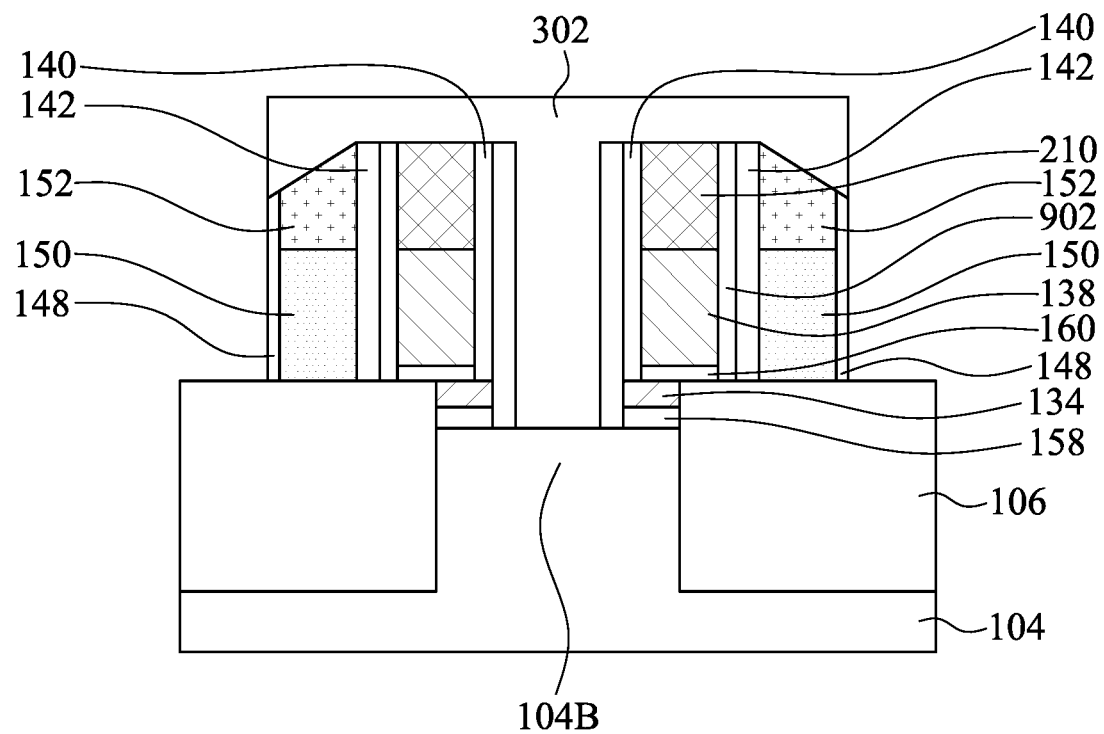
Figure 23D:
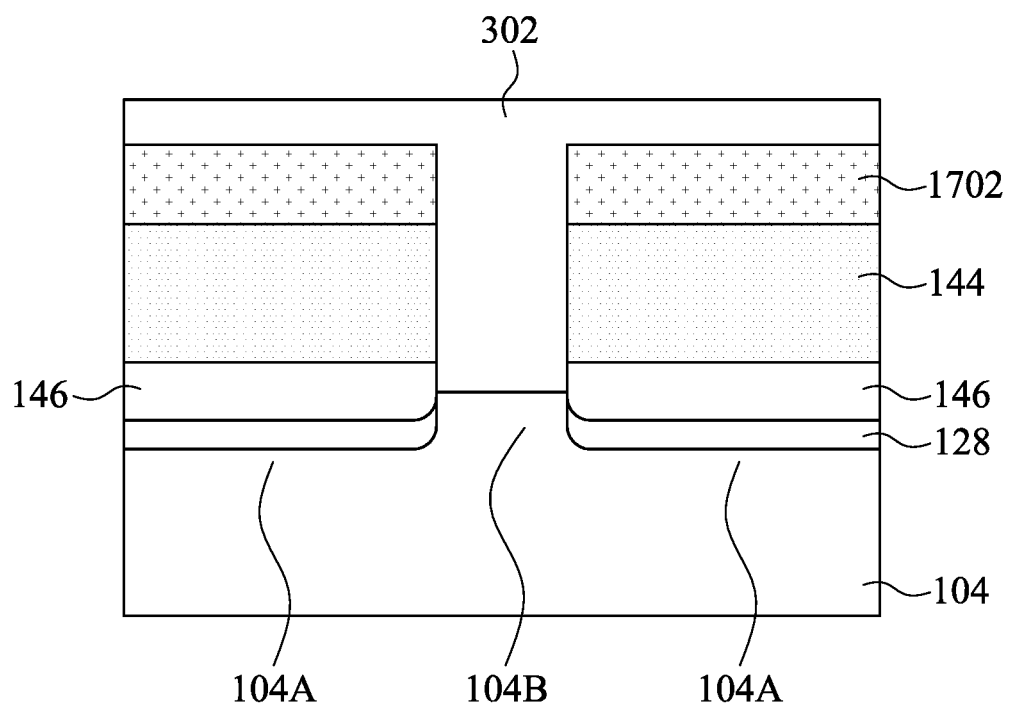

Reference is made to FIGS. 23A to 23D, in which FIG. 23A is a top view of a memory device after the process described in FIGS. 22A to 22D and has the same top view as FIG. 23A, FIG. 23B is a cross-sectional view along line B-B of FIG. 23A, FIG. 23C is a cross-sectional view along line C-C of FIG. 23A, and FIG. 23D is a cross-sectional view along line D-D of FIG. 23A. A patterned mask 302 is formed to cover the portion 104B of the substrate 104. The patterned mask 302 may be a photoresist layer and may be formed by photolithography process. Then, an etching process is performed to remove the exposed dielectric layer 1502, so as to forms select gate dielectrics 156 respectively under the select gate electrodes 150.

Figure 24A:
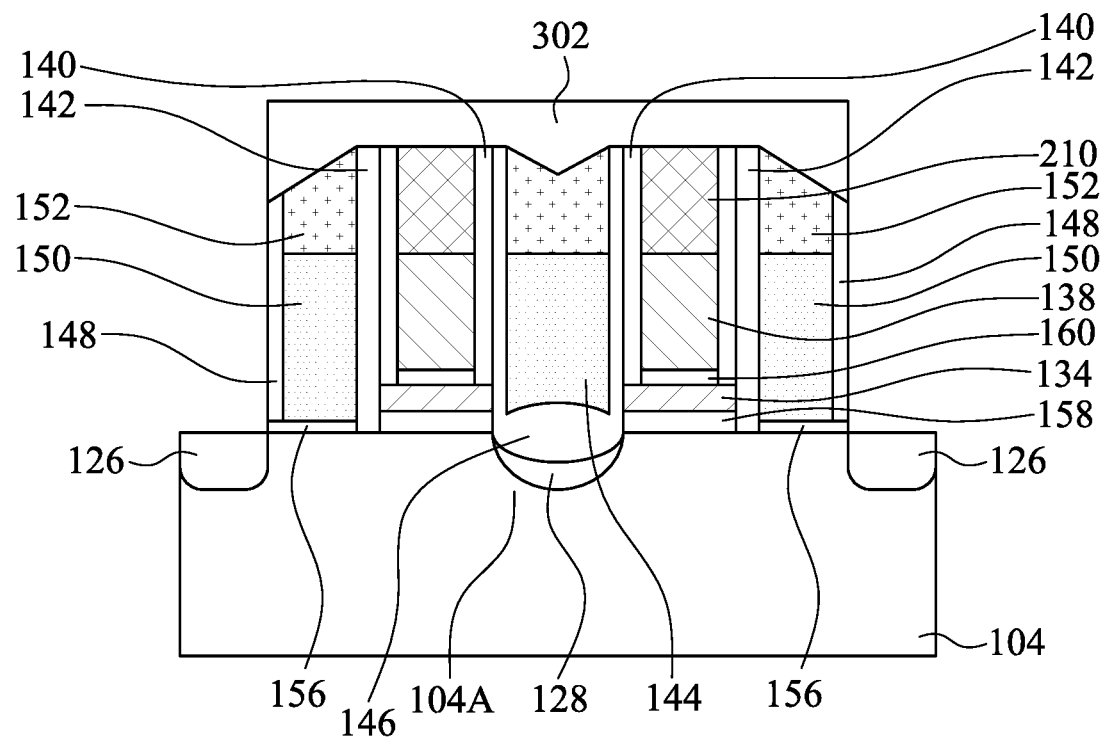
Figure 24B:
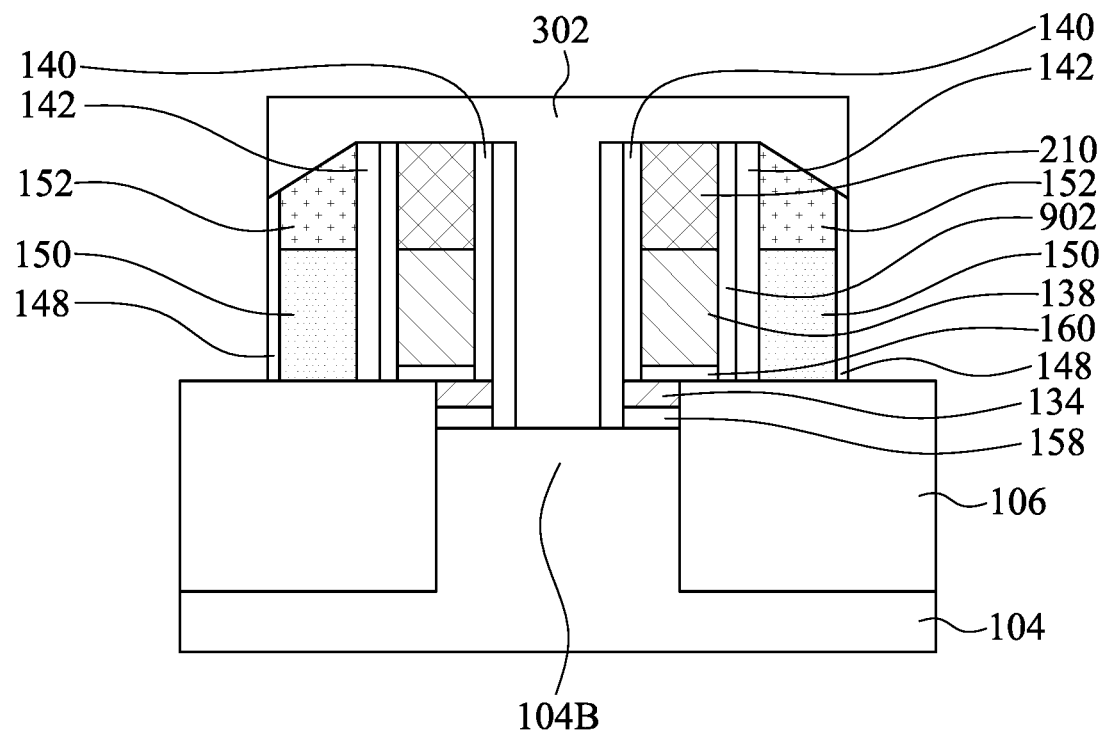
Figure 24C:
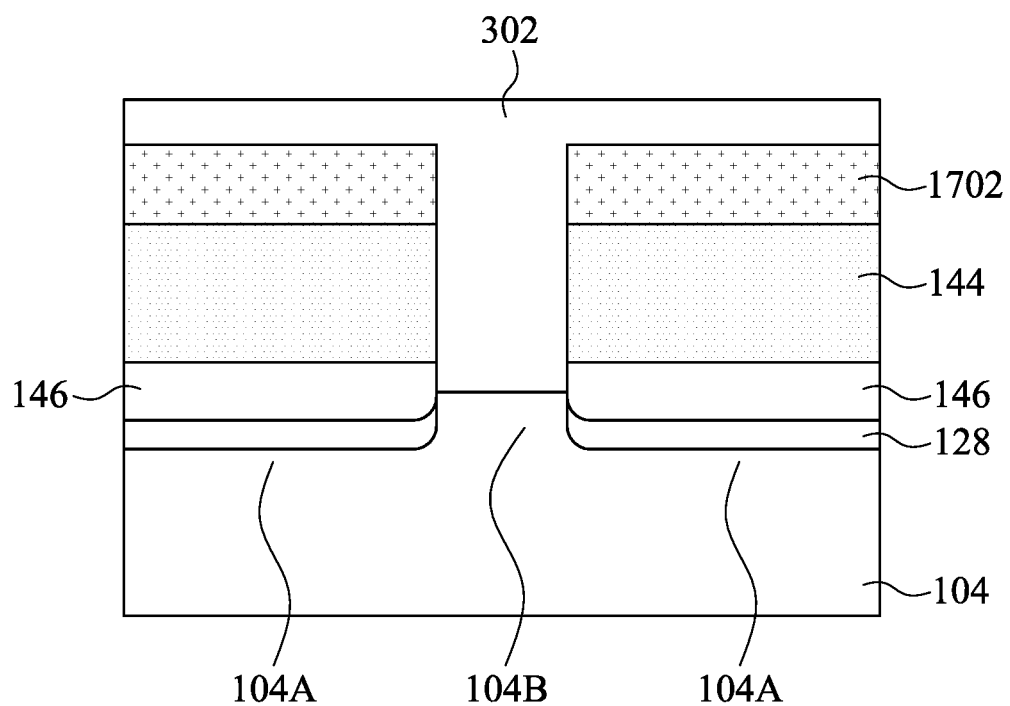

Reference is made to FIGS. 24A to 24C, in which FIGS. 24A to 24C have the same cross sectional views as FIGS. 23B to 23D, respectively. An implantation process is performed to form drain regions 126 in the substrate 104. In some embodiments, the drain regions 126 are respectively adjacent to the select gate dielectrics 156. In some embodiments, ion implantation may be carried out in a series of steps with masking to provide doping levels that vary among the drain regions 126.

Figure 25A:
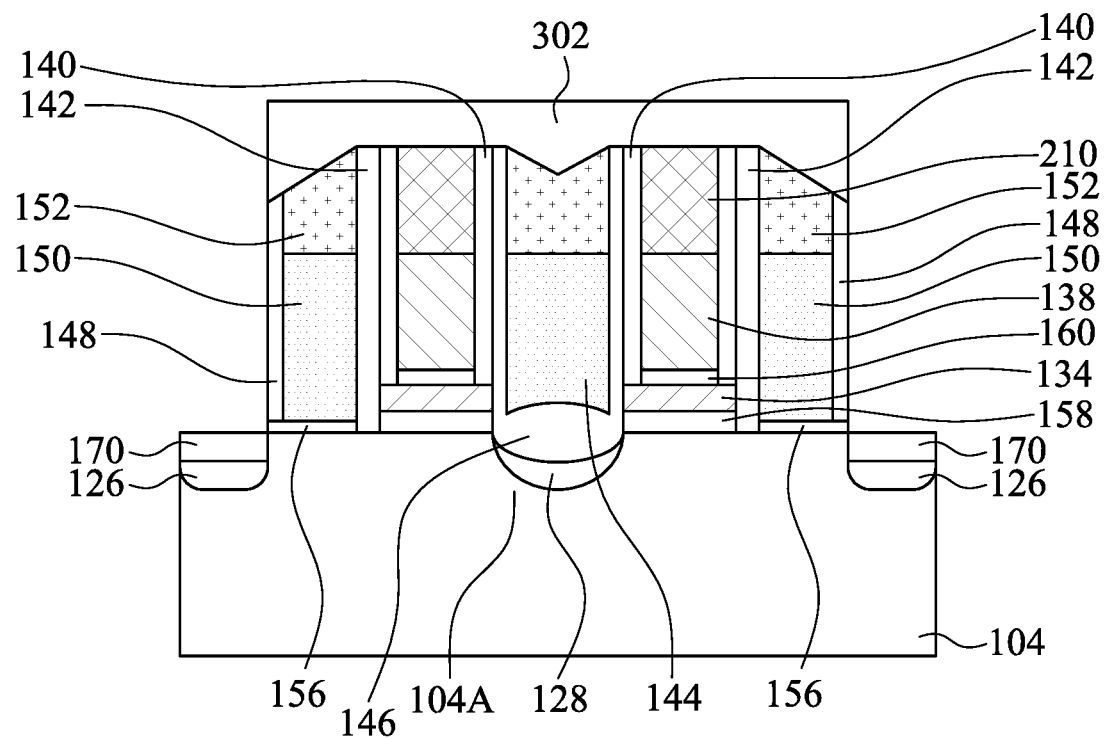
Figure 25B:
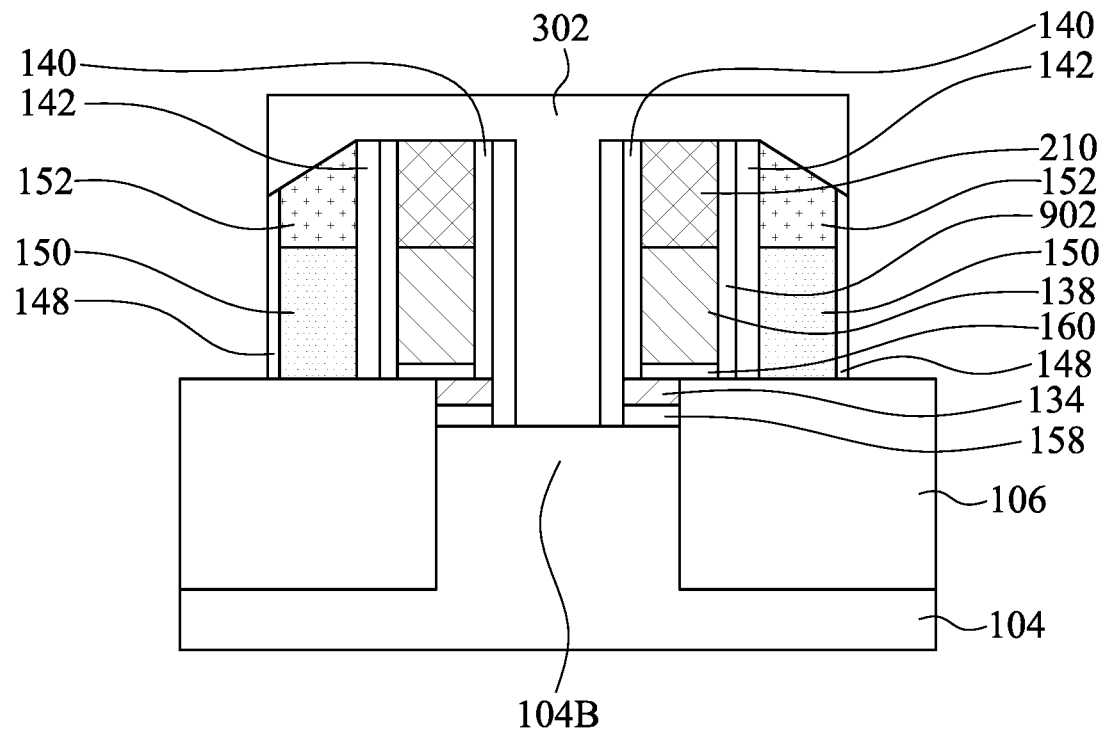
Figure 25C:
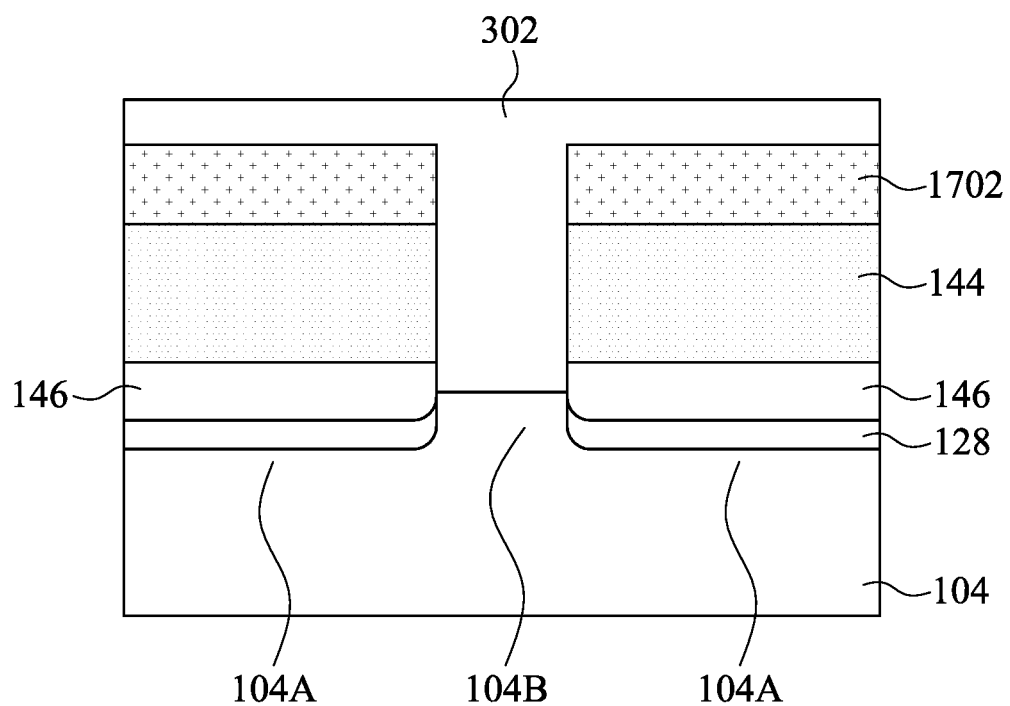

Reference is made to FIGS. 25A to 25C, in which FIGS. 25A to 25C have the same cross sectional views as FIGS. 24A to 24C, respectively. Silicide pads 170 are formed in the semiconductor substrate 104 and over the drain regions 126. In some embodiments, the silicide pads 170 may be nickel silicide or another suitable silicide(s) and may be formed by suitable saliciding process(es).

Figure 26A:
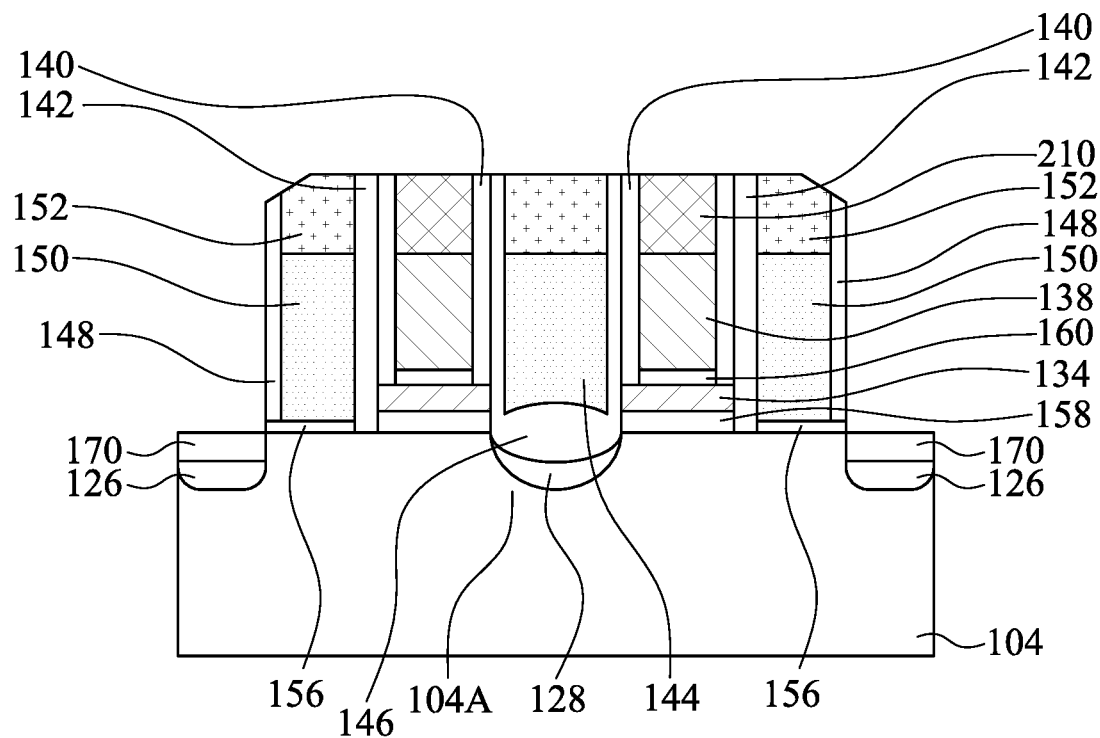
Figure 26B:
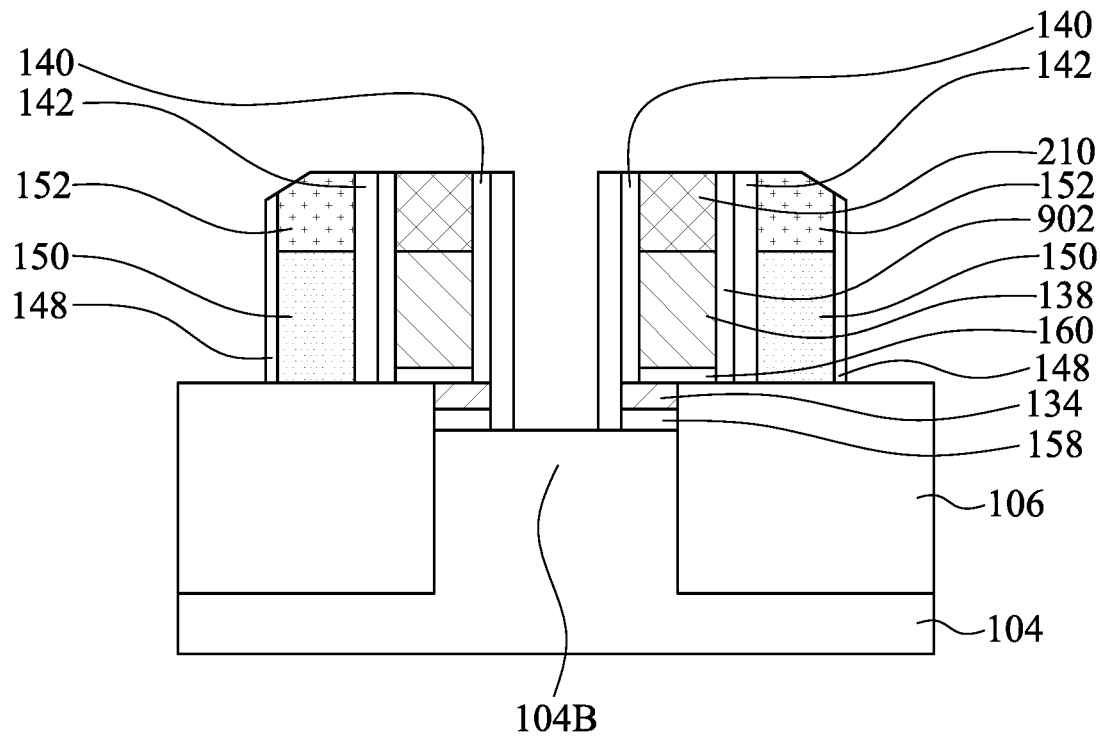
Figure 26C:
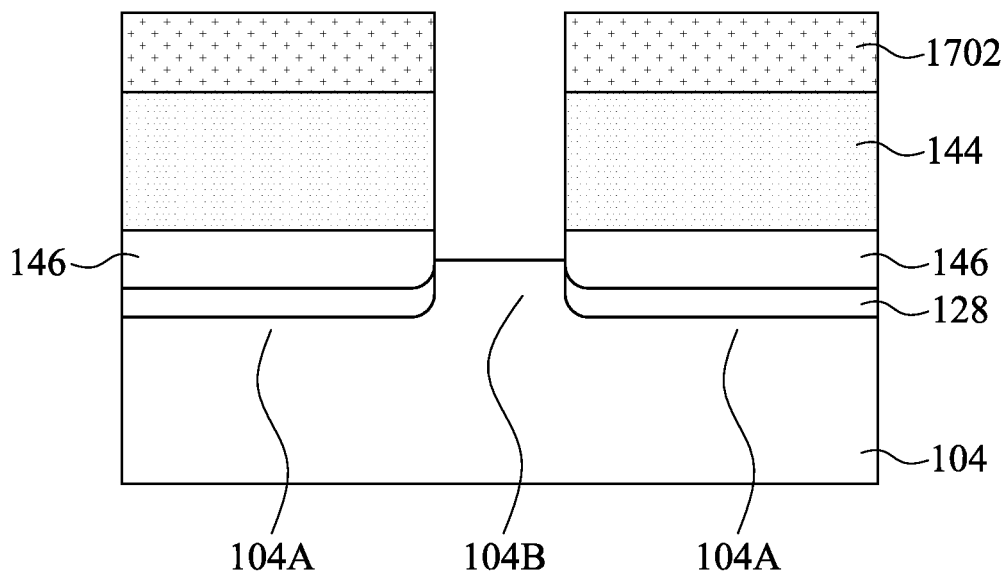

Reference is made to FIGS. 26A to 26C, in which FIGS. 26A to 26C have the same cross sectional views as FIGS. 25A to 25C, respectively. The patterned mask 302 over the portion 104B of the substrate 104 is removed. In some embodiments, the patterned mask 302 can be removed by stripping. After the patterned mask 302 is removed, sidewalls of the floating gate spacers 142 and the portion 104B of the substrate 104 are exposed.

Figure 27A:
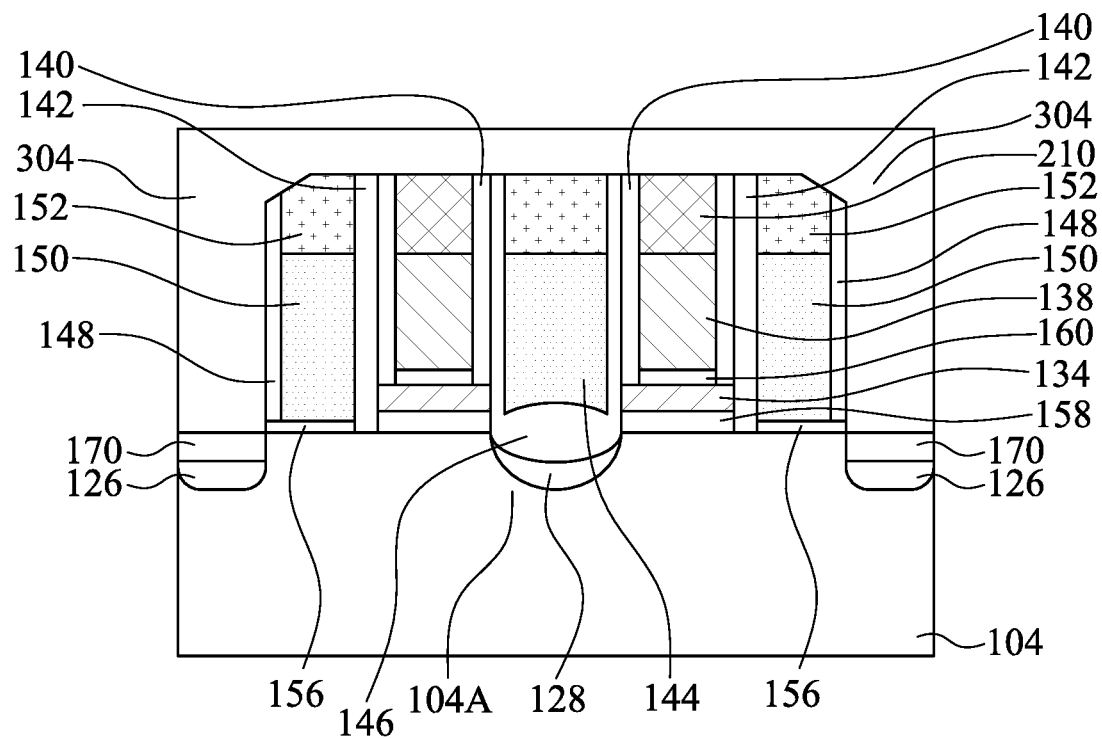
Figure 27B:
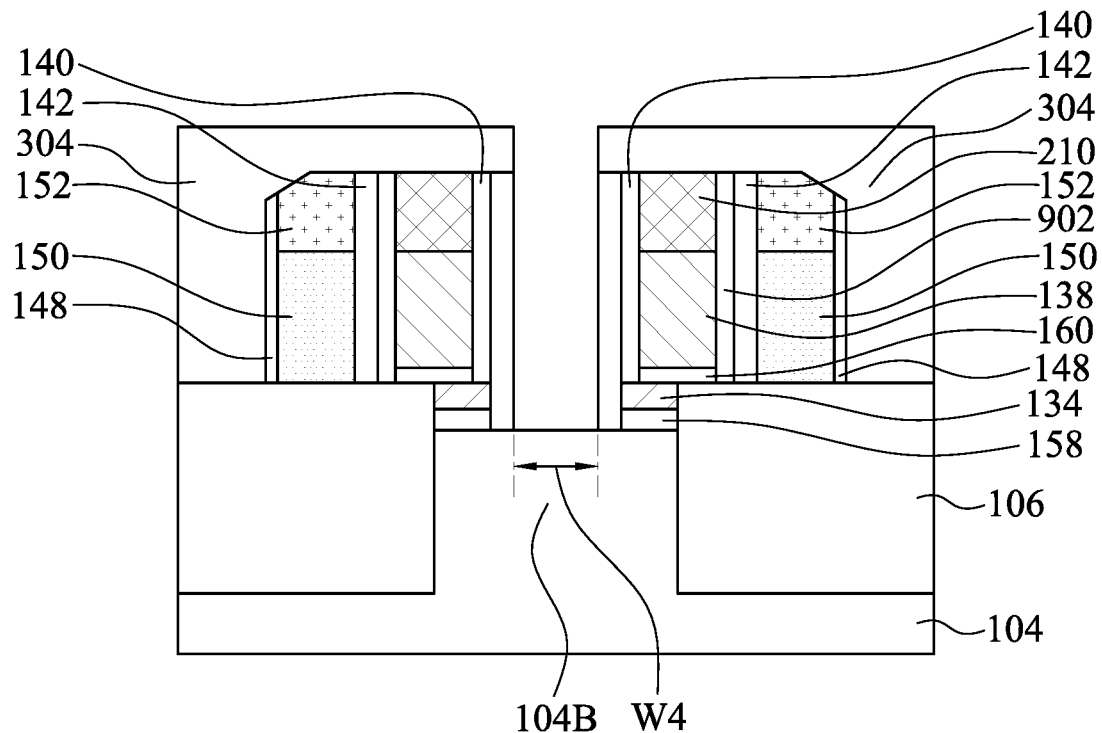
Figure 27C:
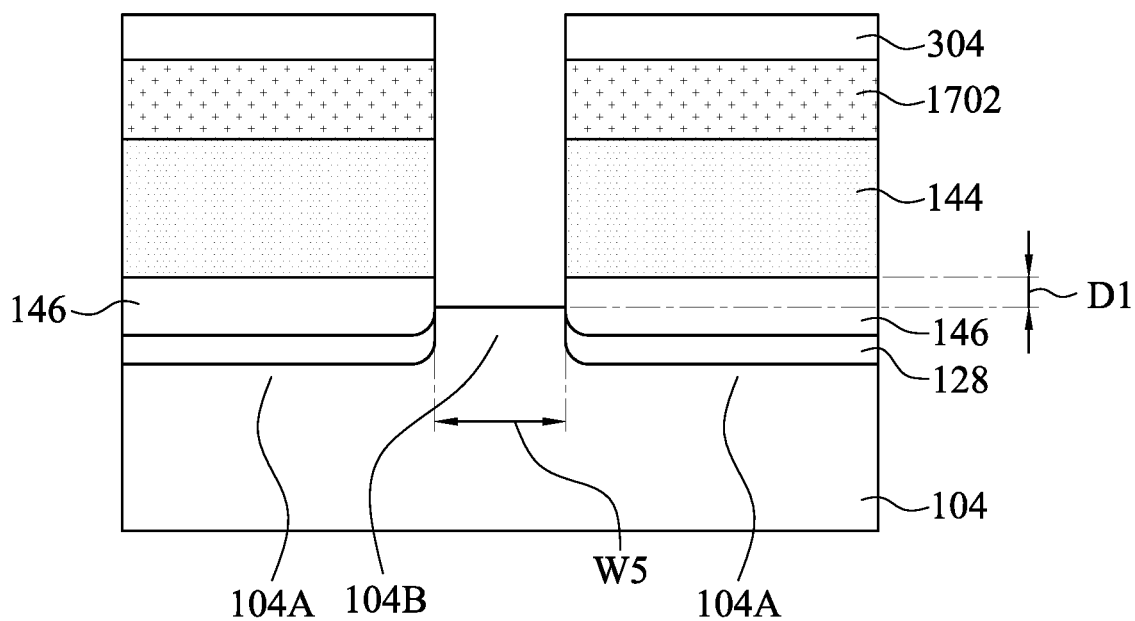

Reference is made to FIGS. 27A to 27C, in which FIGS. 27A to 27C have the same cross sectional views as FIGS. 26A to 26C, respectively. A patterned mask 304 is formed over the substrate 104 and covers the drain regions 126. The patterned mask 304 may be a photoresist layer and may be formed by photolithography process.

In FIG. 27B, along the direction perpendicular to the lengthwise direction of the erase gate electrodes 144, the exposed surface of the portion 104B of the substrate 104 has a width W4. In some embodiments, the width W4 is in a range from about 80 nm to about 120 nm. In some embodiments, the width W4 is the cell spacing, it is the key for select gate critical dimension. If the width W4 is too small, it is hard to fill materials into this narrow region (e.g., the spacing between floating gate spacers 142) in later steps, and may cause unwanted voids or seams in the materials formed in such place. On the other hand, if the width W4 is too large, the device may be too large and cannot reach a desired device density.

In FIG. 27C, along the lengthwise direction of the erase gate electrodes 144, the exposed surface of the portion 104B of the substrate 104 has a width W5. In some embodiments, the width W5 is in a range from about 80 nm to about 120 nm. In some embodiments, the width W5 is the spacing in the erase gate electrodes 144. If the width W5 is too small, the region of the exposed portion may be too small to accommodate the common source strap formed in later steps (e.g., the common source strap 160CS). On the other hand, if the width W5 is too large, it may waste too much space in the device. In some embodiments, a distance D1 between the top surface of the exposed surface of the portion 104B of the substrate 104 and the top surface of the erase gate dielectric 146 is in a range from about 30 nm to 50 nm. If the distance D1 is too small (e.g., the erase gate dielectric 146 is too thin), the erase gate dielectric 146 is unable to separate the erase gate electrode 144 and the substrate 104. On the other hand, if the distance D1 is too large (e.g., the erase gate dielectric 146 is too thick), the erase gate dielectric 146 may cause unsatisfied device performance. In some embodiments, the ratio of width W4 to width W5 is in a range of about 0.66 to about 1.5. In some embodiments, the ratio of width W5 to distance D1 is in a range of about 1.6 to about 4.

Figure 28A:
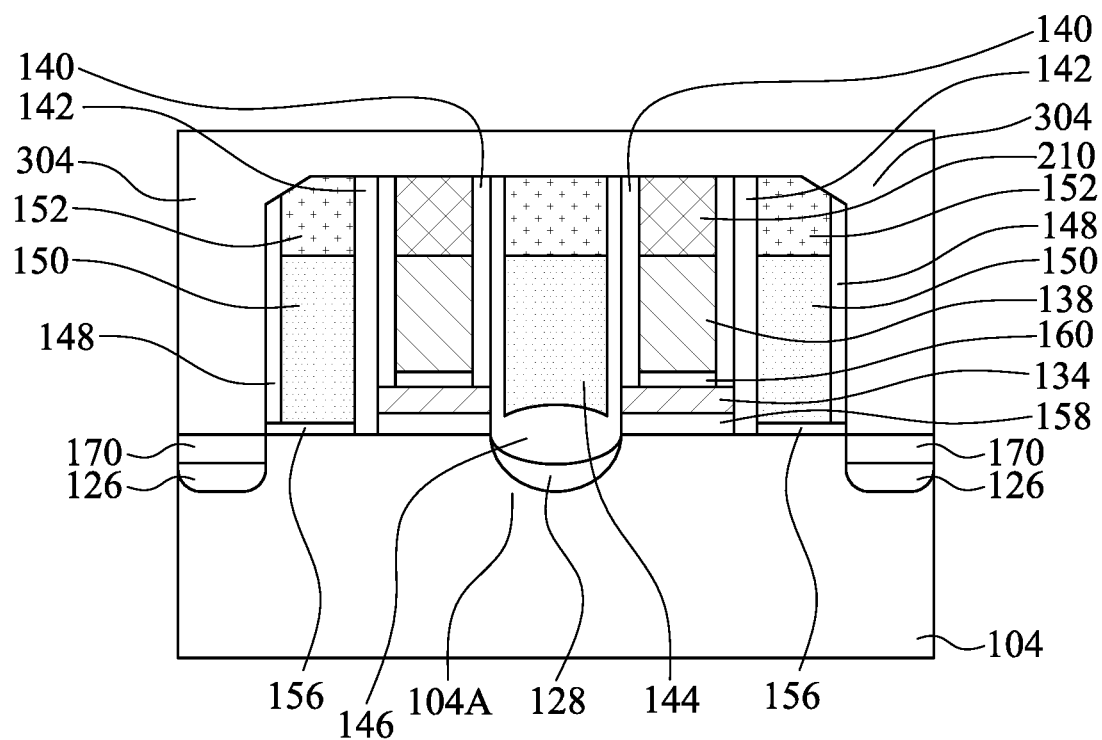
Figure 28B:
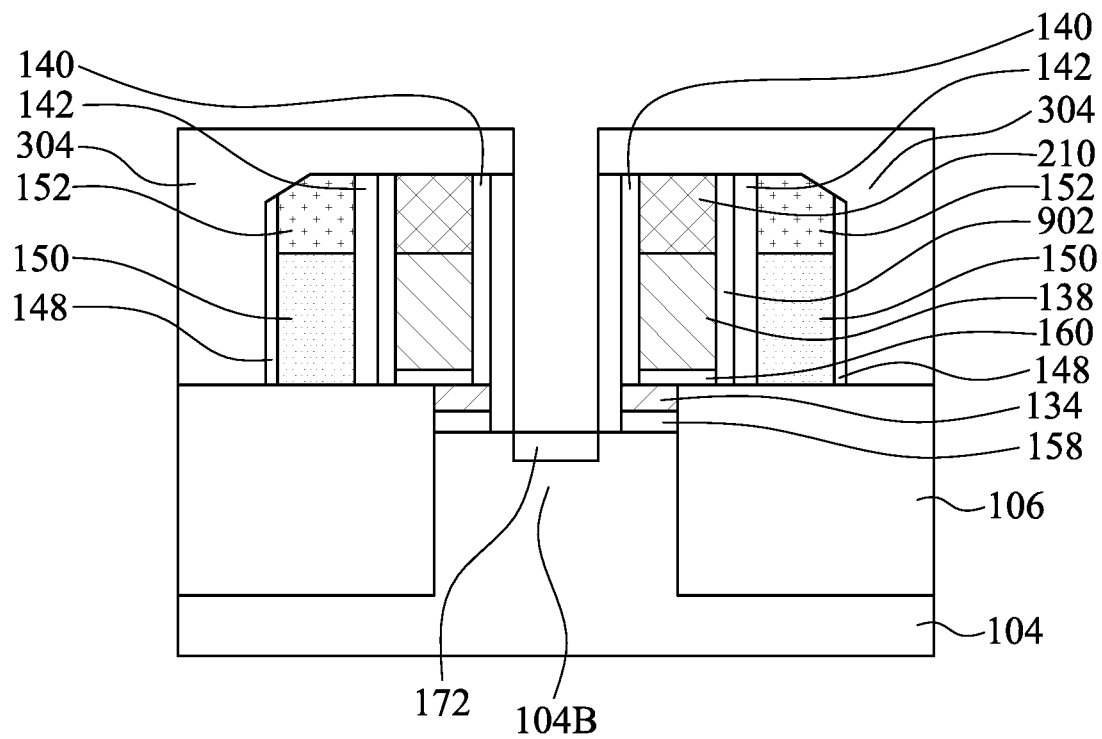
Figure 28C:
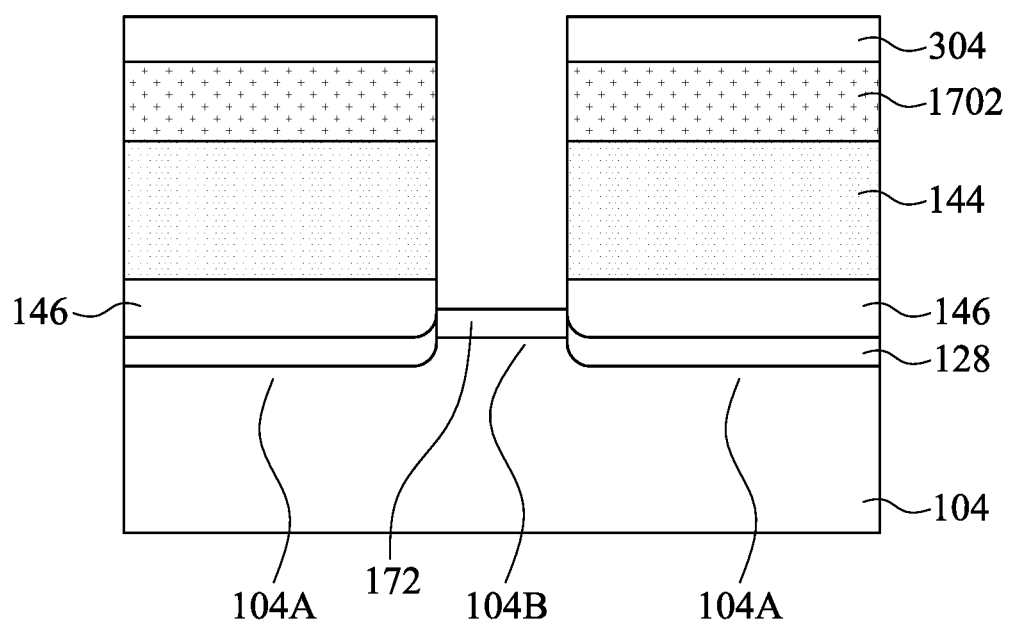

Reference is made to FIGS. 28A to 28C, in which FIGS. 28A to 28C have the same cross sectional views as FIGS. 27A to 27C, respectively. A silicide pad 172 is formed in the portion 104B of the substrate 104. In some embodiments, the silicide pad 172 may be nickel silicide or another suitable silicide(s) and may be formed by suitable saliciding process(es). In FIG. 28C, the silicide pad 172 is, at least in part, in contact with the common source region 128, so as to form electrical connection between the silicide pad 172 and the common source region 128.

As described in FIGS. 8A to 9C, the portion 104B of the substrate 104 is masked during forming the common source region 128, and the portion 104B of the substrate 104 is substantially free of dopants of the common source region 128. Additionally, no intentional doping is performed to the portion 104B of the substrate 104 through the processes described herein. As a result, the portion 104B of the substrate 104 may have no or negligible dopants. On the other hand, as the silicide pad 172 is formed in the portion 104B of the substrate 104, the silicide pad 172 is formed having no or negligible dopants. Stated another way, the dopant concentration of the silicide pad 172 is lower than the dopant concentration of the common source region 128.

Referring back to FIG. 24A, as described above, the silicide pads 170 is directly formed on the drain regions 126 of the substrate 104 using an ion implantation process. As a result, the silicide pads 170 over the drain regions 126 may include dopants of the drain regions 126. In contrast, the silicide pad 172 connected to the common source region 128 has no or negligible dopants. Stated another way, the dopant concentration of the silicide pad 172 is lower than the dopant concentration of the silicide pads 170.

In some embodiments of the present disclosure, because the portion 104B of the substrate 104 is masked during forming the common source region 128, the erase gate dielectrics 146 having a curved or bulbous surface profile due to ion implantation in the common source regions 128 will not be formed in the portion 104B of the substrate 104 due to the absence of the common source region 128, and therefore the top surface of the portion 104B of the substrate 104 remains substantially flat until this step, which results in a flat top surface of the silicide pad 172. Accordingly, the top surface of the silicide pad 172 may level with top surfaces of the silicide pads 170 in some embodiments. This will also facilitate the formation of the straps in later steps (e.g., the common source strap 160CS and the drain straps 160D in FIGS. 33A to 33C).

On the other hand, as described in FIGS. 21A to 21D, the gate layer 1504 over the portion 104B of the substrate 104 has been removed together with the removal of the select gate electrodes 150 using the same mask. However, if the erase gate dielectric 146 having the curved or bulbous surface profile is formed over the portion 104B of the substrate 104, an additional photomask that exposes this region may be applied to further remove the erase gate dielectrics 146 over the portion 104B of the substrate 104, which will cause extra cost to the process.

Figure 29A:
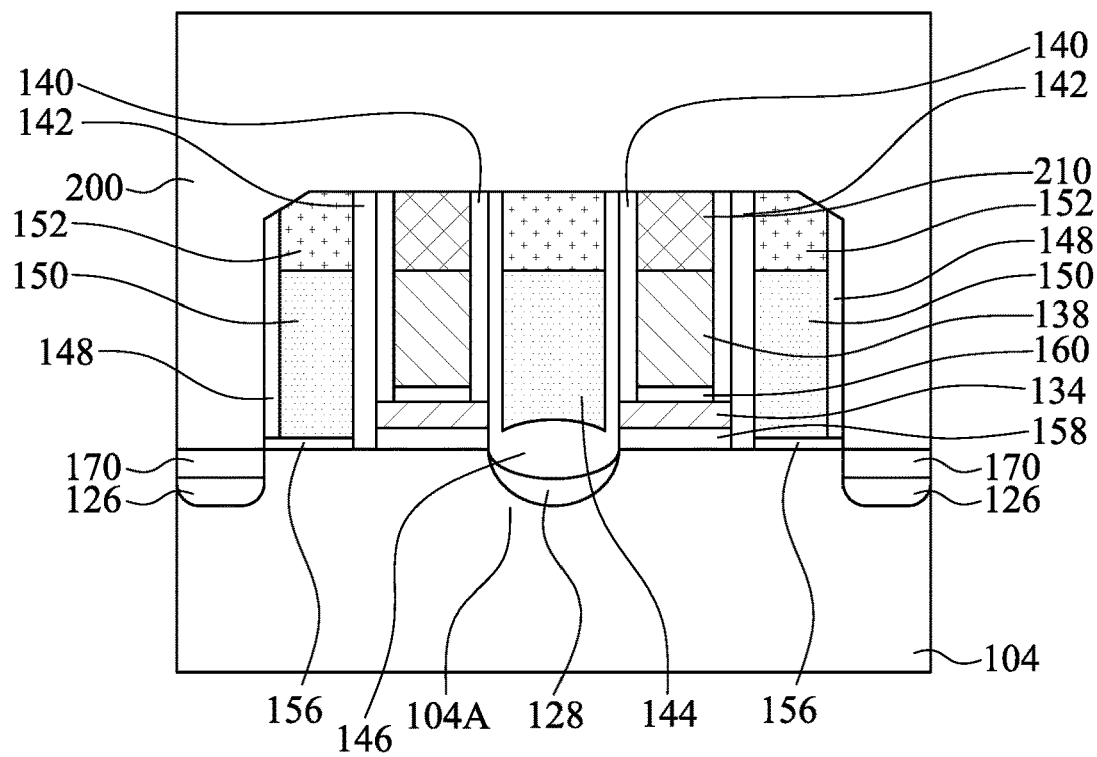
Figure 29B:
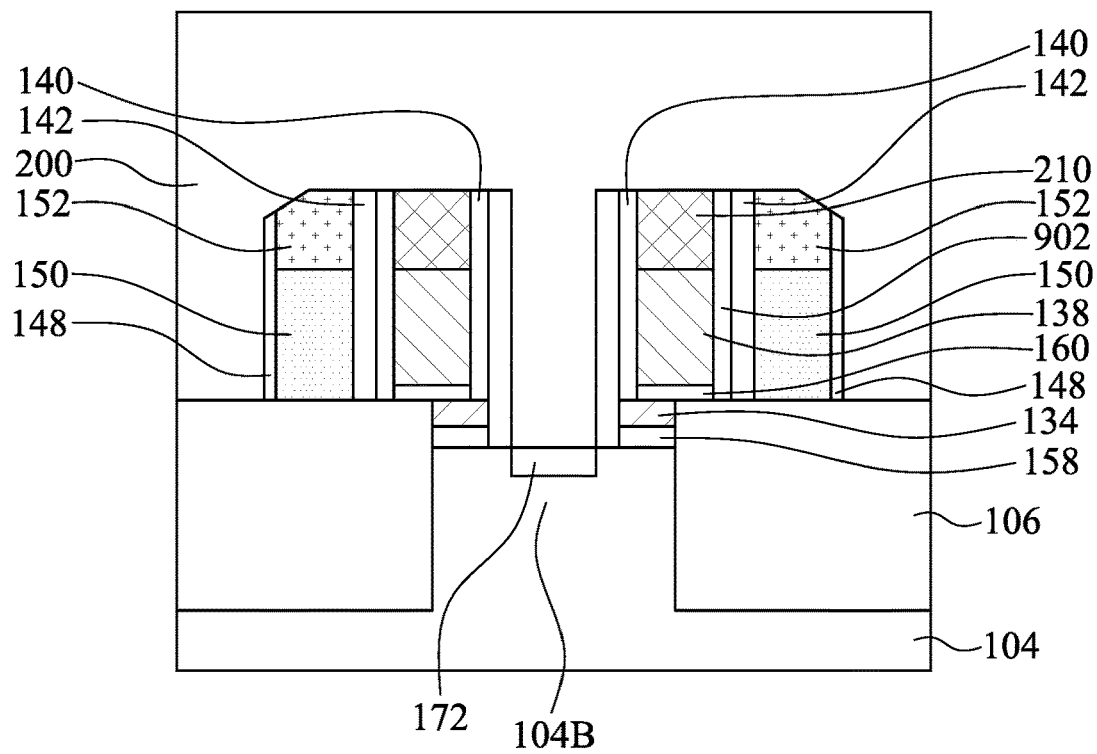
Figure 29C:
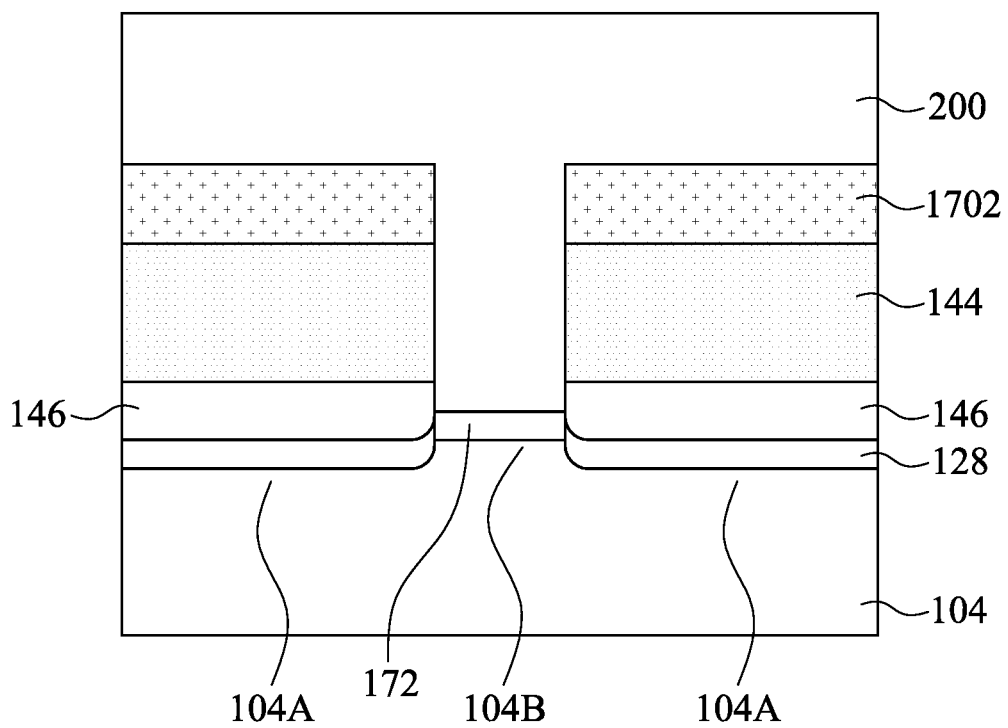

Reference is made to FIGS. 29A to 29C, in which FIGS. 29A to 29C have the same cross sectional views as FIGS. 28A to 28C, respectively. The patterned mask 304 is removed, and a first interlayer dielectric (ILD) 200 is formed over the substrate 104. In some embodiments, the first ILD 200 fills the region above the silicide pads 170 and 172. The first ILD 200 may be oxide, a low κ dielectric, another suitable dielectric(s), combination of the foregoing, or the like. The first ILD 200 may be deposited by CVD, PVD, sputtering, or other suitable process(es).

Figure 30A:
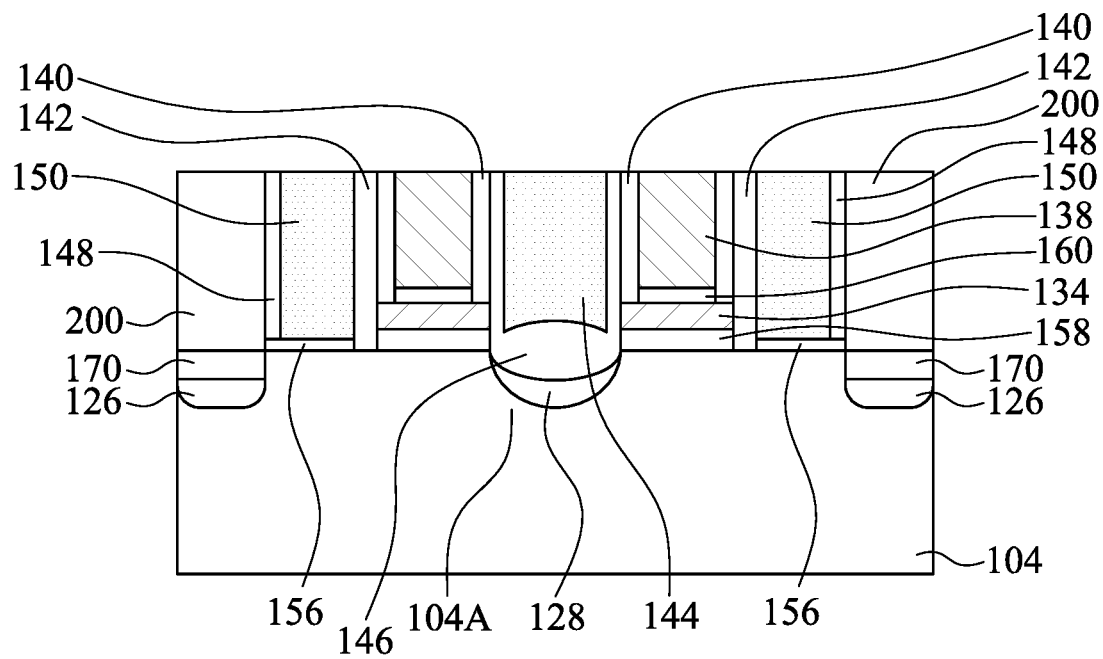
Figure 30B:
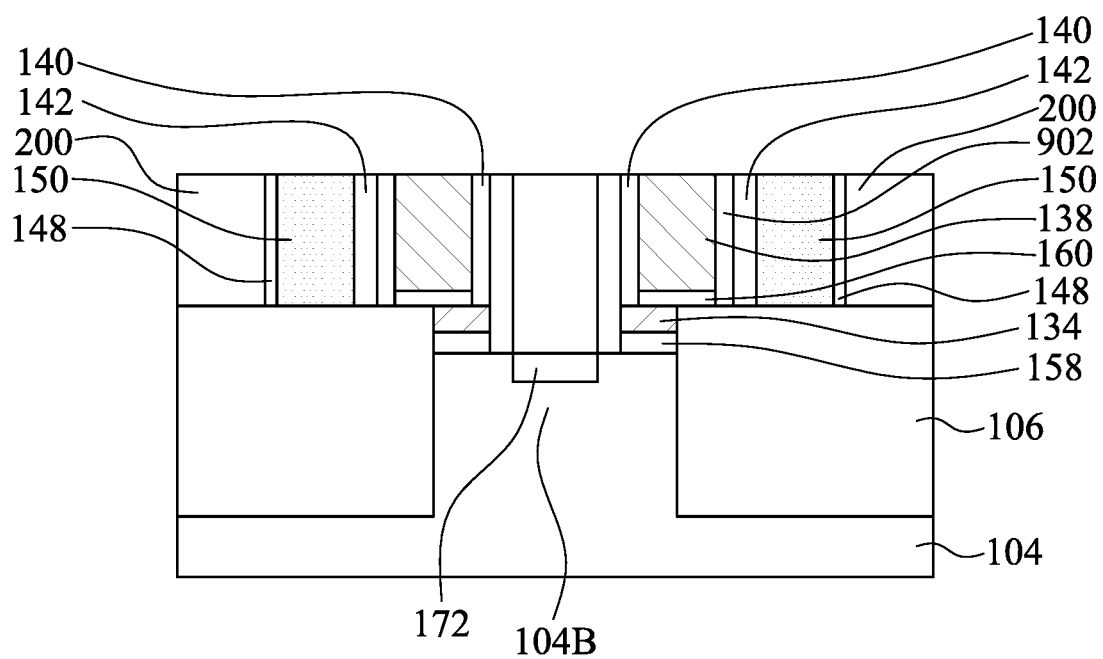
Figure 30C:
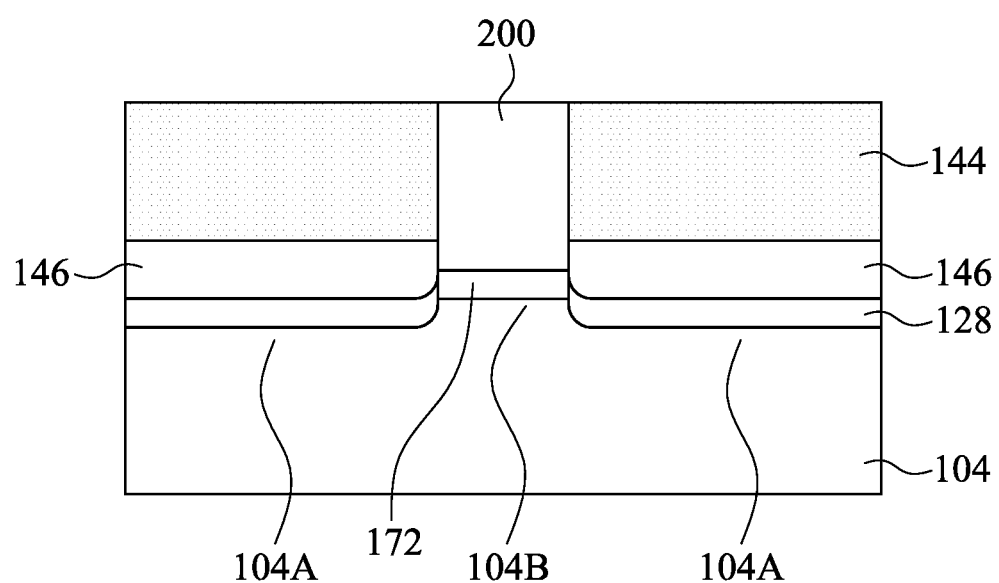

Reference is made to FIGS. 30A to 30C, in which FIGS. 30A to 30C have the same cross sectional views as FIGS. 29A to 29C, respectively. A CMP process is performed to remove excessive first ILD 200 until the erase gate electrodes 144, the control gate electrodes 138, and the select gate electrodes 150 are exposed.

Figure 31A:
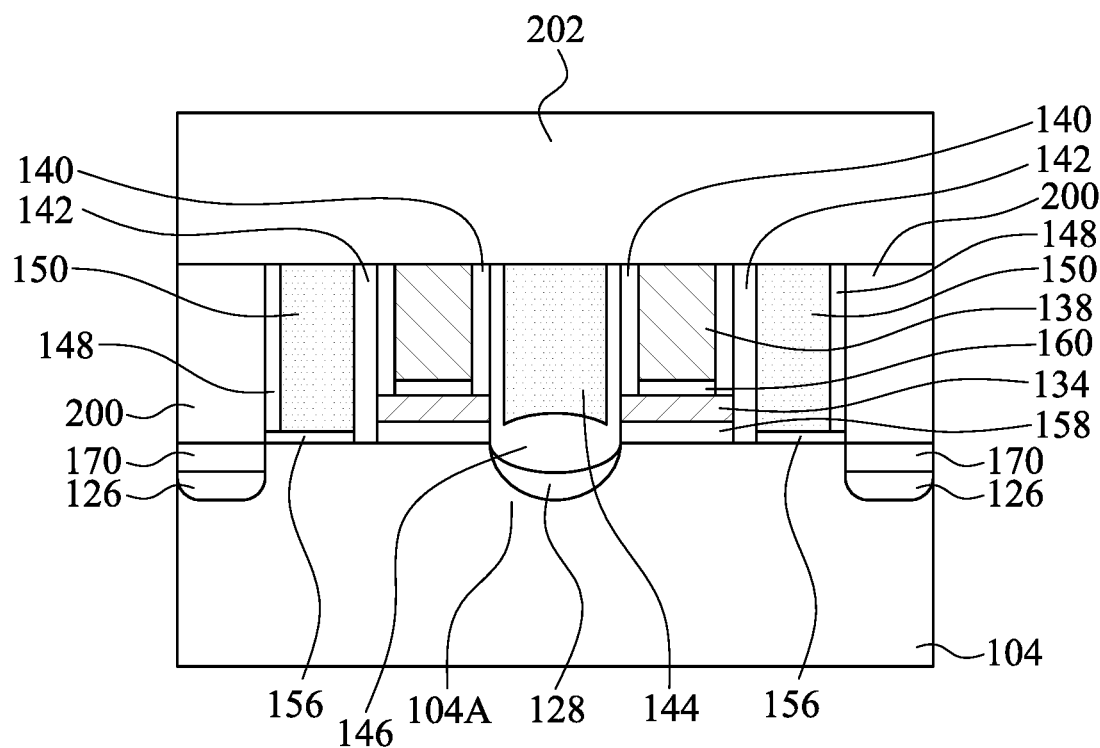
Figure 31B:
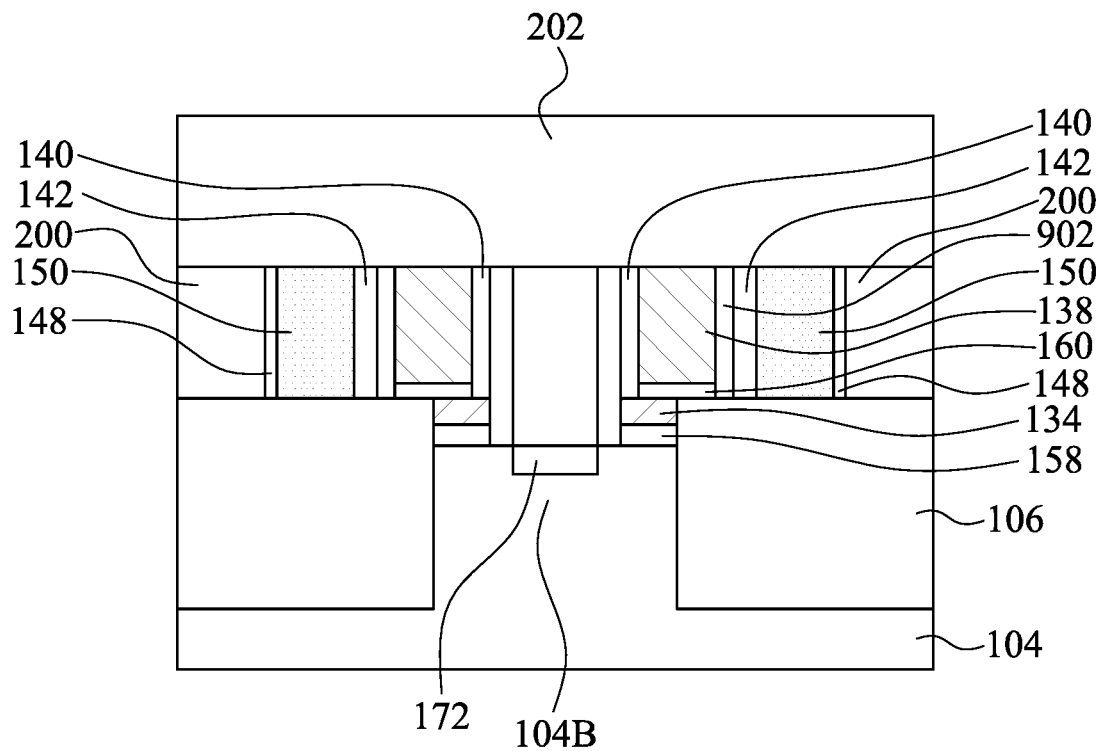
Figure 31C:
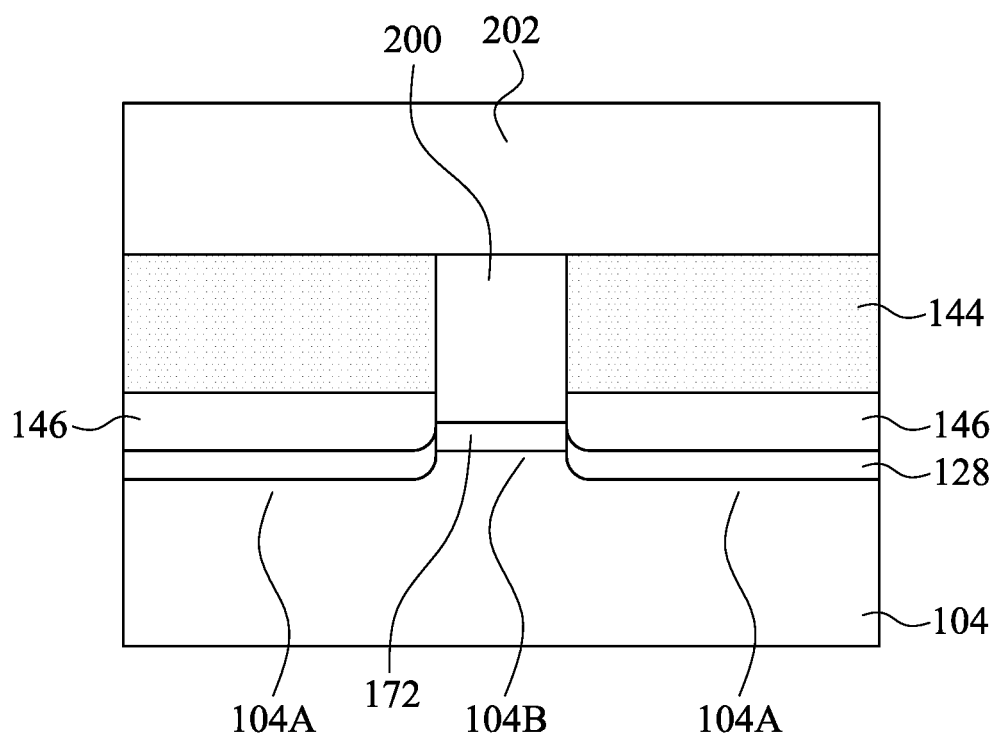

Reference is made to FIGS. 31A to 31C, in which FIGS. 31A to 31C have the same cross sectional views as FIGS. 30A to 30C, respectively. A second interlayer dielectric (ILD) 202 is formed over the substrate 104. The second ILD 202 may be oxide, a low κ dielectric, another suitable dielectric(s), combination of the foregoing, or the like. The second ILD 202 may be deposited by CVD, PVD, sputtering, or other suitable process(es).

Figure 32A:
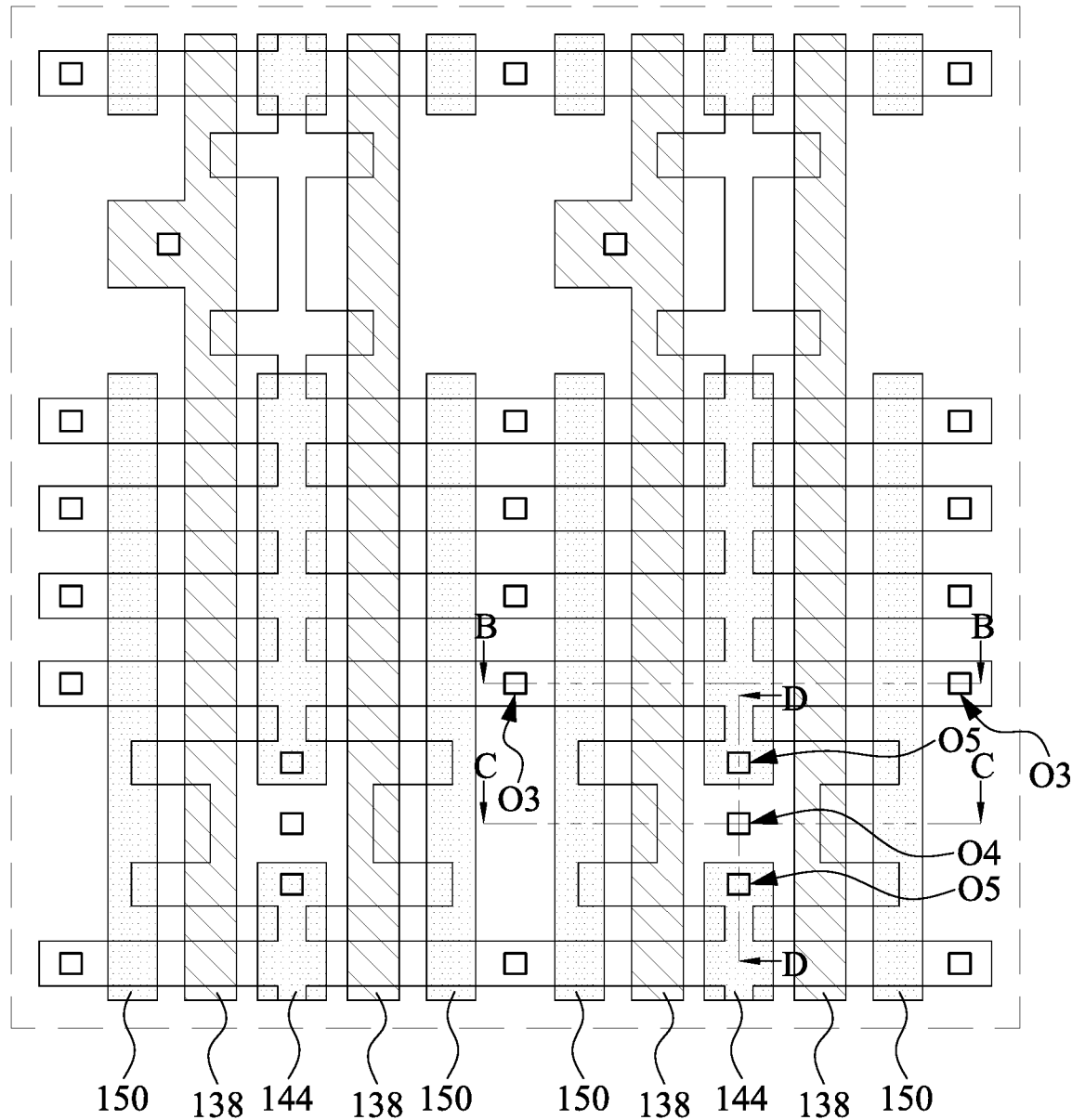
Figure 32B:
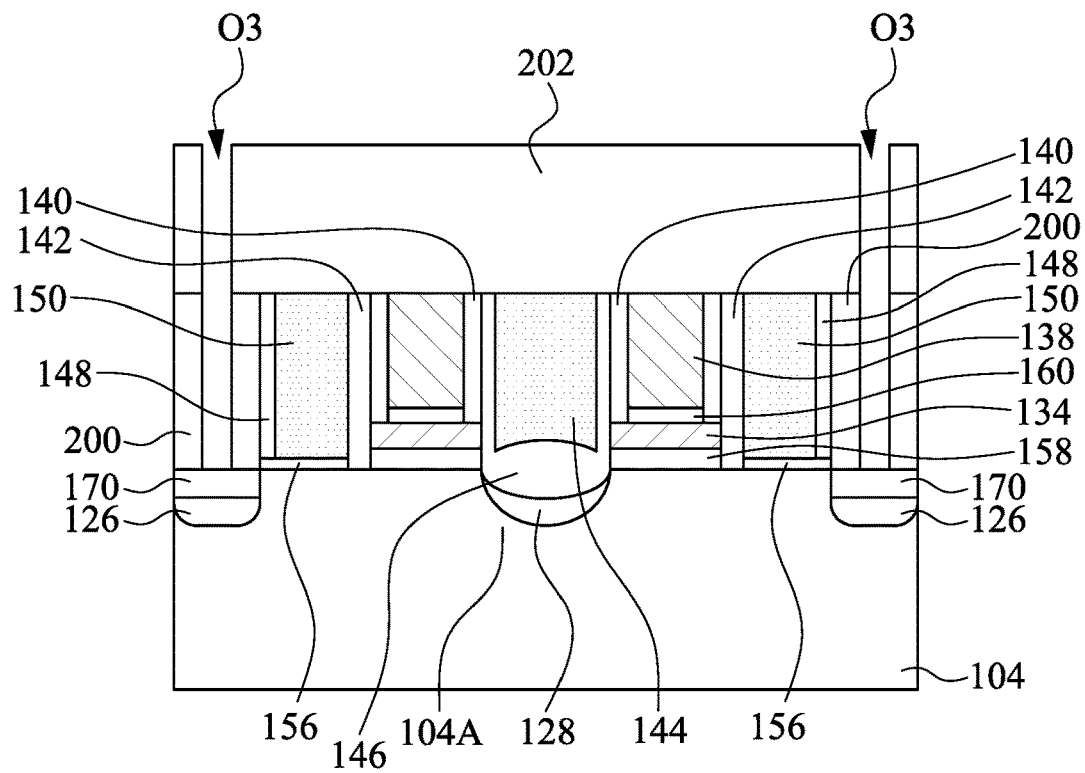
Figure 32C:
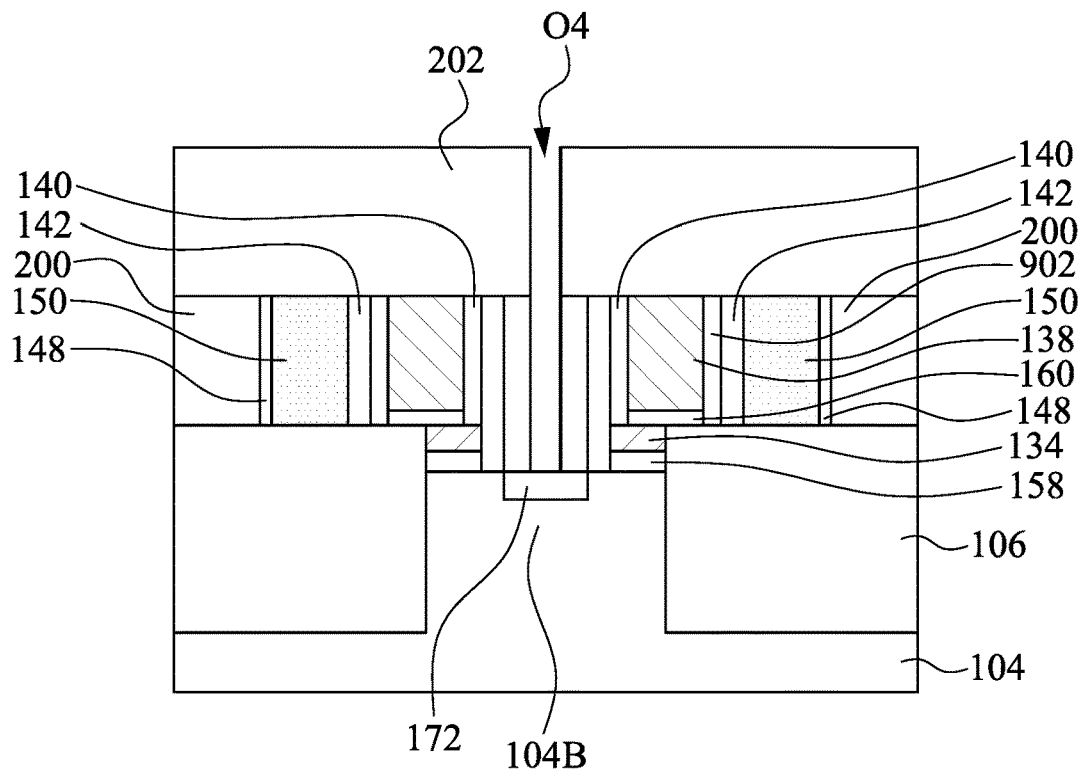
Figure 32D:
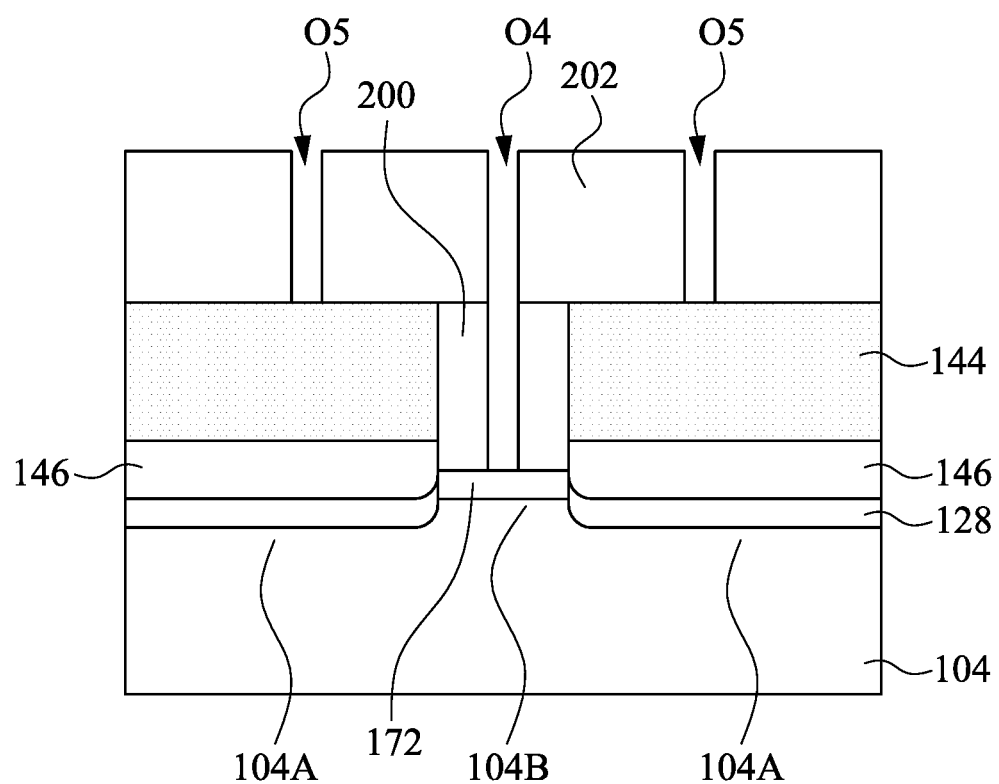

Reference is made to FIGS. 32A to 32D, in which FIG. 32A is a top view of a memory device after the process described in FIGS. 31A to 31C and has the same top view as FIG. 23A, FIG. 32B is a cross-sectional view along line B-B of FIG. 32A, FIG. 32C is a cross-sectional view along line C-C of FIG. 32A, and FIG. 32D is a cross-sectional view along line D-D of FIG. 32A. The first and second ILD 200 and 202 are etched (or patterned) to form openings O3, O4, and O5. In some embodiments, the openings O3 expose the silicide pads 170 over the drain regions 126, the openings O4 expose the silicide pad 172, and the openings O5 expose the erase gate electrodes 144. As described above, because the silicide pad 172 has a substantially flat top surface level with the top surface of the silicide pads 170, the etchant may reach the silicide pads 170 and 172 substantially at the same time. In some embodiments where the top surfaces of the silicide pads 170 and 172 are at different levels, over-etching may occur at those which have higher top surfaces, and will deteriorate the device performance.

Figure 33A:
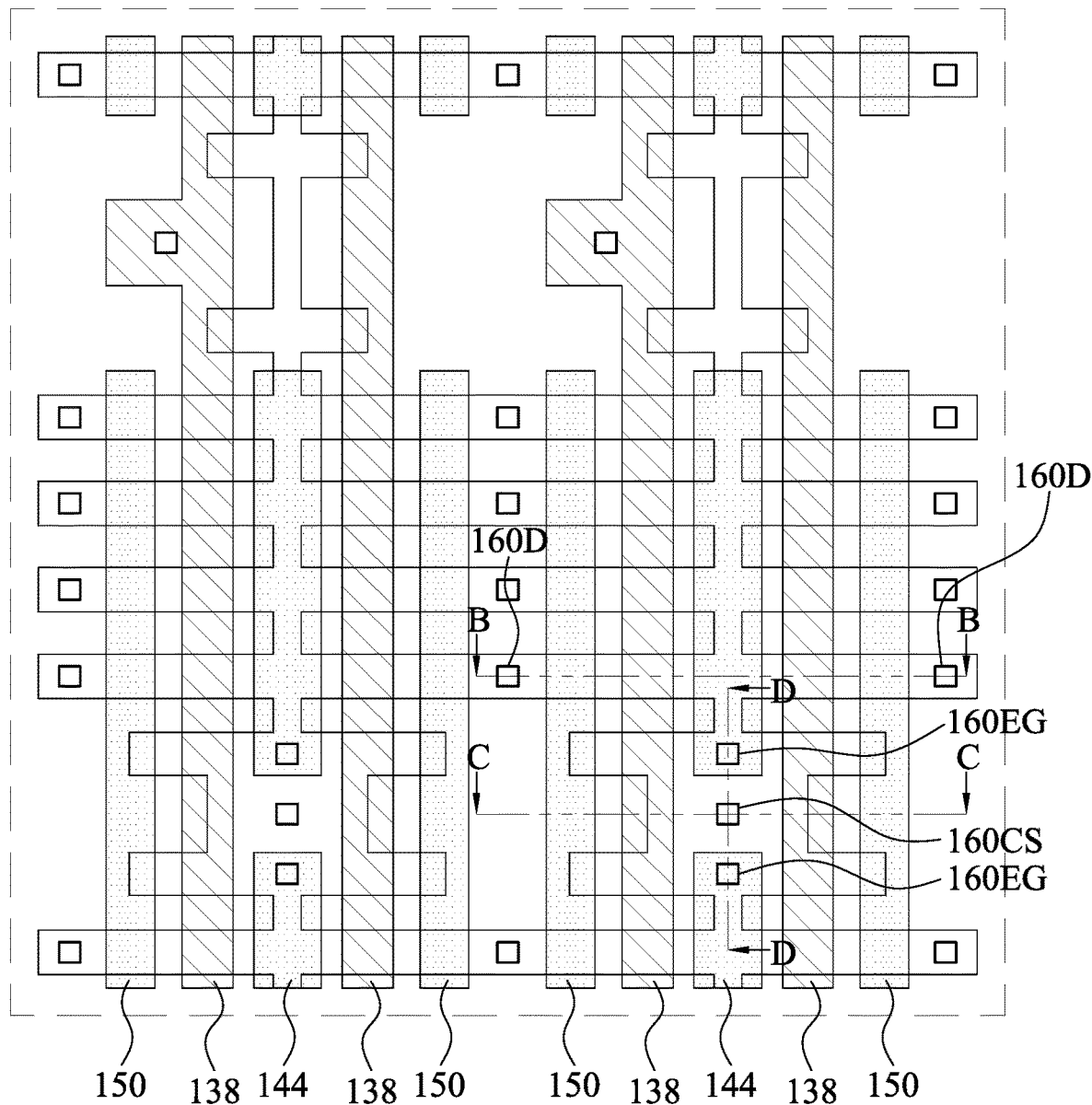
Figure 33B:
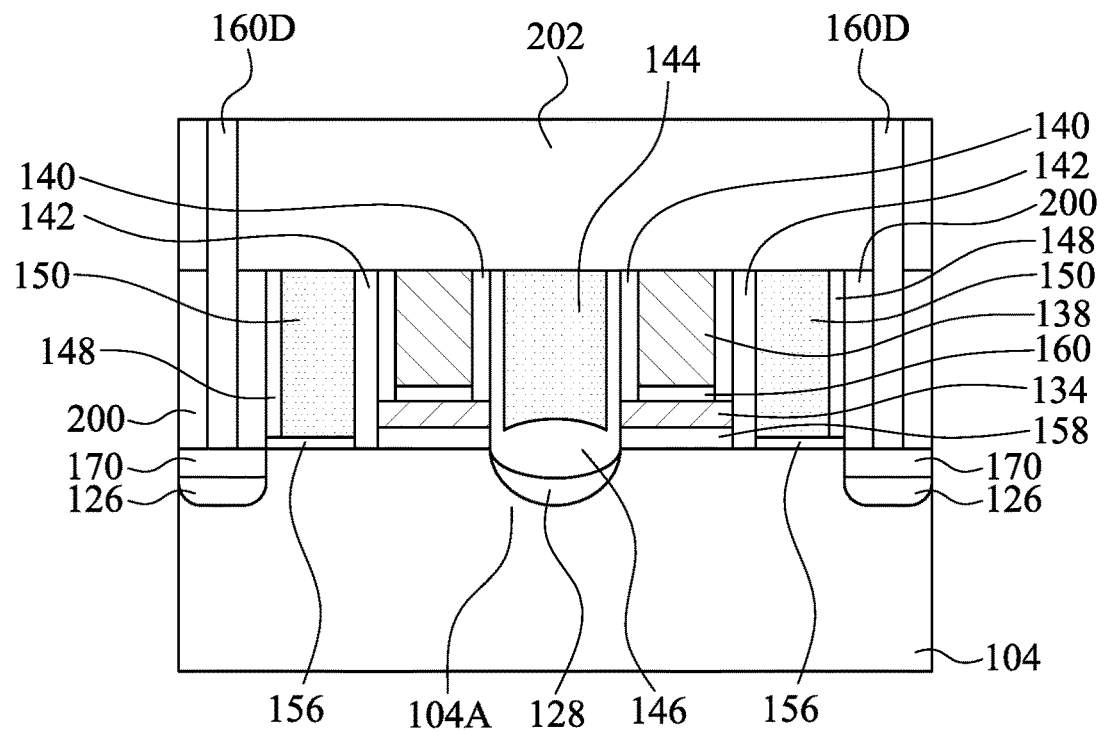
Figure 33C:
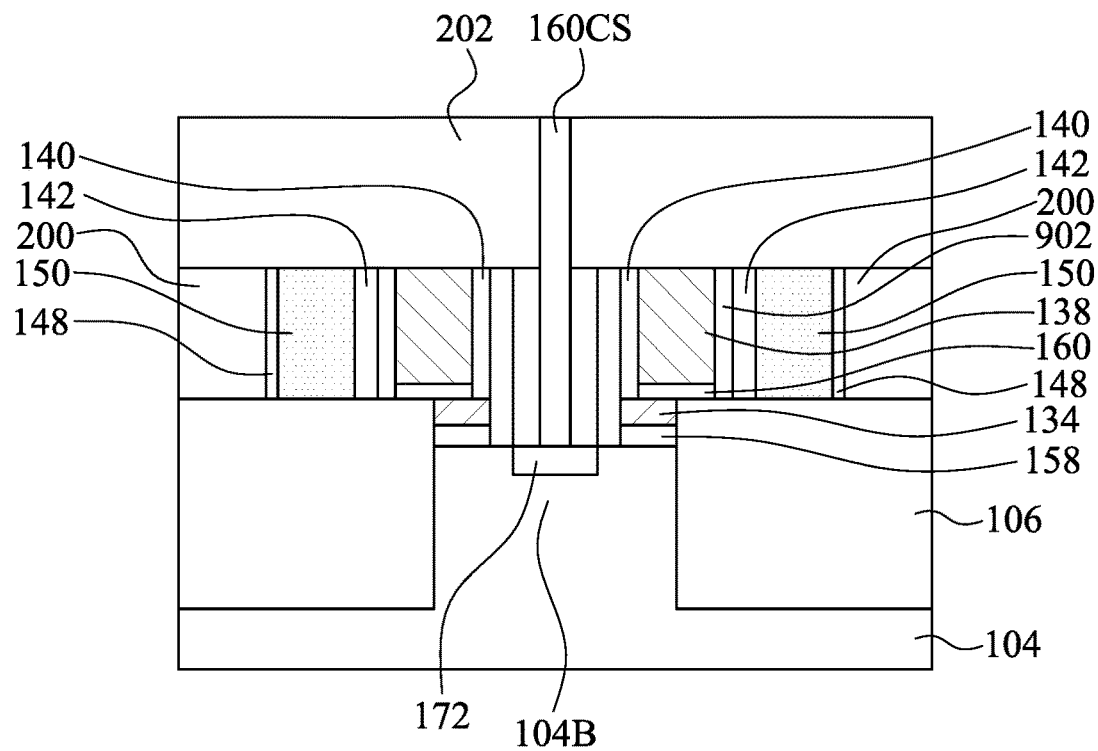
Figure 33D:
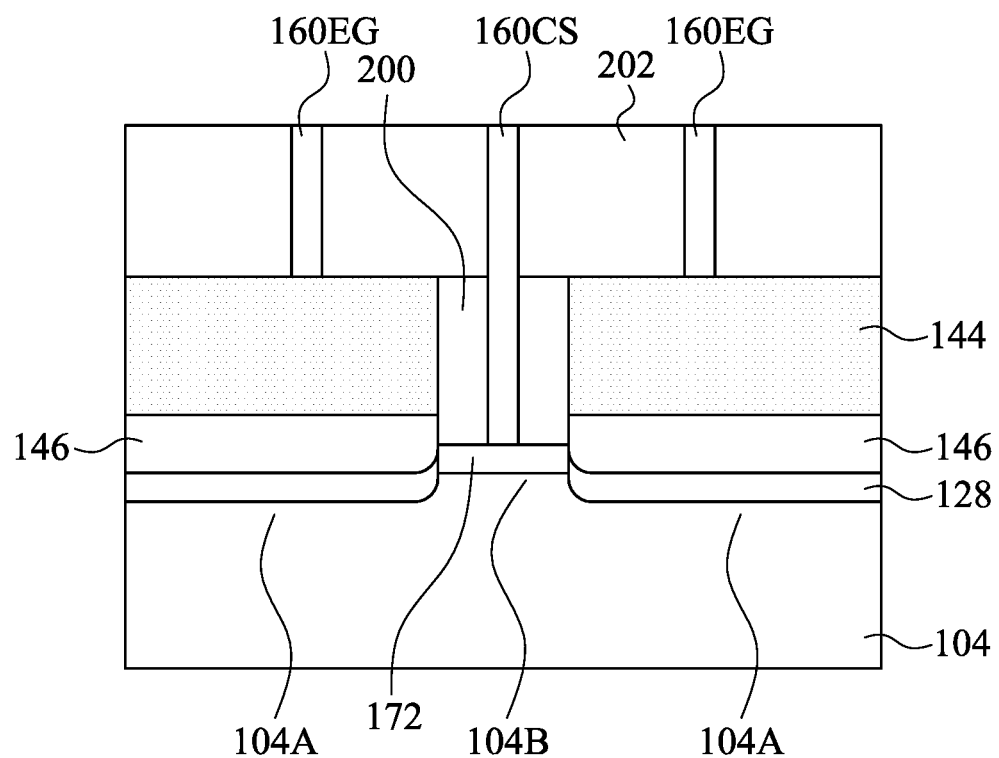

Reference is made to FIGS. 33A to 33D, in which FIG. 33A is a top view of a memory device after the process described in FIGS. 32A to 32D and has the same top view as FIG. 32A, FIG. 33B is a cross-sectional view along line B-B of FIG. 33A, FIG. 33C is a cross-sectional view along line C-C of FIG. 33A, and FIG. 33D is a cross-sectional view along line D-D of FIG. 33A. A plurality of straps 160D, 160CS, and 160EG are formed in the openings O3, O4, and O5, respectively. In some embodiments, the straps 160D formed in openings O3 can be referred to as drain strap 160D, or can be interchangeably referred to as drain contact 160D. The strap 160CS formed in opening O4 can be referred to as common source strap 160D, or can be interchangeably referred to as common source contact 160CS. The strap 160EG formed in openings O5 can be referred to as erase gate strap 160EG, or can be interchangeably referred to as erase gate contact 160EG. The straps 160D, 160CS, and 160EG are conductive and may be tungsten, aluminum copper, copper, aluminum, another suitable metal(s) or other conductive material(s), a combination of the foregoing, or the like. The straps 160D, 160CS, and 160EG may be formed by, for example, depositing conductive material over the substrate 104 and filling the openings O3, O4, and O5, followed by a CMP to remove excessive conductive material until the second ILD 202 is exposed.

Figure 34A:
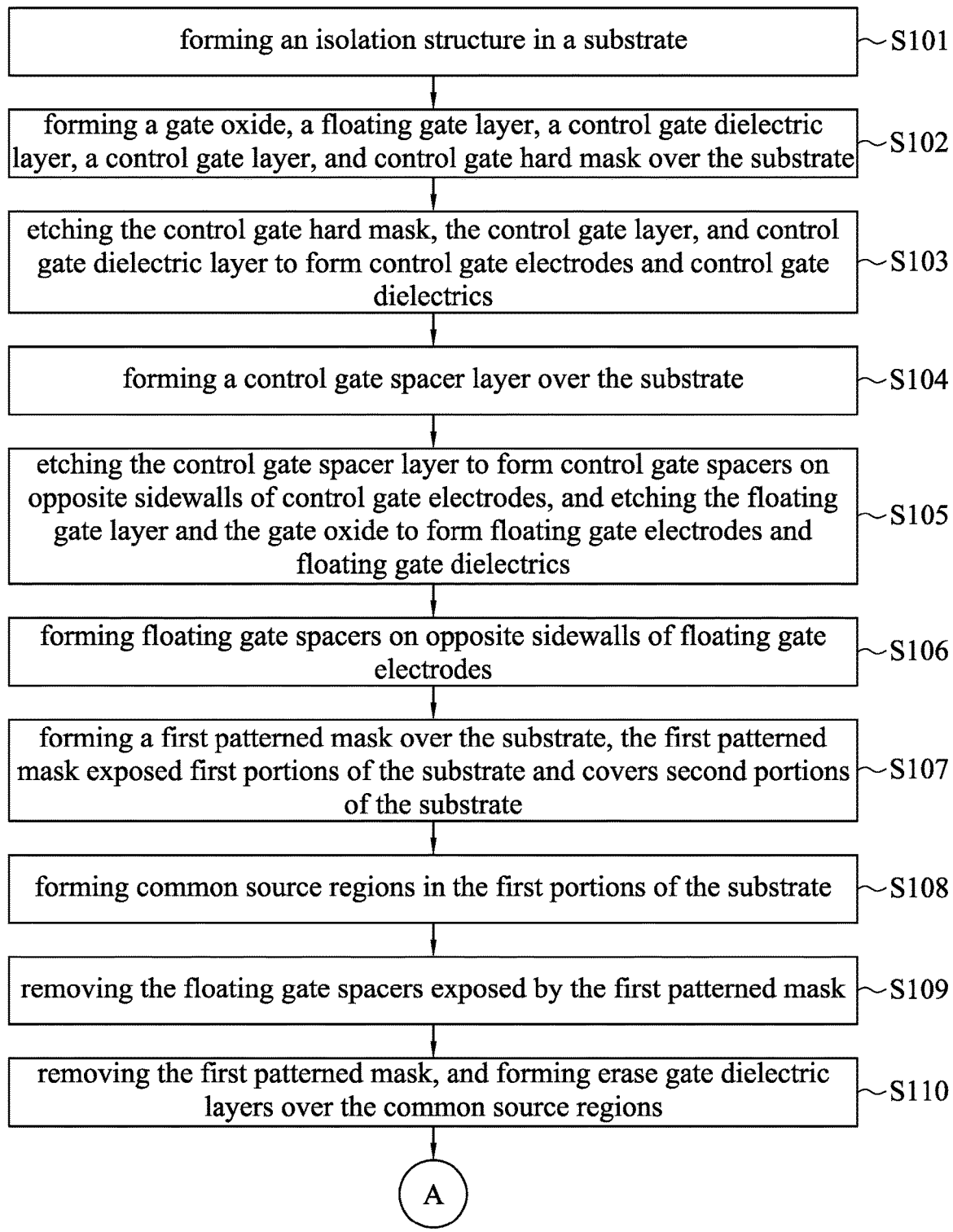
Figure 34C:
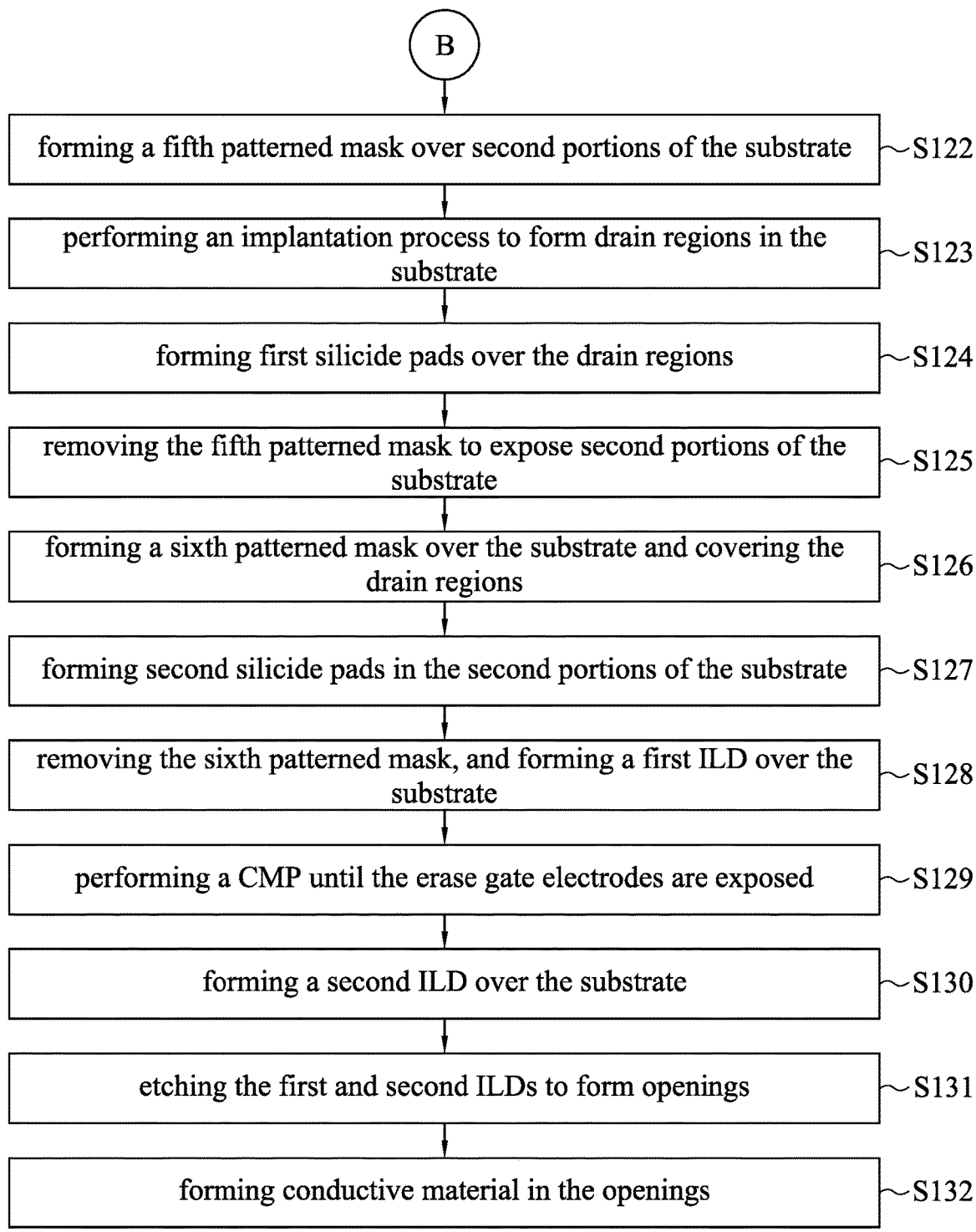

FIGS. 34A to 34C illustrate a method 1000 of manufacturing in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, forming an isolation structure in a substrate. FIGS. 2A to 2C illustrate schematic views of some embodiments corresponding to act in block S101.

At block S102, forming a gate oxide, a floating gate layer, a control gate dielectric layer, a control gate layer, and control gate hard mask over the substrate. FIGS. 3A to 3C illustrate schematic views of some embodiments corresponding to act in block S102.

At block S103, etching the control gate hard mask, the control gate layer, and control gate dielectric layer to form control gate electrodes and control gate dielectrics. FIGS. 4A to 4C illustrate schematic views of some embodiments corresponding to act in block S103.

At block S104, forming a control gate spacer layer over the substrate. FIGS. 5A to 5B illustrate schematic views of some embodiments corresponding to act in block S104.

At block S105, etching the control gate spacer layer to form control gate spacers on opposite sidewalls of control gate electrodes, and etching the floating gate layer and the gate oxide to form floating gate electrodes and floating gate dielectrics. FIGS. 6A to 6B illustrate schematic views of some embodiments corresponding to act in block S105.

At block S106, forming floating gate spacers on opposite sidewalls of floating gate electrodes. FIGS. 7A to 7B illustrate schematic views of some embodiments corresponding to act in block S106.

At block S107, forming a first patterned mask over the substrate, the first patterned mask exposed first portions of the substrate and covers second portions of the substrate. FIGS. 8A to 8D illustrate schematic views of some embodiments corresponding to act in block S107.

At block S108, forming common source regions in the first portions of the substrate. FIGS. 9A to 9C illustrate schematic views of some embodiments corresponding to act in block S108.

At block S109, removing the floating gate spacers exposed by the first patterned mask. FIGS. 10A to 10C illustrate schematic views of some embodiments corresponding to act in block S109.

At block S110, removing the first patterned mask, and forming erase gate dielectric layers over the common source regions. FIGS. 11A to 11C illustrate schematic views of some embodiments corresponding to act in block S110.

At block S111, forming a second patterned mask over the substrate, in which the second patterned mask covers the first portion of the substrate, and removing the erase gate dielectric layers exposed by the second patterned mask. FIGS. 12A to 12D illustrate schematic views of some embodiments corresponding to act in block S111.

At block S112, forming a first dielectric layer over the substrate. FIGS. 13A to 13D illustrate schematic views of some embodiments corresponding to act in block S112.

At block S113, forming a gate layer over the substrate. FIGS. 14A to 14D illustrate schematic views of some embodiments corresponding to act in block S113.

At block S114, etching back the gate layer to form erase gate electrodes. FIGS. 15A to 15D illustrate schematic views of some embodiments corresponding to act in block S114.

At block S115, forming a hard mask layer over the substrate. FIGS. 16A to 16C illustrate schematic views of some embodiments corresponding to act in block S115.

At block S116, forming a third patterned mask over the substrate, and etching the gate layer to form select gate electrodes. FIGS. 17A to 17D illustrate schematic views of some embodiments corresponding to act in block S116.

At block S117, removing the third patterned mask, and forming select gate spacers on sidewalls of the select gate electrodes. FIGS. 18A to 18D illustrate schematic views of some embodiments corresponding to act in block S117.

At block S118, forming a hard mask over the substrate and adjacent to the select gate spacers. FIGS. 19A to 19C illustrate schematic views of some embodiments corresponding to act in block S118.

At block S119, forming a fourth patterned mask over the substrate, in which the fourth patterned mask exposes the second portion of the substrate. FIGS. 20A to 20D illustrate schematic views of some embodiments corresponding to act in block S119.

At block S120, removing portions of the gate layer above the second portions of the substrate. FIGS. 21A to 21D illustrate schematic views of some embodiments corresponding to act in block S120.

At block S121, removing the fourth patterned mask and the hard mask. FIGS. 22A to 22D illustrate schematic views of some embodiments corresponding to act in block S121.

At block S122, forming a fifth patterned mask over second portions of the substrate. FIGS. 23A to 23D illustrate schematic views of some embodiments corresponding to act in block S122.

At block S123, performing an implantation process to form drain regions in the substrate. FIGS. 24A to 24C illustrate schematic views of some embodiments corresponding to act in block S123.

At block S124, forming first silicide pads over the drain regions. FIGS. 25A to 25C illustrate schematic views of some embodiments corresponding to act in block S124.

At block S125, removing the fifth patterned mask to expose second portions of the substrate. FIGS. 26A to 26C illustrate schematic views of some embodiments corresponding to act in block S125.

At block S126, forming a sixth patterned mask over the substrate and covering the drain regions. FIGS. 27A to 27C illustrate schematic views of some embodiments corresponding to act in block S126.

At block S127, forming second silicide pads in the second portions of the substrate. FIGS. 28A to 28C illustrate schematic views of some embodiments corresponding to act in block S127.

At block S128, removing the sixth patterned mask, and forming a first ILD over the substrate. FIGS. 29A to 29C illustrate schematic views of some embodiments corresponding to act in block S128.

At block S129, performing a CMP until the erase gate electrodes are exposed. FIGS. 30A to 30C illustrate schematic views of some embodiments corresponding to act in block S129.

At block S130, forming a second ILD over the substrate. FIGS. 31A to 31C illustrate schematic views of some embodiments corresponding to act in block S130.

At block S131, etching the first and second ILDs to form openings. FIGS. 32A to 32D illustrate schematic views of some embodiments corresponding to act in block S131.

At block S132, forming conductive material in the openings. FIGS. 33A to 33D illustrate schematic views of some embodiments corresponding to act in block S132.

Based on the above discussion, it can be seen that the present disclosure offers advantages. It is understood, however, that other embodiments may offer additional advantages, and not all advantages are necessarily disclosed herein, and that no particular advantages is required for all embodiments. One advantage is that portions of a substrate, which define the positions of common source strap, are masked during forming the common source region. Accordingly, erase gate dielectric having curved or bulbous surface profile will not be formed over these portions of the substrate. In this way, an additional photomask, which is used to remove the erase gate dielectric having curved or bulbous surface profile, can be omitted, which will save extra cost to the process. On the other hand, top surfaces of these portions of the substrate remain substantially flat, which result in flat top surfaces of silicide pads formed in these regions. This will also facilitate the formation of the straps formed on the silicide pads.

According to some embodiments of the present disclosure, a semiconductor device includes an erase gate electrode, an erase gate dielectric, first and second floating gate electrodes, first and second control gate electrodes, a first select gate electrode, a second select gate electrode, a common source strap, and a silicide pad. The erase gate electrode is over a first portion of a substrate. The erase gate dielectric is between the erase gate electrode and the first portion of the substrate. The first and second floating gate electrodes are on opposite sides of the erase gate electrode. The first and second control gate electrodes are respectively over the first and second floating gate electrodes. The first select gate electrode are spaced from the erase gate electrode at least in part by the first control gate electrode along a first direction. The second select gate electrode is spaced from the erase gate electrode at least in part by the second control gate electrode along the first direction. The common source strap is over a second portion of the substrate, in which the common source strap and the erase gate electrode are arranged along a second direction perpendicular to the first direction. The silicide pad is under the common source strap and in the second portion of the substrate, in which a top surface of the silicide pad is flatter than a bottom surface of the erase gate dielectric.

According to some embodiments of the present disclosure, a semiconductor device includes an erase gate electrode, an erase gate dielectric, first and second floating gate electrodes, first and second control gate electrodes, a first select gate electrode, a second select gate electrode, a common source strap, a first silicide pad, a first floating gate spacer, and a second floating gate spacer. The erase gate electrode is over a first portion of a substrate. The erase gate dielectric is between the erase gate electrode and the first portion of the substrate. The first and second floating gate electrodes are on opposite sides of the erase gate electrode. The first and second control gate electrodes are respectively over the first and second floating gate electrodes. The first select gate electrode is spaced from the erase gate electrode at least in part by the first control gate electrode along a first direction. The second select gate electrode is spaced from the erase gate electrode at least in part by the second control gate electrode along the first direction. The first silicide pad is in a second portion of the substrate, in which the first silicide pad and the erase gate electrode are arranged along a second direction perpendicular to the first direction. The first floating gate spacer is on a sidewall of the first floating gate electrode, in which the first silicide pad is laterally spaced from the first floating gate electrode by the first floating gate spacer. The second floating gate spacer is on a sidewall of the second floating gate electrode, in which the first silicide pad is laterally spaced from the second floating gate electrode by the second floating gate spacer.

According to some embodiments of the present disclosure, a method includes forming first and second floating gate electrodes over a substrate; forming first and second control gate electrodes respectively over the first and second floating gate electrodes; forming a patterned mask covering the first and second control gate electrodes, in which the patterned mask exposes a first portion of the substrate between the first and second control gate electrodes, and the patterned mask covers a second portion of the substrate between the first and second control gate electrodes; forming a common source region in the first portion of the substrate, in which the second portion of the substrate is protected by the patterned mask during forming the common source region; removing the patterned mask; forming an erase gate electrode over the first portion of the substrate; and forming a common source strap over the second portion of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   an erase gate electrode over a first portion of a substrate;
   an erase gate dielectric between the erase gate electrode and the first portion of the substrate;
   first and second floating gate electrodes on opposite sides of the erase gate electrode;
   first and second control gate electrodes respectively over the first and second floating gate electrodes;
   a first select gate electrode spaced from the erase gate electrode at least in part by the first control gate electrode along a first direction;
   a second select gate electrode spaced from the erase gate electrode at least in part by the second control gate electrode along the first direction;
   a common source strap over a second portion of the substrate, wherein the common source strap and the erase gate electrode are arranged along a second direction perpendicular to the first direction;
   a silicide pad under the common source strap and in the second portion of the substrate, wherein a top surface of the silicide pad is flatter than a bottom surface of the erase gate dielectric; and
   a common source region under the erase gate dielectric and in the first portion of the substrate, wherein the silicide pad is free of an impurity in the common source region.

2. The semiconductor device of claim 1, wherein the bottom surface of the erase gate dielectric is curved.

3. The semiconductor device of claim 1, wherein when viewed in a cross-section taken along the first direction, a lateral width of the silicide pad is smaller than a lateral width of the erase gate dielectric.

4. The semiconductor device of claim 1, wherein when viewed in a cross-section taken along the second direction, the silicide pad is in contact with a sidewall of the erase gate dielectric.

5. The semiconductor device of claim 1, wherein when viewed in a cross-section along the first direction, the silicide pad is laterally spaced from the first and second floating gate electrodes by non-zero distances.

6. The semiconductor device of claim 1, wherein when viewed in a cross-section along the second direction, the top surface of the silicide pad is lower than a top surface of the erase gate dielectric, and is higher than the bottom surface of the erase gate dielectric.

7. A semiconductor device, comprising:
an erase gate electrode over a first portion of a substrate;
an erase gate dielectric between the erase gate electrode and the first portion of the substrate;
first and second floating gate electrodes on opposite sides of the erase gate electrode;
first and second control gate electrodes respectively over the first and second floating gate electrodes;
a first select gate electrode spaced from the erase gate electrode at least in part by the first control gate electrode along a first direction;
a second select gate electrode spaced from the erase gate electrode at least in part by the second control gate electrode along the first direction;
a first silicide pad in a second portion of the substrate, wherein the first silicide pad and the erase gate electrode are arranged along a second direction perpendicular to the first direction;
a first floating gate spacer on a sidewall of the first floating gate electrode, wherein the first silicide pad is laterally spaced from the first floating gate electrode by the first floating gate spacer;
a second floating gate spacer on a sidewall of the second floating gate electrode, wherein the first silicide pad is laterally spaced from the second floating gate electrode by the second floating gate spacer;
a drain region in the substrate and adjacent to the first select gate electrode;
a second silicide pad over the drain region, wherein a dopant concentration of the second silicide pad is higher than a dopant concentration of the first silicide pad; and
a drain strap over and contacting the second silicide pad.

8. The semiconductor device of claim 7, further comprising:
an interlayer dielectric between the first and second floating gate spacers; and
a common source strap extending through the interlayer dielectric and contacting the first silicide pad.

9. The semiconductor device of claim 8, further comprising a common source region in the first portion of the substrate and under the erase gate dielectric, wherein when viewed in a second cross-section taken along the second direction, the common source strap is electrically connected to the common source region via the first silicide pad.

10. The semiconductor device of claim 7, wherein the first and second floating gate spacers are made of nitride.

11. The semiconductor device of claim 7, further comprising first and second control gate spacers respectively on sidewalls of the first and second control gate electrodes, wherein when viewed in a first cross-section taken along the first direction and through the first silicide pad, the first and second floating gate spacers are in contact respectively with the first and second control gate spacers.

12. The semiconductor device of claim 11, wherein when viewed in a second cross-section taken along the first direction and through the erase gate electrode, the erase gate dielectric is in contact with the first and second control gate spacers.

13. The semiconductor device of claim 7, wherein when viewed in a first cross-section taken along the first direction and through the first silicide pad, a width of the first silicide pad is lower than a distance between the first and second floating gate electrodes.

14. The semiconductor device of claim 7, wherein a bottom surface of the erase gate dielectric is curved.

15. The semiconductor device of claim 7, wherein a top surface of the first silicide pad is flatter than a bottom surface of the erase gate dielectric.

16. A method, comprising:
forming first and second floating gate electrodes over a substrate;
forming first and second control gate electrodes respectively over the first and second floating gate electrodes;
forming a patterned mask covering the first and second control gate electrodes, wherein the patterned mask exposes a first portion of the substrate between the first and second control gate electrodes, and the patterned mask covers a second portion of the substrate between the first and second control gate electrodes;
forming a common source region in the first portion of the substrate, wherein the second portion of the substrate is protected by the patterned mask during forming the common source region;
removing the patterned mask;
forming an erase gate electrode over the first portion of the substrate; and
forming a common source strap over the second portion of the substrate.

17. The method of claim 16, further comprising forming a silicide pad in the second portion of the substrate prior to forming the common source strap.

18. The method of claim 16, further comprising forming an erase gate dielectric over the first and second portions of the substrate, wherein the erase gate dielectric has a higher growing rate on the first portion of the substrate than on the second portion of the substrate.

19. The method of claim 16, wherein forming the erase gate electrode comprises:
forming an erase gate electrode layer over the first and second portions of the substrate; and
removing the erase gate electrode layer from the second portion of the substrate.

20. The method of claim 16, further comprising:
forming first and second floating gate spacers respectively on sidewalls of the first and second floating gate electrodes prior to forming the patterned mask; and
removing, after forming the patterned mask, the first and second floating gate spacers over the first portion of the substrate, wherein the first and second floating gate spacers remain over the second portion of the substrate.

* * * * *